(12) United States Patent
Ohira et al.

(10) Patent No.: US 7,978,972 B2
(45) Date of Patent: *Jul. 12, 2011

(54) OPTICAL LINE TERMINAL AND OPTICAL NETWORK TERMINAL

(75) Inventors: Masaki Ohira, Yokohama (JP); Taro Tonoduka, Chigasaki (JP)

(73) Assignee: Hitachi, Ltd., Tokyo (JP)

( * ) Notice: Subject to any disclaimer, the term of this patent is extended or adjusted under 35 U.S.C. 154(b) by 823 days.

This patent is subject to a terminal disclaimer.

(21) Appl. No.: 11/822,543

(22) Filed: Jul. 6, 2007

(65) Prior Publication Data

US 2008/0145064 A1 Jun. 19, 2008

(30) Foreign Application Priority Data

Dec. 13, 2006 (JP) ................................. 2006-336147

(51) Int. Cl.
| | |
|---|---|
| H04B 10/08 | (2006.01) |
| H04B 17/00 | (2006.01) |
| H03M 13/00 | (2006.01) |
| H03M 13/03 | (2006.01) |
| G06F 11/00 | (2006.01) |

(52) U.S. Cl. ................ 398/25; 398/9; 398/66; 714/758; 714/784; 714/783; 714/782; 714/781; 714/785; 708/492; 708/530; 708/534

(58) Field of Classification Search .................... 708/492
See application file for complete search history.

(56) References Cited

U.S. PATENT DOCUMENTS

| | | | | |
|---|---|---|---|---|
| 6,081,920 A * | 6/2000 | Morelos-Zaragoza | ....... | 714/785 |
| 6,360,348 B1 * | 3/2002 | Yang | .............. | 714/784 |
| 6,374,383 B1 * | 4/2002 | Weng | ............. | 714/781 |
| 6,487,691 B1 * | 11/2002 | Katayama et al. | ............ | 714/784 |
| 6,640,327 B1 * | 10/2003 | Hallberg | ........................ | 714/785 |
| 6,735,735 B1 * | 5/2004 | Ohira et al. | ................. | 714/776 |
| 6,920,600 B2 * | 7/2005 | Litwin et al. | .................. | 714/784 |
| 7,020,826 B2 * | 3/2006 | Litwin et al. | .................. | 714/784 |
| 7,024,616 B2 * | 4/2006 | Ohira et al. | ................... | 714/786 |
| 7,284,184 B2 * | 10/2007 | Gallezot et al. | ............... | 714/762 |
| 7,398,456 B2 * | 7/2008 | Piret et al. | ..................... | 714/781 |
| 7,440,475 B2 * | 10/2008 | Kubo et al. | ................... | 370/535 |
| 2002/0144206 A1 * | 10/2002 | Tomisawa | ..................... | 714/763 |
| 2002/0184592 A1 * | 12/2002 | Koga et al. | .................... | 714/763 |
| 2003/0051200 A1 * | 3/2003 | Iwamura | ....................... | 714/758 |
| 2003/0061562 A1 * | 3/2003 | Ishiwatari et al. | ............ | 714/777 |

(Continued)

FOREIGN PATENT DOCUMENTS

JP    06-260943    9/1994

(Continued)

*Primary Examiner* — Ken N Vanderpuye
*Assistant Examiner* — Oommen Jacob
(74) *Attorney, Agent, or Firm* — McDermott Will & Emery LLP

(57) ABSTRACT

The optical line terminal has a PON transceiver including an error correction code decoder. The error correction decoder includes: a shortening compensation parameter table; and a syndrome calculator for calculating a syndrome by referring to the shortening compensation parameter table, or an error search part for calculating an error position or an error value by referring to the shortening compensation parameter table. Also the optical network terminal has a PON transceiver including an error correction code decoder. The error code decoder includes: a shortening compensation parameter table; and a syndrome calculator for calculating a syndrome by referring to the shortening compensation parameter table, or an error search part for calculating an error position or an error value by referring to the shortening compensation parameter table.

10 Claims, 38 Drawing Sheets

U.S. PATENT DOCUMENTS

| | | | |
|---|---|---|---|
| 2003/0101406 A1* | 5/2003 | Song | 714/774 |
| 2004/0019842 A1* | 1/2004 | Argon et al. | 714/755 |
| 2004/0078408 A1* | 4/2004 | Miller et al. | 708/492 |
| 2004/0078747 A1* | 4/2004 | Miller et al. | 714/782 |
| 2004/0153722 A1* | 8/2004 | Lee | 714/6 |
| 2004/0181735 A1* | 9/2004 | Xin | 714/758 |
| 2004/0193997 A1* | 9/2004 | Gallezot et al. | 714/758 |
| 2005/0033791 A1* | 2/2005 | Pollock | 708/530 |
| 2005/0149821 A1* | 7/2005 | Lee et al. | 714/758 |
| 2005/0172208 A1* | 8/2005 | Yoon | 714/784 |
| 2005/0210353 A1* | 9/2005 | Dohmen et al. | 714/746 |
| 2006/0200729 A1* | 9/2006 | Ito et al. | 714/763 |
| 2008/0163021 A1* | 7/2008 | Ohira et al. | 714/746 |
| 2009/0154916 A1* | 6/2009 | Huang et al. | 398/1 |

FOREIGN PATENT DOCUMENTS

| | | |
|---|---|---|
| JP | 2005-512183 A | 4/2005 |
| JP | 2006-014228 | 1/2006 |
| WO | WO 03/048918 A1 | 6/2003 |

* cited by examiner

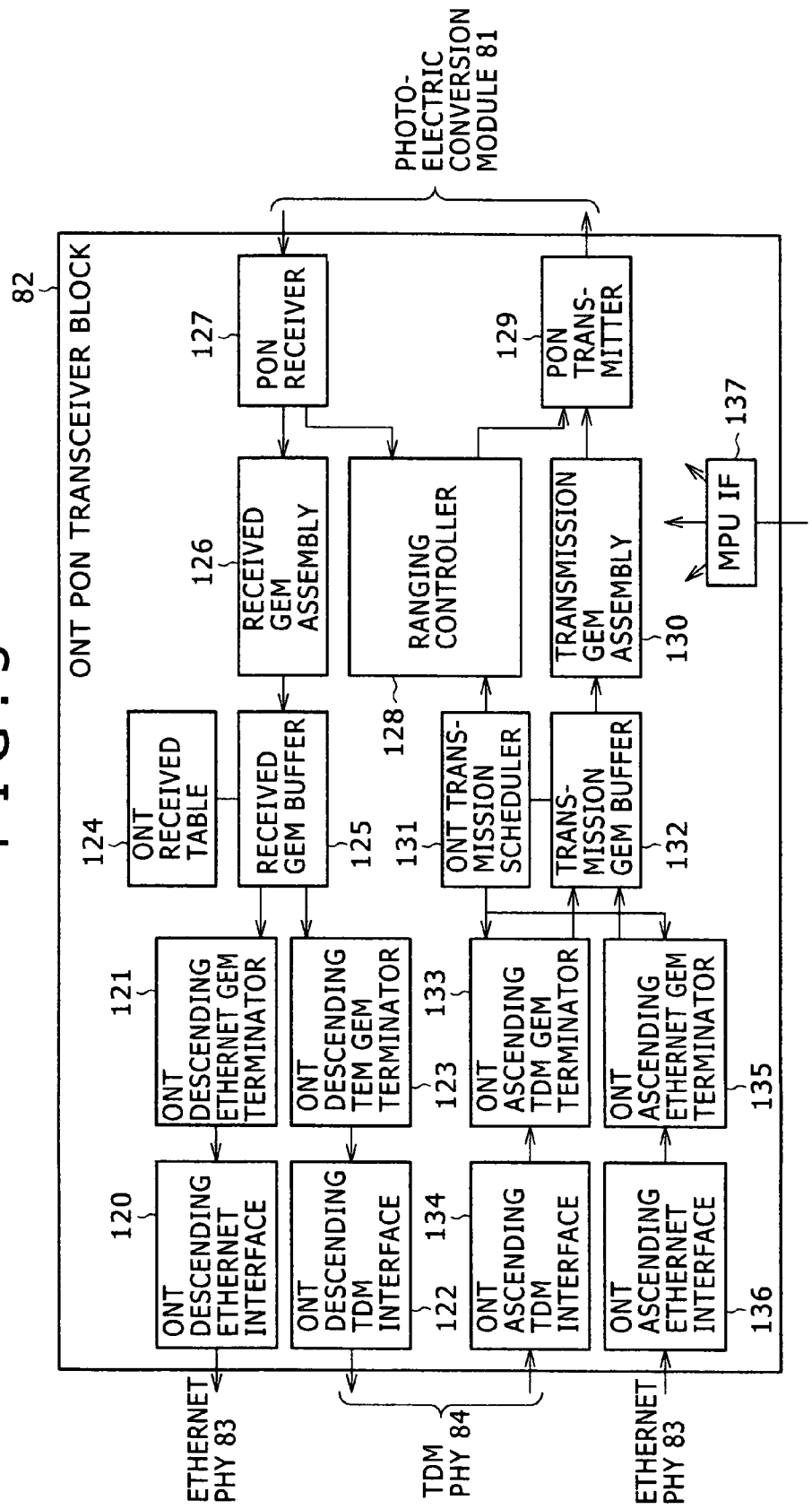

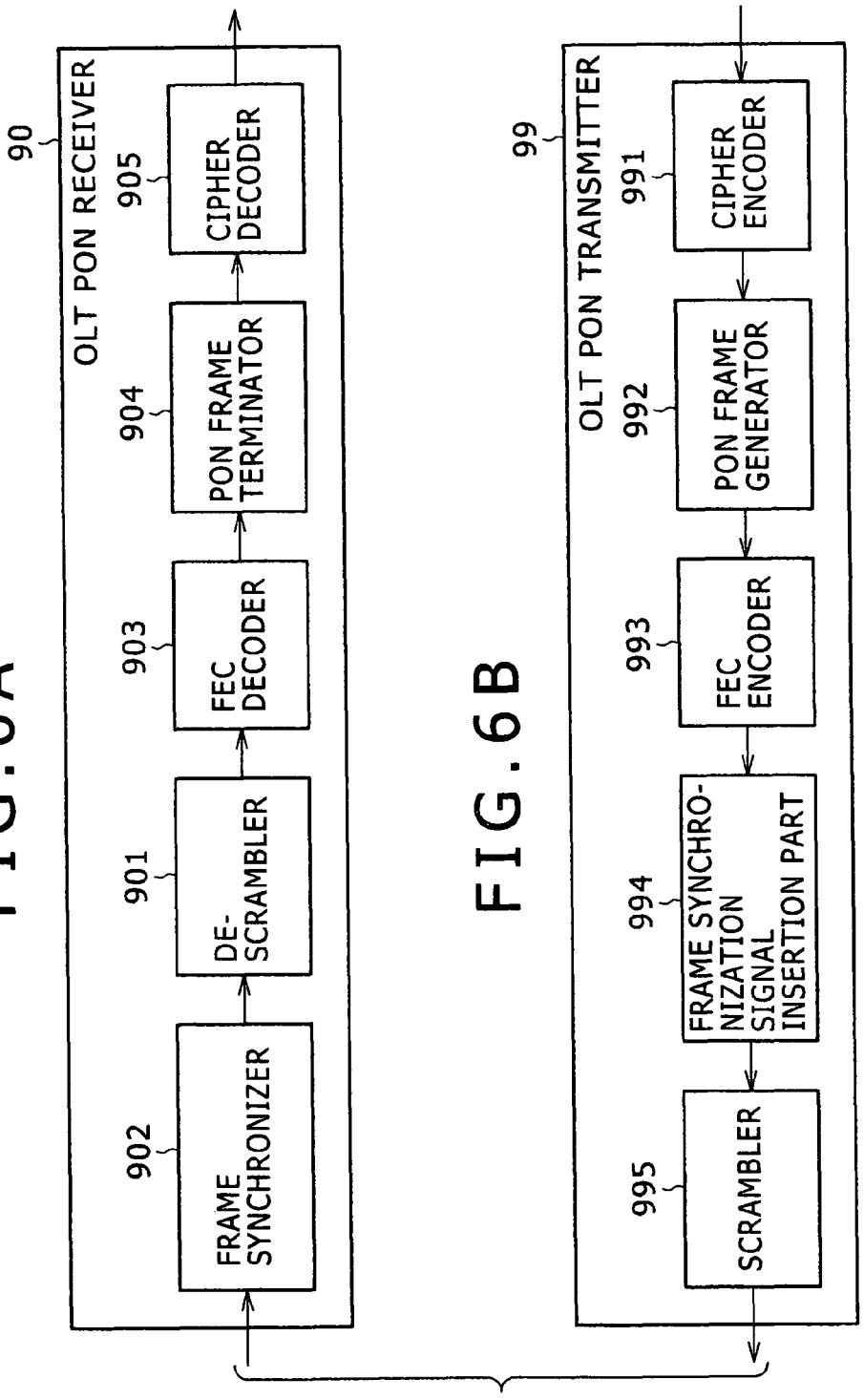

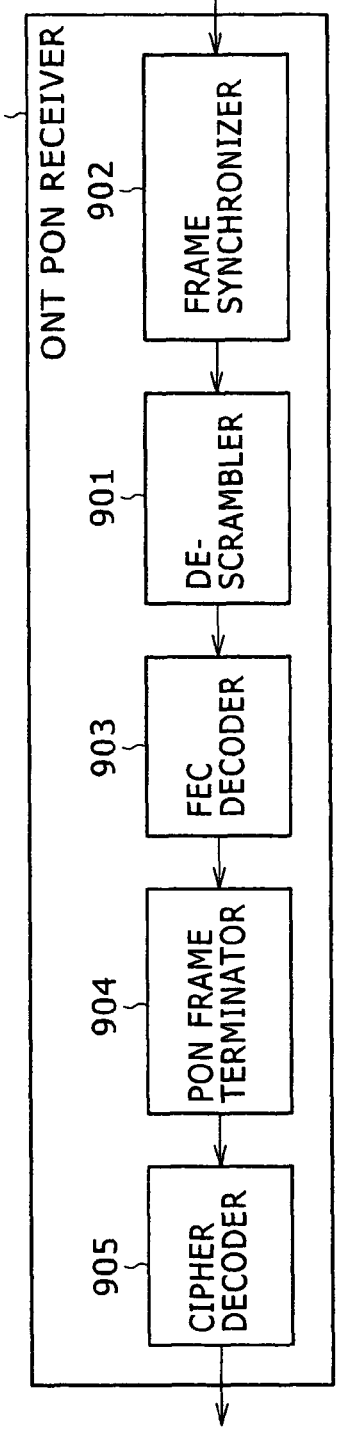
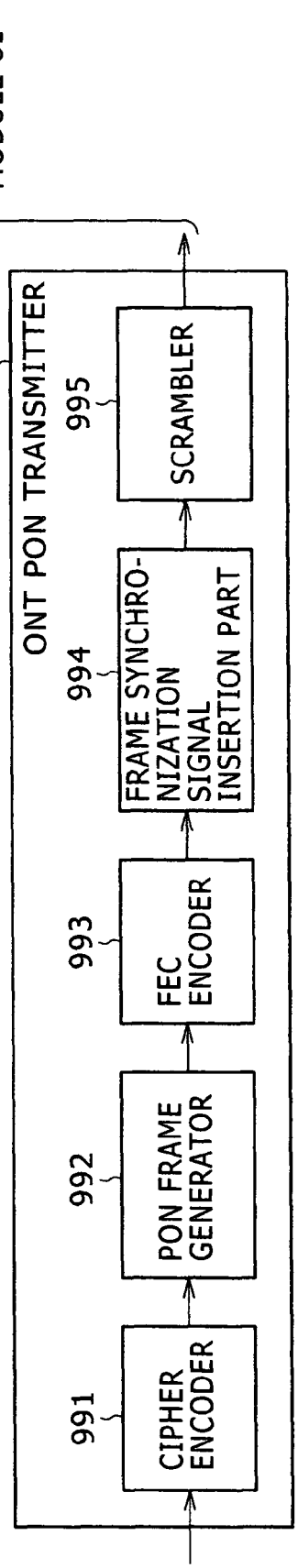
FIG.7A
FIG.7B

OPTICAL LINE TERMINAL AND OPTICAL NETWORK TERMINAL

CLAIM OF PRIORITY

The present application claims priority from Japanese patent application serial no. 2006-336147, filed on Dec. 13, 2006, the content of which is hereby incorporated by reference into this application.

BACKGROUND OF THE INVENTION

The present invention relates to an optical line terminal and an optical network terminal in an optical access system for providing communication between a subscriber's home and a central office of a carrier.

Of public communication networks for transferring data such as audio and video, there are used telephone subscriber network, ADSL, and other networks to implement an access network in which users are accommodated in a central office. Recently introduction of an optical access system has been started.

A known example of the optical access system is PON (Passive Optical Network) as a mode of 1 to n connection between the central office side and the subscriber side. The PON provides data communication between an OLT (Optical Line Terminal) located in a central office and plural ONTs (Optical Network Terminals) located in subscribers homes, using a shared bandwidth in such a way that each optical wavelength is assigned for ascending and descending. In the case of signals on the descending side from the OLT to the ONTs, an optical signal is split into signals halfway through in a splitter. The ONT side extracts only a signal addressed to the own terminal. Thus communication is established therebetween. In the case of signals on the ascending side, the OLT notifies the ONTs of transmission time timing. The ONTs transmit signals to the OLT in accordance with the timing. In this way plural ONTs communicate with the OLT by sharing a single wavelength.

Known examples of such an optical access system are B-PON (Broadband PON), A-PON (ATM PON), GE-PON (Gigabit Ethernet PON), and G-PON (Gigabit-capable PON). Particularly G-PON attracts attention for the following reasons. That is, G-PON is the fastest with a maximum ascending speed of 1.25 Gbits/s and a maximum descending speed of 2.5 Gbits/s, serving plural protocols by adopting a native GEM (Gigabit Encapsulation Method/G-PON Encapsulation Method) that provides support for ATM, Ethernet, and WDM protocols.

As described above since the splitter exists between the OLT and the ONT, both the descending and ascending signals are attenuated. Thus the application of encoding/decoding technology of forward error correction code (FEC) is being investigated also for the PON. Among block codes having a mathematically consistent system, the most commonly used forward error correction code is a code that is called a systematic code due to its transparency of information. The systematic code partitions a sequential signal series into a certain number of blocks to perform encoding for each block. The systematic code has a feature of only adding check bits to a predetermined space area of a signal, without operating the original signal information. Examples of the block code are Hamming code, BCH code (Bose-Chaudhuri-Hocquenghem code), and Reed-Solomon code, which have been used for long time. Hereinafter encoding and decoding of the forward error correction code is simply referred to as encoding and decoding.

In U.S. Pat. No. 7,024,616 B2, there is described a method for configuring an error correction code, and transmitting equipment. The error correction code has a higher gain while maintaining an original transmission distance when an optical signal transmitted through a single-core fiber is wavelength multiplexed even if the degree of time division multiplexing for the optical signal is approximately doubled, being capable of increasing the repeater spacing of the optical signal by a factor of four, and having a high degree of interconnectivity with the existing transmission network to which an eight-error-correcting Reed-Solomon code defined in ITU-T Recommendation G.975 is introduced.

SUMMARY OF THE INVENTION

The present invention provides an optical line terminal and an optical network terminal, which can process with the same error correction code, even if the FEC size of G-PON descending signals is different between two types of 255 and 120.

The above can be achieved by an optical line terminal including a photoelectric converter, a PON transceiver, and a physical layer (PHY). The PON transceiver includes an error correction code decoder including: a shortening compensation parameter table; and a syndrome calculator for calculating a syndrome by referring to the shortening compensation parameter table, or an error search part for calculating an error position or an error value by referring to the shortening compensation parameter table.

Further the above can be achieved by an optical network terminal including a photoelectric converter, a PON transceiver, and a physical layer. The PON transceiver includes an error correction code decoder including: a shortening compensation parameter table; and a syndrome calculator for calculating a syndrome by referring to the shortening compensation parameter table, or an error search part for calculating an error position or an error value by referring to the shortening compensation parameter table.

BRIEF DESCRIPTION OF THE DRAWINGS

FIG. 5 is a block diagram of a PON transceiver block of the ONT;
FIGS. 6A and 6B are block diagrams of a PON receiver and a PON transmitter in the OLT;
FIGS. 7A and 7B are block diagrams of a PON receiver and a PON transmitter in the ONT.

DETAILED DESCRIPTION OF THE PREFERRED EMBODIMENTS

Figure 1:
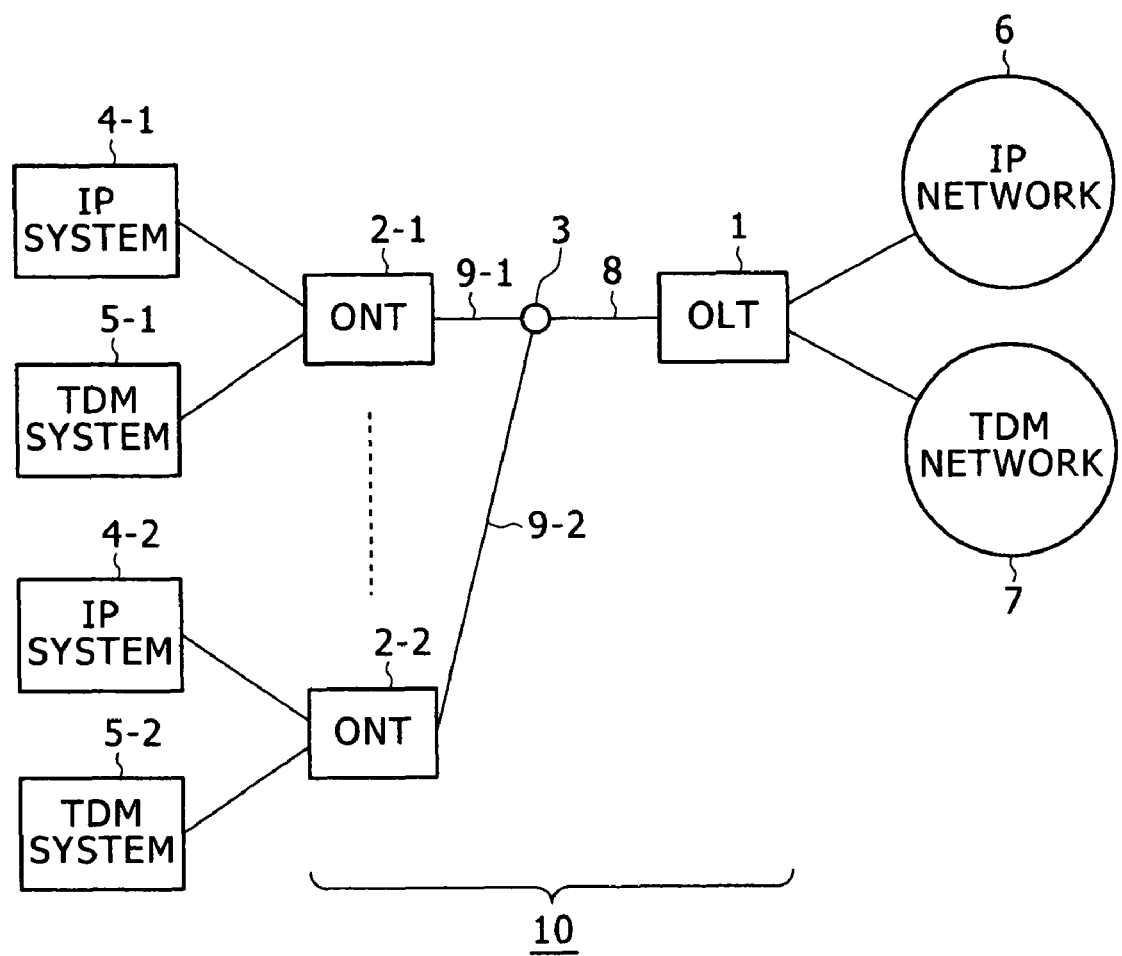
FIG. 1 is a block diagram of an optical access network.

A mode for carrying out the invention will be described below based on preferred embodiments with reference to the accompanying drawings. Incidentally substantially like parts are denoted by like reference numerals and the description will not be repeated.

FIG. 1 is a block diagram of an optical access network. An optical access network 10 includes: an optical line terminal (OLT) 1; optical network terminals (ONTs) 2; a splitter 3; a trunk line fiber 8 between the OLT 1 and the splitter 3; and subscriber fibers 9 between the splitter 3 and the ONTs 2. The ONT 2 is connected to an IP system 4 and a TDM system 5. The OLT 1 is connected to an IP network 6 and a TDM network 7.

A TDM signal from the TDM system 5 is accommodated in the TDM network 7 through the optical access network 10. A signal from the IP system 4 is accommodated in the IP network 7 through the optical access network 10. These signals are referred to as ascending signals.

A TDM signal from the TDM network 7 is accommodated in the TDM system 5 through the optical access network 10. A signal from the IP network 6 is accommodated in the IP system 4 through the optical access network 10. These signals are referred to as descending signals.

Incidentally in the block diagrams of FIG. 2 to FIG. 7 described below, the signal flow directions (ascending, descending) are in accordance with FIG. 1.

Figure 2:
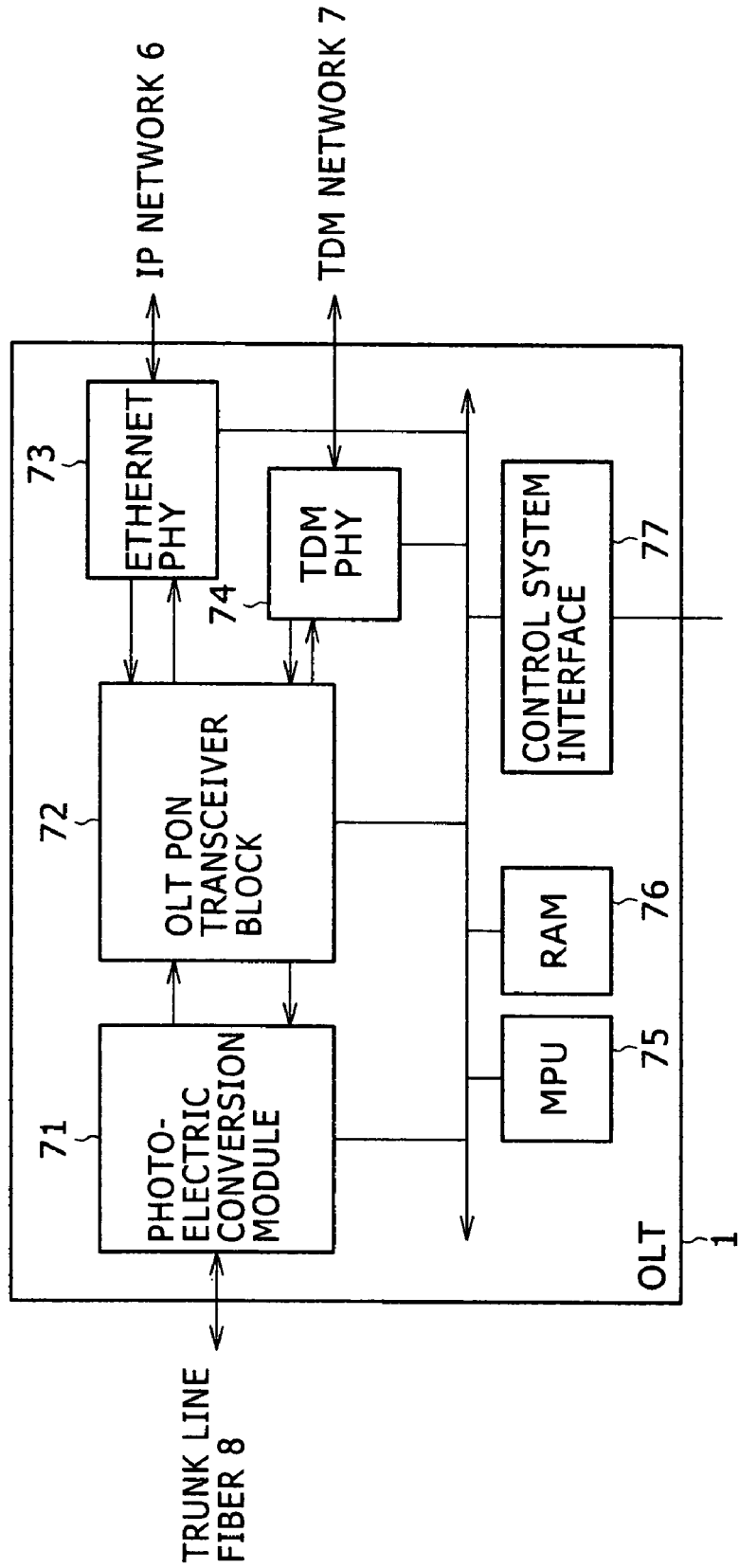
FIG. 2 is a block diagram of an OLT.

FIG. 2 is a block diagram of the OLT. An ascending optical signal from the trunk line fiber 8 is converted into an electrical signal by a photoelectric conversion module 71, and is subjected to GEM termination in an OLT PON transceiver block 72. The converted electrical signal is converted into an Ethernet signal and a TDM signal by the GEM termination. The Ethernet signal is transmitted to the IP network 6 through an Ethernet PHY 73, while the TDM signal is transmitted to the TDM network 7 through a TDM PHY 74.

Descending signals arriving from the IP network 6 and the TDM network 7 are received by the Ethernet PHY 73 and the TDM PHY 74, respectively, and are transmitted to the OLT PON transceiver block 72. The OLT PON transceiver block 72 assembles a GEM frame and then transmits to the trunk line fiber 8 through the photoelectric conversion module 71. An MPU 75 is a microcomputer for controlling the OLT 1, a RAM 76 is a random access memory, and a control system interface 77 is an interface for setting to the OLT 1 from the outside.

Figure 3:
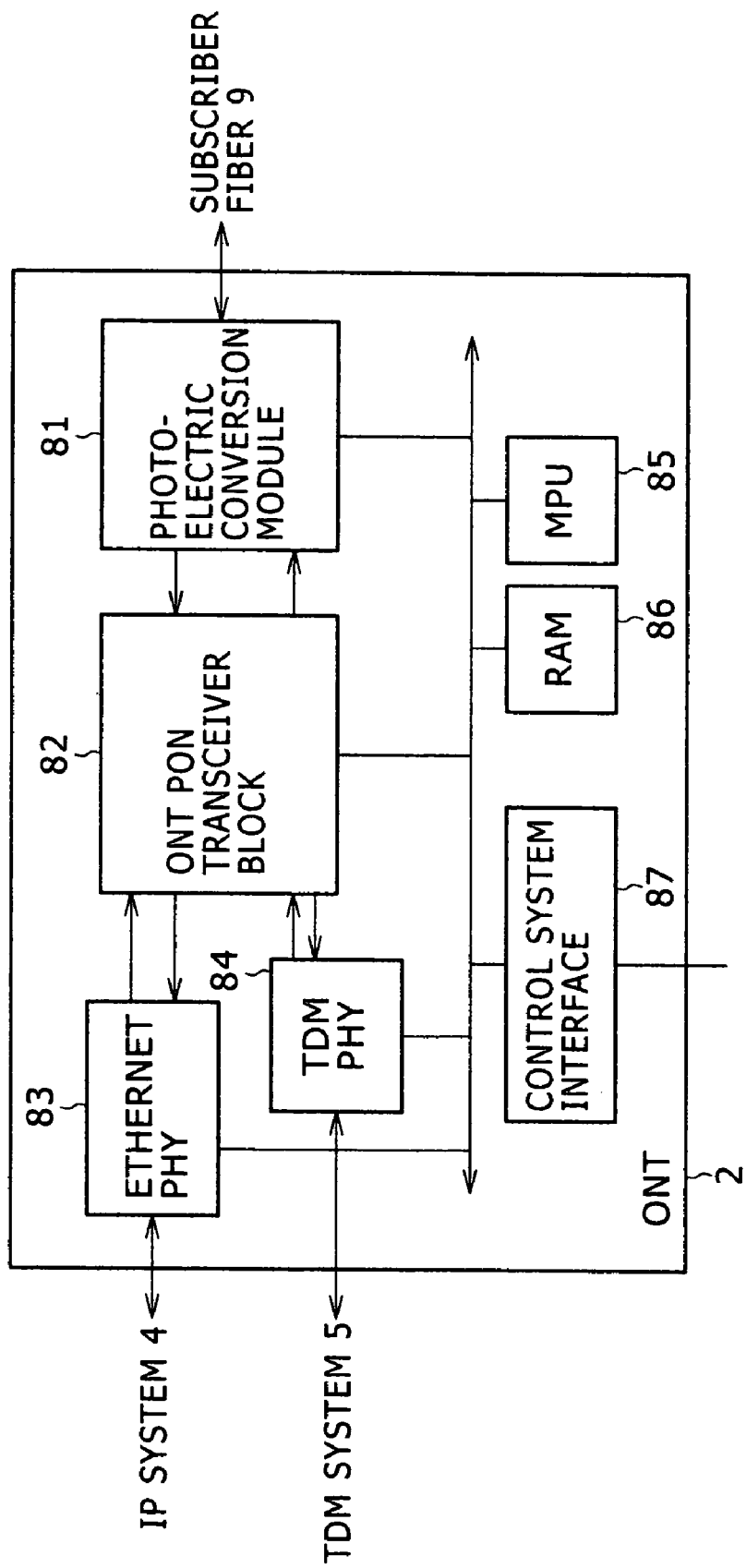
FIG. 3 is a block diagram of an ONT.

FIG. 3 is a block diagram of the ONT. A descending optical signal from the subscriber fiber 9 is converted into an electrical signal by a photoelectric conversion module 81, and is subjected to GEM termination in an ONT PON transceiver block 82. The ONT PON transceiver block 82 converts the converted electrical signal into an Ethernet signal and a TDM signal. The Ethernet signal is transmitted to the IP system 4 through an Ethernet PHY 83. The TDM signal is transmitted to the TDM system 5 through a TDM PHY 84.

Ascending signals from the IP system 4 and TDM system 5 are received by the Ethernet PHY 83 and the TDM PHY 84, respectively, and are transmitted to the ONT PON transceiver block 82. The ONT PON transceiver block 82 assembles a GEM frame and then transmits to the subscriber fiber 9 through the photoelectric conversion module 81. An MPU 85 is a microcomputer for controlling the ONT 2, a RAM 86 is a random access memory, and a control system interface 87 is an interface for setting to the ONT 2 from the outside.

Figure 4:
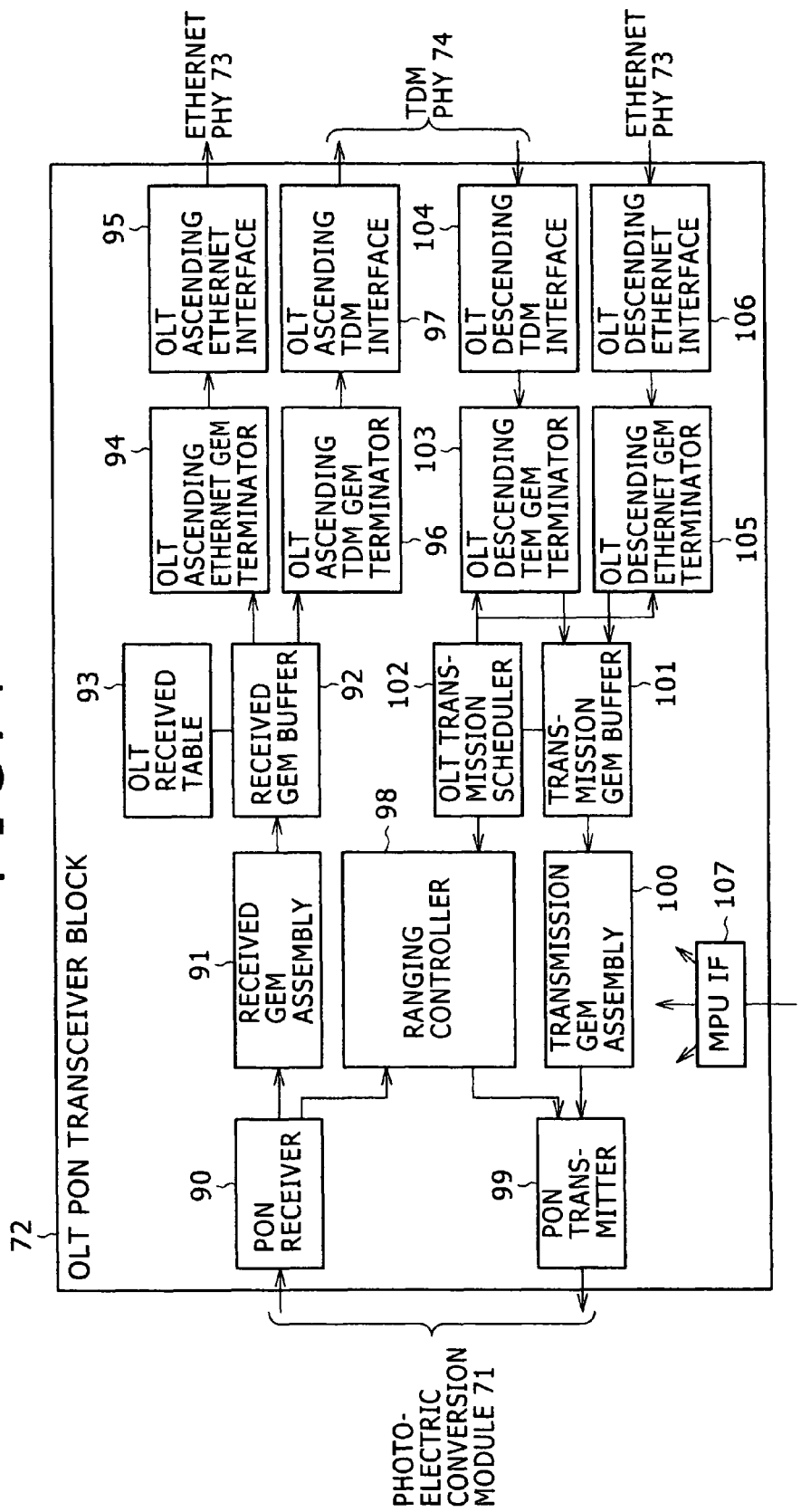
FIG. 4 is a block diagram of a PON transceiver block of the OLT.

FIG. 4 is a block diagram of the PON transceiver block of the OLT. The ascending PON frame signal from the photoelectric conversion module 71 is subjected to a synchronization process and a GEM cutting-out process by a PON receiver 90. Then the cut out payload is transmitted to a received GEM assembly 91. The received GEM assembly 91 assembles the transmitted GEM that is divided into plural short term frames. Then the assembled GEM is stored in a received GEM buffer 92, and is sorted into an OLT ascending Ethernet GEM terminator 94 and an OLT ascending TDM GEM terminator 96, according to the table information of an OLT received table 93.

The OLT ascending Ethernet GEM terminator 94 extracts the Ethernet frame from the GEM frame, and transmits the extracted Ethernet frame to the Ethernet PHY 73 through an OLT ascending Ethernet interface 95. The OLT ascending TDM GEM terminator 96 extracts the TDM signal from the GEM frame, and transmits the extracted TDM signal to the TDM PHY 74 through an OLT ascending TDM interface 97 at a desired timing.

With respect to the descending signals, an OLT descending TDM interface 104 receives the TDM signal from the TDM PHY 74. An OLT descending TDM GEM terminator 103 generates a GEM by buffering the TDM signal. An OLT descending Ethernet interface 106 receives the Ethernet frame from the Ethernet PHY 73. An OLT descending Ethernet GEM terminator 105 generates a GEM. An OLT transmission scheduler 102 controls the OLT descending TDM GEM terminator 103 to periodically transmit the GEM of the TDM signal to a transmission GEM buffer 101. The OLT transmission scheduler 102 also controls the OLT descending Ethernet GEM terminator 105 to transmit the GEM of the Ethernet signal to the transmission GEM buffer 101 at an idle timing. The OLT transmission scheduler 102 controls the transmission GEM buffer 101 to periodically transfer the GEM of the TDM signal and the GEM of the Ethernet signal to a transmission GEM assembly 100. The transmission GEM assembly 100 assembles the GEM for the amount of payload of the PON frame, and transfers the assembled GEM to a PON transmitter 99. The PON transmitter 99 generates a header and then transmits the PON frame.

When performing ranging as a measurement of the distance between the OLT 1 and the ONT 2, a ranging controller 98 transmits a ranging signal from the PON transmitter 99 at a timing permitted by the OLT transmission scheduler 102. The ranging is completed when a response is returned from the ONT 2 to the ranging controller 98 through the PON receiver 90.

Incidentally, an MPU interface 107 intermediates the control of the MPU 75 to each of the control blocks.

FIG. 5 is a block diagram of the PON transceiver block of the ONT. The descending signal from the photoelectric conversion module 81 is received by a PON receiver 127. The PON receiver 127 performs a synchronization process and a GEM cutting-out process. A received GEM assembly 126 assembles the transmitted GEM that is divided into plural short term frames. The assembled GEM is stored in a received GEM buffer 125, and is sorted into an ONT descending Ethernet GEM terminator 121 and an ONT descending TDM GEM terminator 123, according to the table information of an ONT received table 124. The ONT descending Ethernet GEM terminator 121 extracts the Ethernet frame from the GEM. The extracted Ethernet frame is transmitted to the Ethernet PHY 83 through an ONT descending Ethernet interface 120. The ONT descending TDM GEM terminator 123 extracts the TDM signal from the GEM. The extracted TDM signal is transmitted to the TDM PHY 84 through an ONT descending TDM interface 122 at a predetermined timing.

With respect to the ascending signals, an ONT ascending TDM interface 134 receives the TDM signal. An ONT ascending TDM GEM terminator 133 assembles the GEM by buffering the TDM signal. An ONT ascending Ethernet interface 136 receives the Ethernet frame. An ONT ascending Ethernet GEM terminator 135 generates a GEM. An ONT transmission scheduler 131 controls the ONT ascending TDM GEM terminator 133 to periodically transfer the GEM of the TDM signal to a transmission GEM buffer 132. The ONT transmission scheduler 131 also controls the ONT ascending Ethernet GEM terminator 135 to transfer the GEM of the Ethernet signal to the transmission GEM buffer 132 at an idle timing. The ONT transmission scheduler 131 controls the transmission GEM buffer 132 to periodically transfer the GEM of the TDM signal and the GEM of the Ethernet signal to a transmission GEM assembly 130. The transmission GEM assembly 130 assembles the GEM for the amount of payload of the PON frame, and transfers the assembled GEM to a PON transmitter 129. The PON transmitter 129 generates a header and then transmits the PON frame.

Upon request of the ranging, a ranging controller 128 processes a ranging request signal received by the PON receiver 127, and returns a ranging reception signal through the PON transmitter 129.

Incidentally an MPU interface 137 intermediates the control of the MPU 85 to each of the control blocks.

FIGS. 6A, 6B are block diagrams of the PON receiver and the PON transmitter in the OLT. FIGS. 7A, 7B are block diagrams of the PON receiver and the PON transmitter in the ONT. In FIG. 6A, the OLT PON receiver 90 includes: a frame synchronizer 902 for taking frame synchronization of ascending signals; a descrambler 901 for releasing scramble; an FEC decoder 903, for separating an information word from an FEC parity and correcting errors of the information word; a PON frame terminator 904; and a cipher decoder 905 for decrypting cipher codes. In FIG. 6B, the OLT PON transmitter 99 includes: a cipher encoder 991 for encrypting descending signals; a PON frame generator 992 for converting the encrypted data into a PON frame; an FEC encoder 993 for adding an FEC parity to the PON frame; a frame synchronization signal insertion part 994 for inserting a frame synchronization signal; and a scrambler 995.

The ONT PON receiver 127 in FIG. 7A has the same configuration as the OLT PON receiver 90 in FIG. 6A, except for the signal flow. Also the ONT PON transmitter 129 in FIG. 7B has the same configuration as the OLT PON transmitter 99 in FIG. 6B, except for the signal flow. Thus their description will be omitted.

Incidentally, when no cipher is used on the ascending side, both the cipher decoder 905 of the OLT PON receiver 90 and the cipher encoder 991 of the ONT PON transmitter 129 are not needed.

Figure 8A:
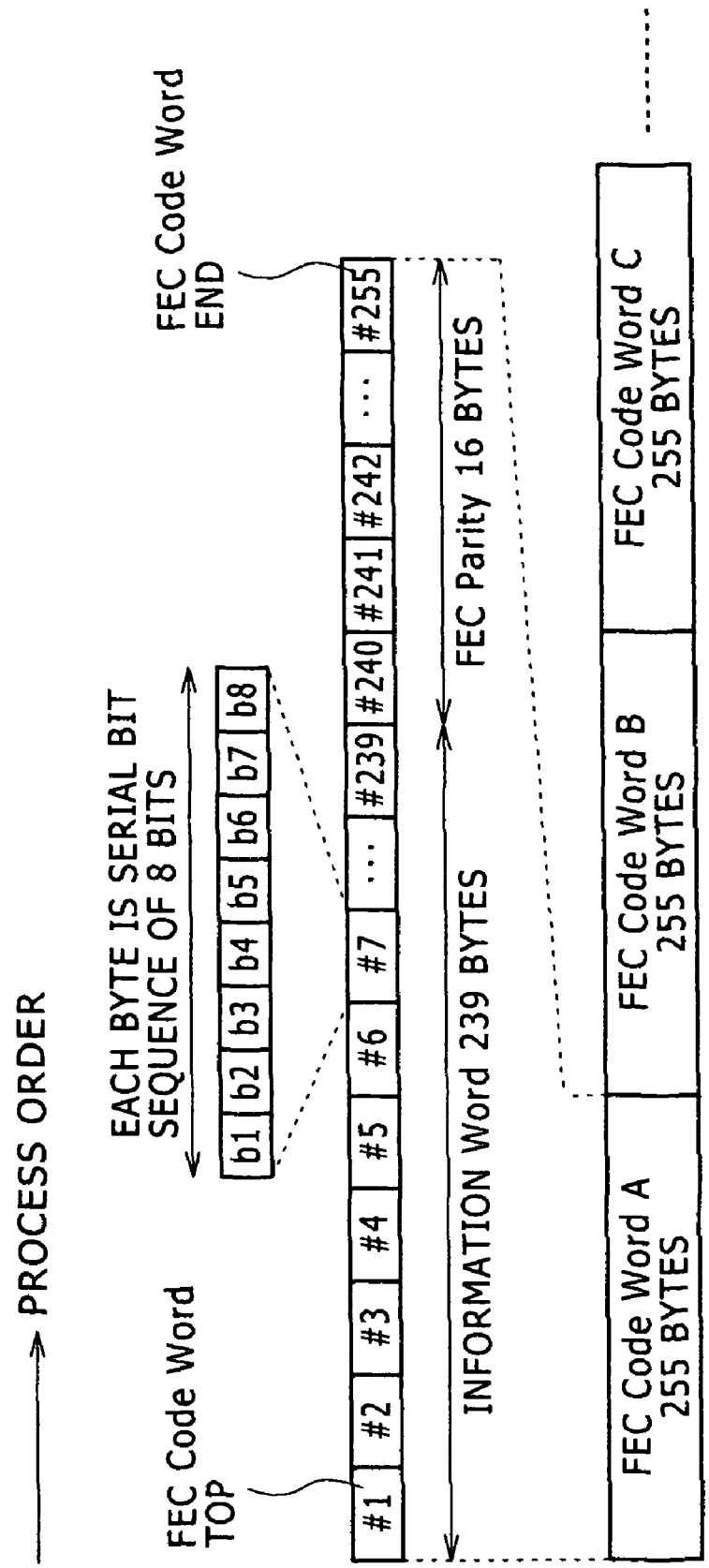
FIG. 8A is a view illustrating the configuration of an FEC code word (serial 8 bits)
Figure 8B:
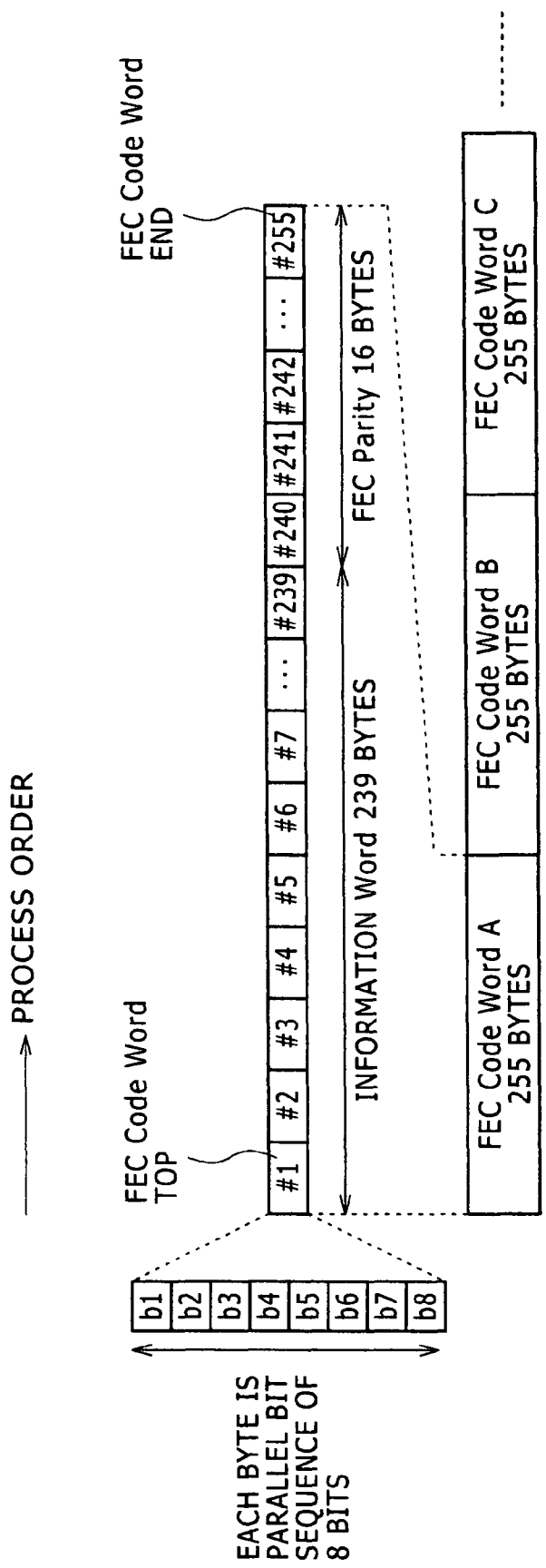
FIG. 8B is a view illustrating the configuration of an FEC code word (parallel 8 bits)
Figure 8C:
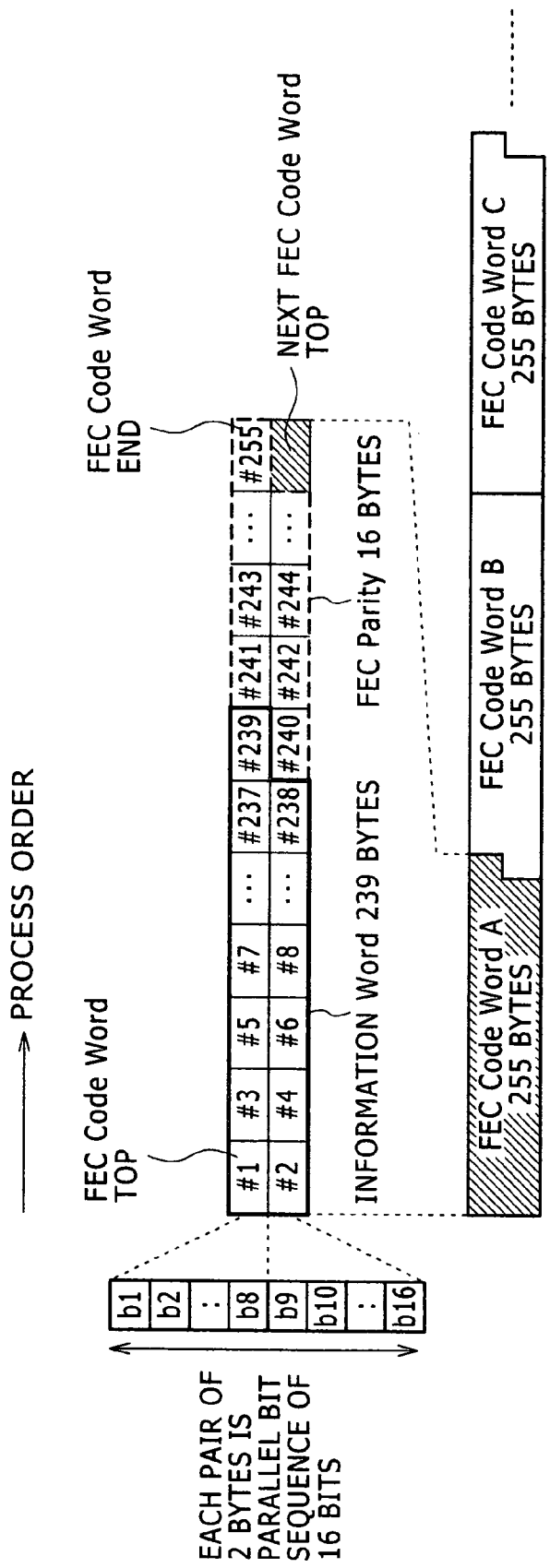
FIG. 8C is a view illustrating the configuration of an FEC code word (parallel 16 bits, part 1)
Figure 8D:
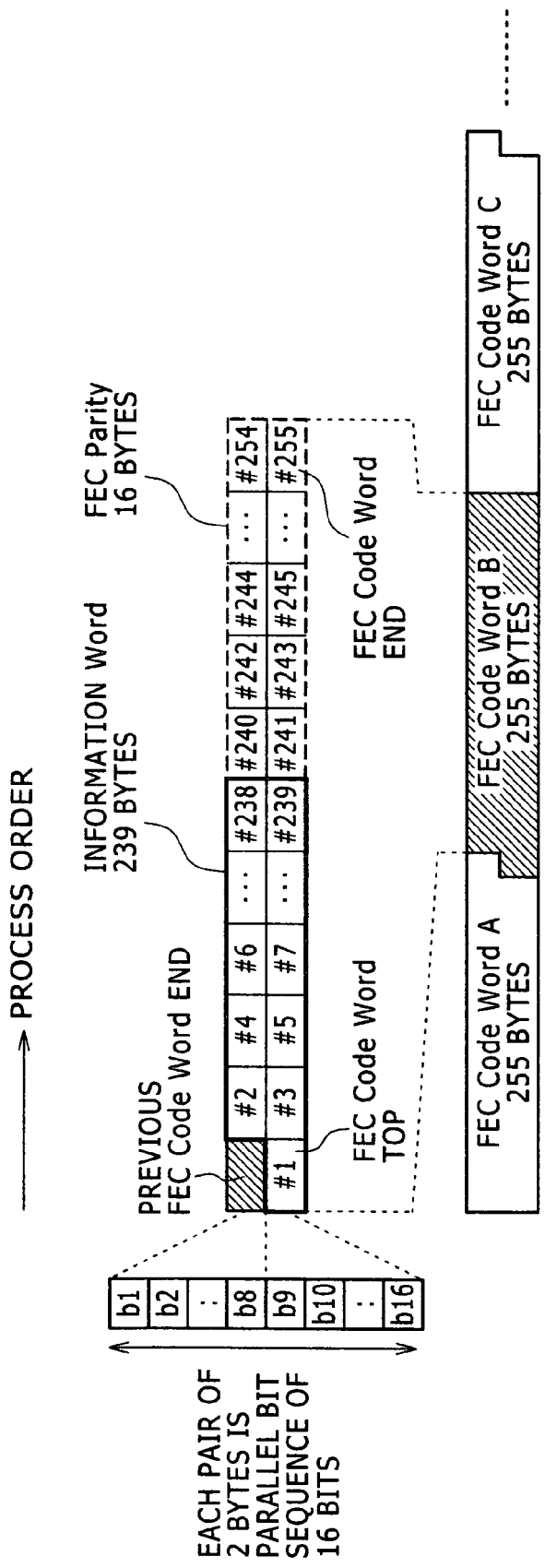
FIG. 8D is a view illustrating the configuration of the FEC code word (parallel 16 bits, part 2)
Figure 8E:
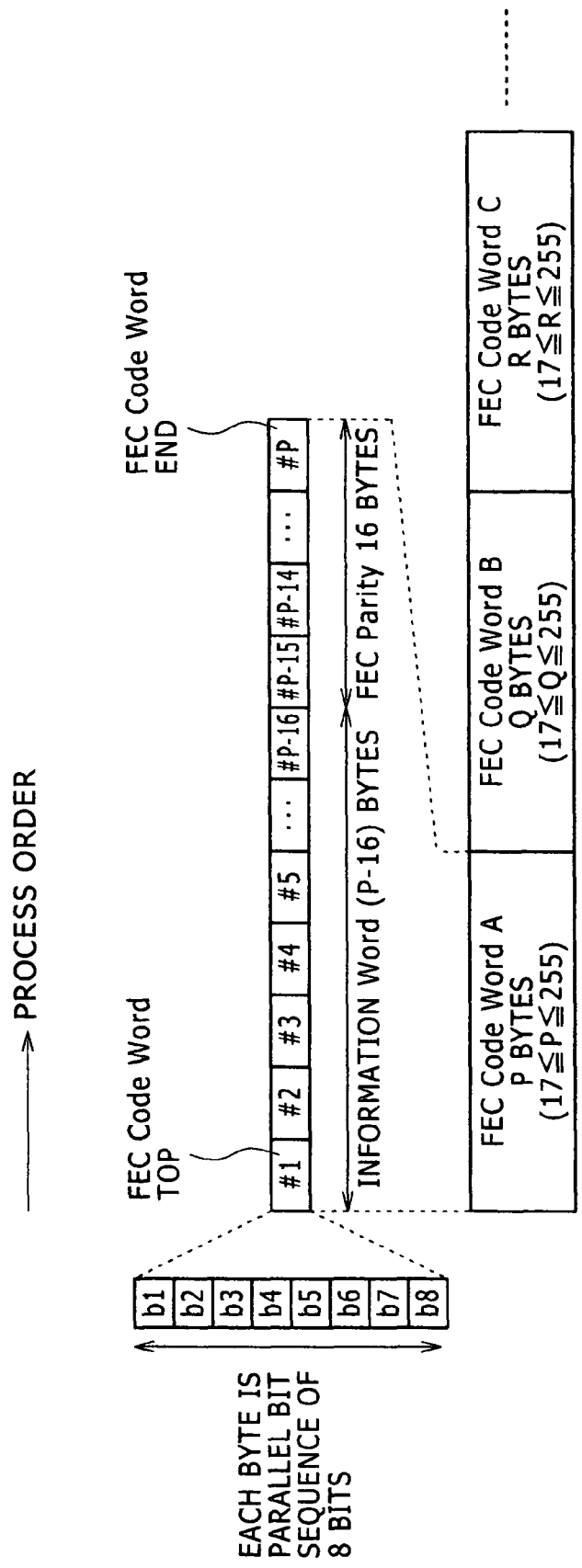
FIG. 8E is a view illustrating the configuration of an FEC code word (parallel 8 bits, variable word length)
Figure 8F:
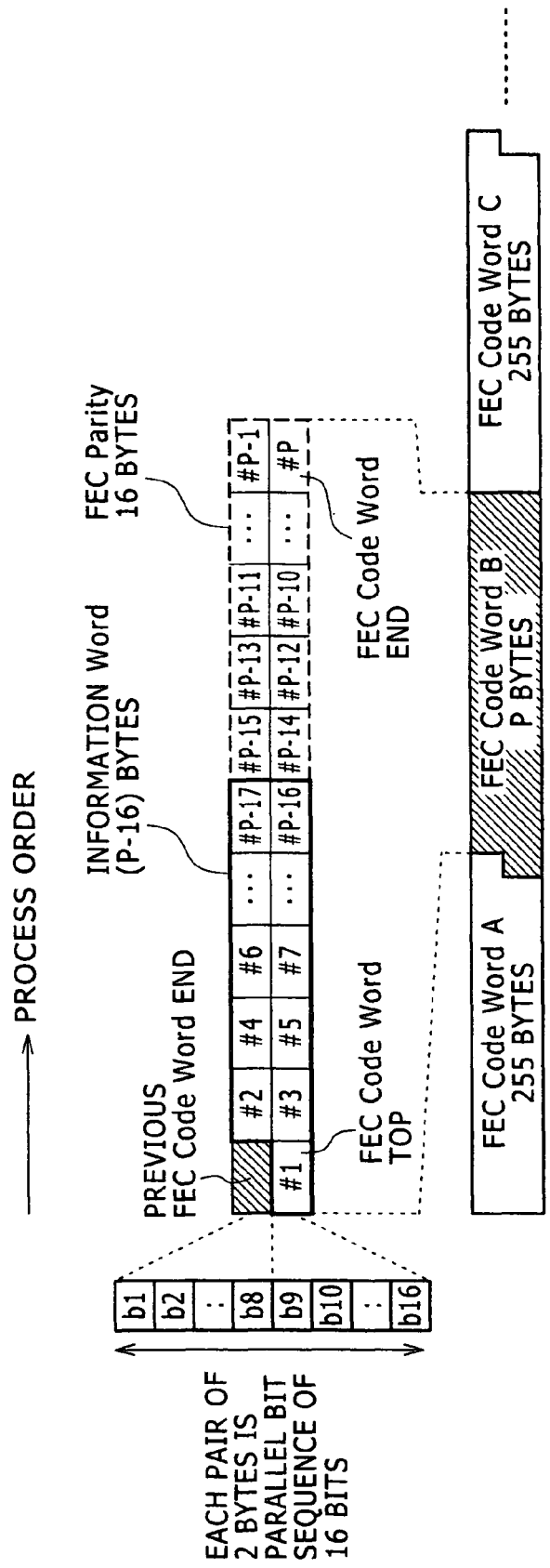
FIG. 8F is a view illustrating the configuration of an FEC code word (parallel 16 bits, variable word length)

FIG. 8A is a view illustrating the configuration of an FEC code word (serial 8 bits). FIG. 8B is a view illustrating the configuration of an FEC code word (parallel 8 bits). FIG. 8C is a view illustrating the configuration of an FEC code word (parallel 16 bits, part 1). FIG. 8D is a view illustrating the configuration of the FEC code word (parallel 16 bits, part 2). FIG. 8E is a view illustrating the configuration of an FEC code word (parallel 8 bits, variable word length). FIG. 8F is a view illustrating the configuration of an FEC code word (parallel 16 bits, variable word length).

In FIG. 8A, the FEC code word has a fixed length of 255 bytes, in which the information word takes 239 bytes from the first byte #1 to #239 and the FEC parity takes 16 bytes from #240 to #255. Further one byte is serial 8 bits.

In FIG. 8B, the FEC code word has a fixed length of 255 bytes, in which the information word takes 239 bytes from the first byte #1 to #239 and the FEC parity takes 16 bytes from #240 to #255. Further one byte is parallel 8 bits. The speed of the FEC code word in FIG. 8B can be reduced to one eighth of the speed of the FEC code word in FIG. 8A.

In FIGS. 8C and 8D, the FEC code word has a fixed length of 255 bytes, in which the information word takes 239 bytes from the first byte #1 to #239 and the FEC parity takes 16 bytes from #240 to #255. Further each pair of 2 bytes is parallel 16 bits. However, since the FEC code word has the fixed length of 255 bytes, it is necessary to have process circuits for the odd numbered FEC code words A, C, and for the even numbered FEC code word B. Incidentally in the following description, unnecessary one byte appearing at the beginning or end of the 16-bit parallel FEC code word will be referred to as "hook". The speed of the FEC code word in FIGS. 8C, 8D can be reduced to one half of the speed of the FEC code word in FIG. 8B.

In FIG. 8E, the FEC code word has a variable length of a range from 17 to 255 bytes, in which the FEC parity takes the last 16 bytes and the information word takes at least the first one byte or at most 239 bytes. Further one byte is parallel 8 bits.

In FIG. 8F, the FEC code word has a variable length of a range from 17 to 255 bytes, in which the FEC parity takes the last 16 bytes and the information word takes at least the first one byte or at most 239 bytes. Further each pair of 2 bytes is parallel 16 bits.

Figure 9:
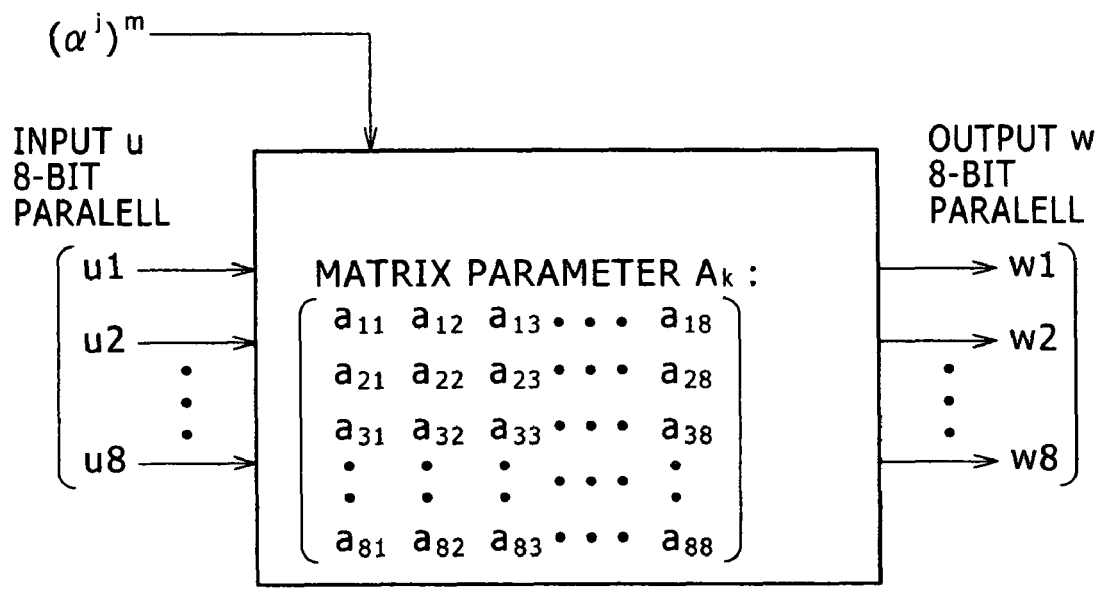
FIG. 9 is a view illustrating a parameter load multiplier.
Figure 10:
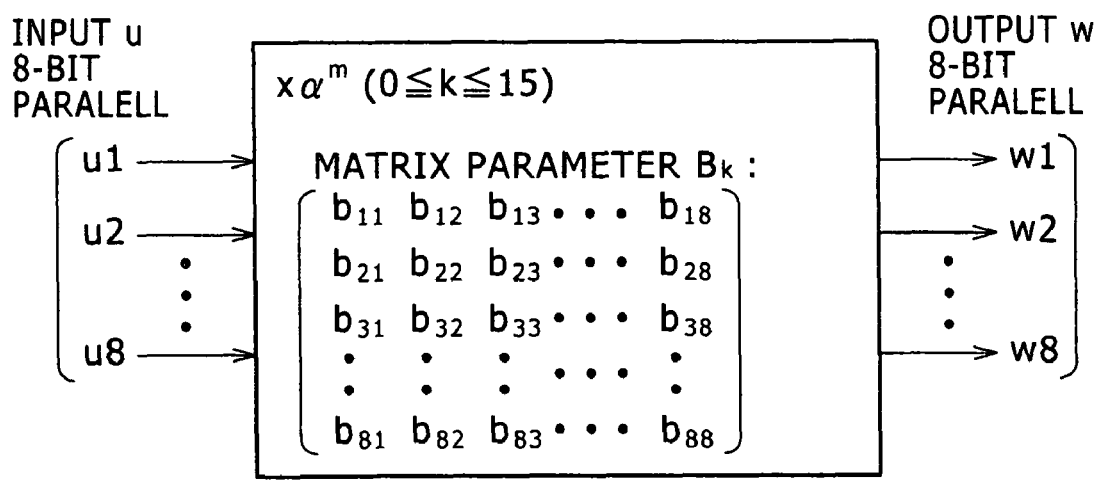
FIG. 10 is a view illustrating a fixed multiplier.

A multiplier of the FEC decoder will be descried with reference to FIGS. 9 and 10. Here FIG. 9 is a view illustrating a parameter load multiplier. FIG. 10 is a view illustrating a fixed multiplier. In FIG. 9, the parameter load multiplier has inputs of a parameter $(\alpha^k)^j$ (hereinafter $(\alpha\hat{\ }k)\hat{\ }j$, where k, j are suffixes, not powers) and an 8-bit parallel value u. Based on a matrix parameter $A_k$ (hereinafter Ak) set by the parameter $(\alpha\hat{\ }k)\hat{\ }j$, the parameter load multiplier converts the 8-bit parallel value u into an 8-bit parallel value w. Each element of the matrix parameter Ak is 0 or 1, which is uniquely determined by the input $(\alpha\hat{\ }k)\hat{\ }j$. The parameter $(\alpha\hat{\ }k)\hat{\ }j$ is a primitive element of a Galois Field (256), based on which the eighth line of the matrix parameter Ak (a81 a82 a83 a84 a85 a86 a87 a88) is expressed in 8-bit binary number.

The first to seventh lines of the matrix parameter Ak are obtained by calculating Equation 1 with p=m+1 by substituting from 7 for m ($1 \leq m \leq 7$). Here "+" in Equation 1 is an exclusive logical sum.

$$a_{m1} = a_{p2}$$
$$a_{m2} = a_{p3}$$
$$a_{m3} = a_{p4}$$
$$a_{m4} = a_{p5} + a_{p1}$$
$$a_{m5} = a_{p6} + a_{p1}$$
$$a_{m6} = a_{p7} + a_{p1}$$
$$a_{m7} = a_{p8}$$
$$a_{m8} = a_{p1}$$

[Equation 1]

The output w is obtained by Equation 2 from the elements of the matrix parameter Ak and the input u. Here "·" is a logical product, "+" is an exclusive logical sum.

$$w1 = a_{11} \cdot u1 + a_{12} \cdot u2 + a_{13} \cdot u3 + \ldots + a_{18} \cdot u8$$
$$w2 = a_{21} \cdot u1 + a_{22} \cdot u2 + a_{23} \cdot u3 + \ldots + a_{28} \cdot u8$$
$$w3 = a_{31} \cdot u1 + a_{32} \cdot u2 + a_{33} \cdot u3 + \ldots + a_{38} \cdot u8$$
$$\vdots$$
$$w8 = a_{81} \cdot u1 + a_{82} \cdot u2 + a_{83} \cdot u3 + \ldots + a_{88} \cdot u8$$

[Equation 2]

In FIG. 10, a fixed multiplication circuit 242 ($x\alpha\hat{\ }k$) uses its matrix parameter Bk to convert an 8-bit parallel input u into an 8-bit parallel output w. Each element of the matrix parameter Bk is 0 or 1. The function $\alpha\hat{\ }k$ is a primitive element of the Galois Field (256), based on which the eighth line of the matrix parameter Bk (b81 b82 b83 b84 b85 b86 b87 b88) is expressed in 8-bit binary number.

The first to seventh lines of the matrix parameter Bk are obtained by calculating in a similar way to Equation 1 with p=m+1 by substituting from 7 for m ($1 \leq m \leq 7$).

The output w is determined by Equation 3 from the elements of the matrix parameter Bk and the input u. Here "·" is a logical product, "+" is an exclusive logical sum.

$$w1 = b_{11} \cdot u1 + b_{12} \cdot u2 + b_{13} \cdot u3 + \ldots + b_{18} \cdot u8$$
$$w2 = b_{21} \cdot u1 + b_{22} \cdot u2 + b_{23} \cdot u3 + \ldots + b_{28} \cdot u8$$
$$w3 = b_{31} \cdot u1 + b_{32} \cdot u2 + b_{33} \cdot u3 + \ldots + b_{38} \cdot u8$$
$$\vdots$$
$$w8 = b_{81} \cdot u1 + b_{82} \cdot u2 + b_{83} \cdot u3 + \ldots + b_{88} \cdot u8$$

[Equation 3]

Figure 11:
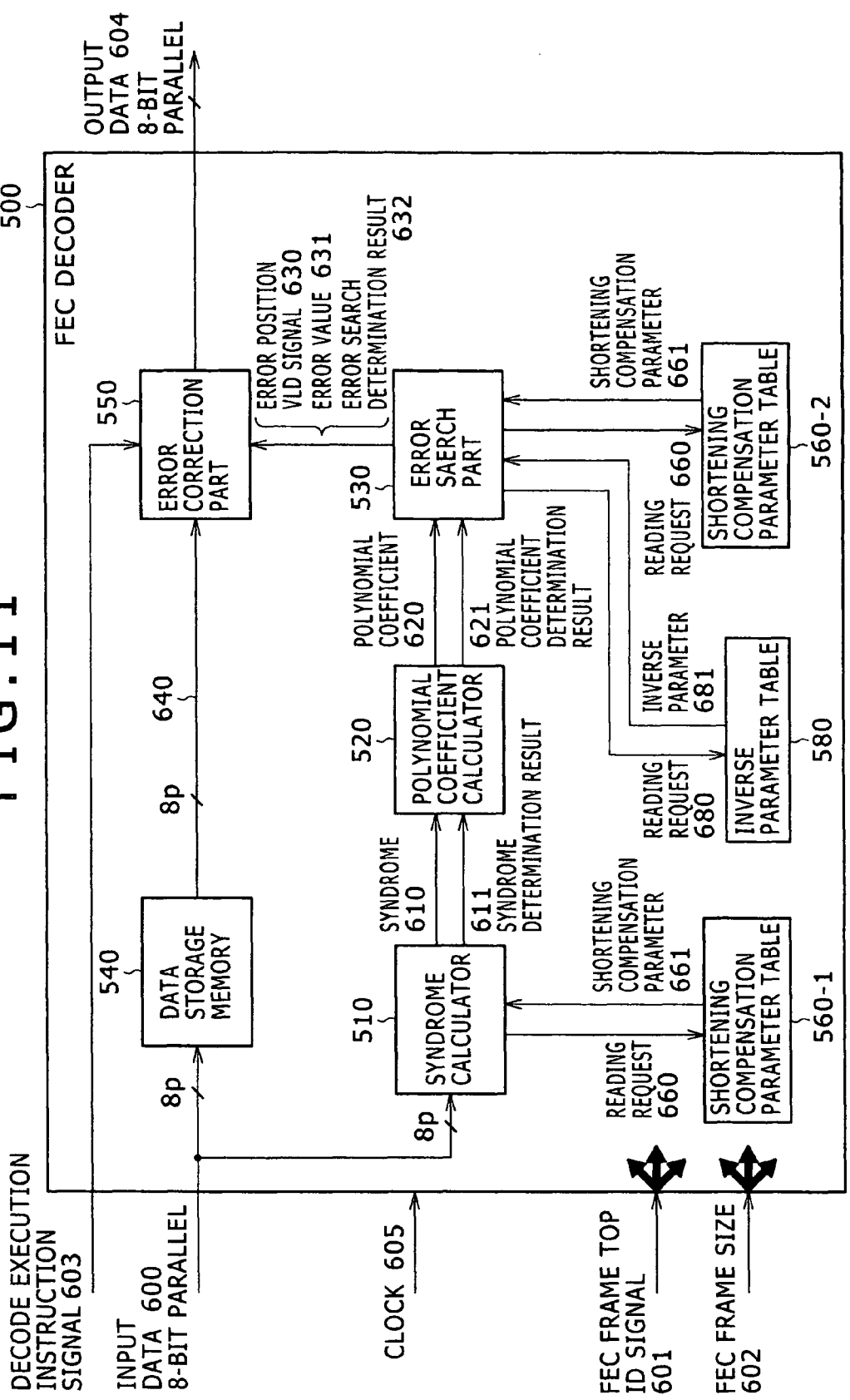
FIG. 11 is a block diagram of an FEC decoder.
Figure 12:
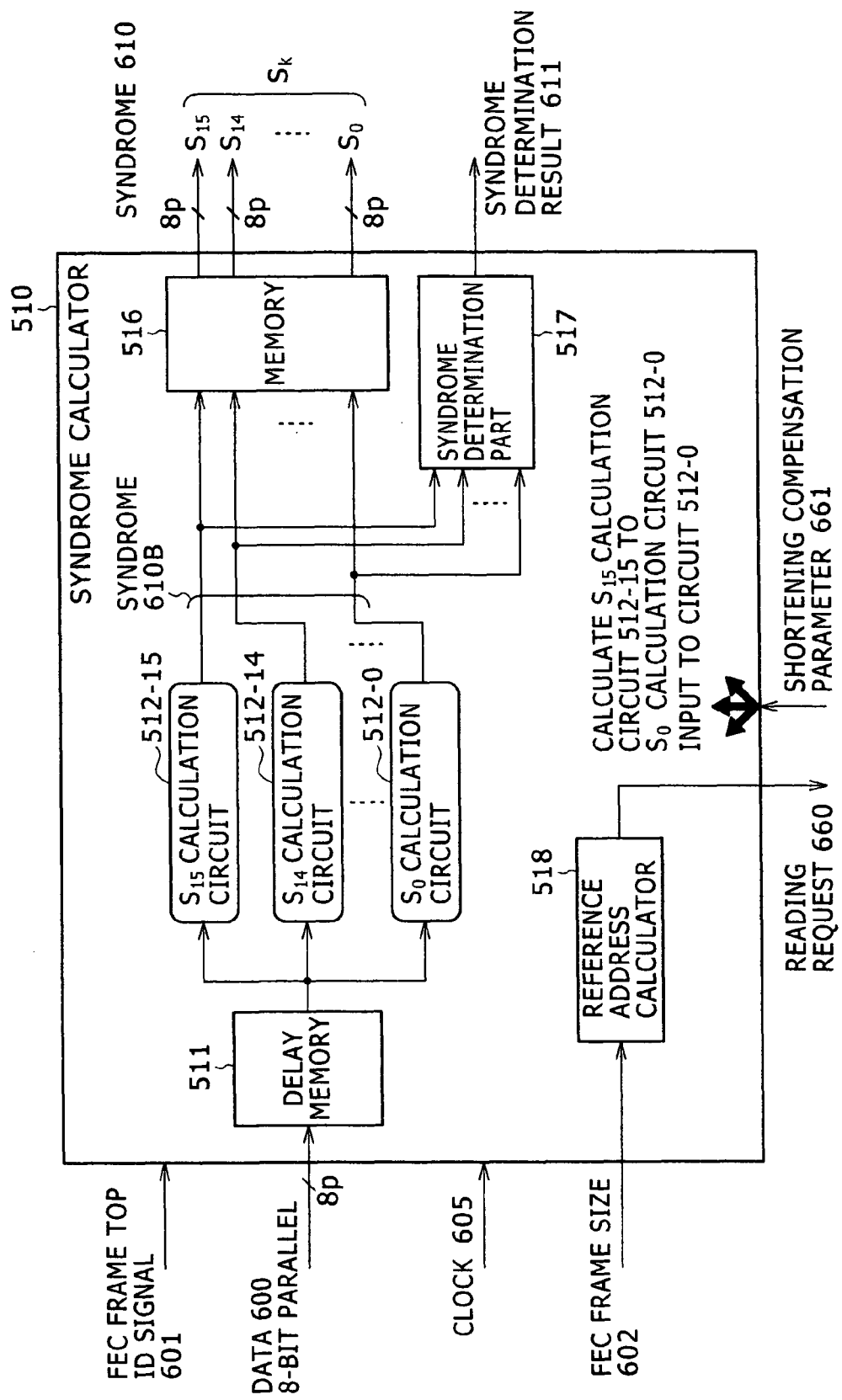
FIG. 12 is a block diagram of a syndrome calculator.
Figure 13:
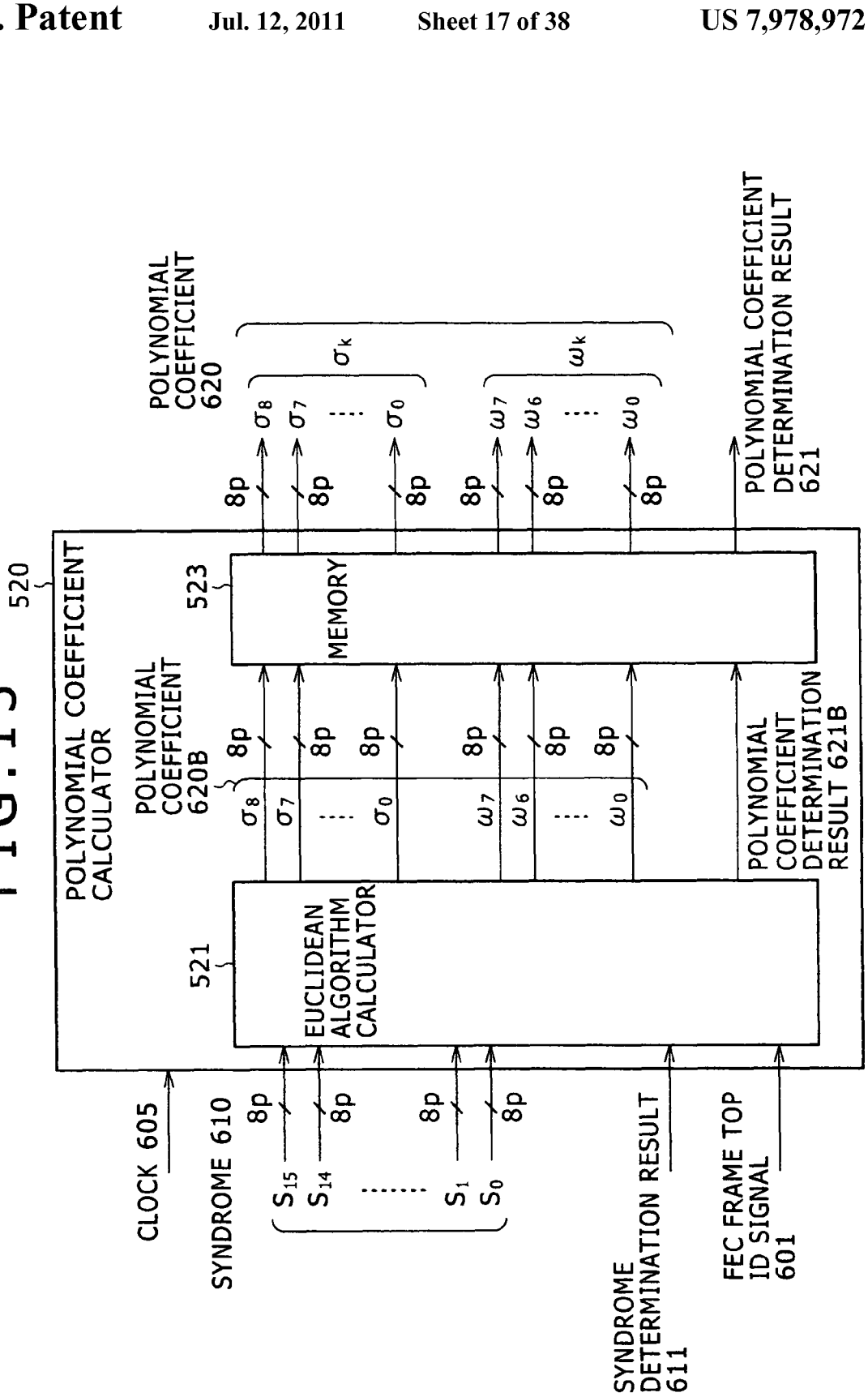
FIG. 13 is a block diagram of a polynomial coefficient calculator.
Figure 14:
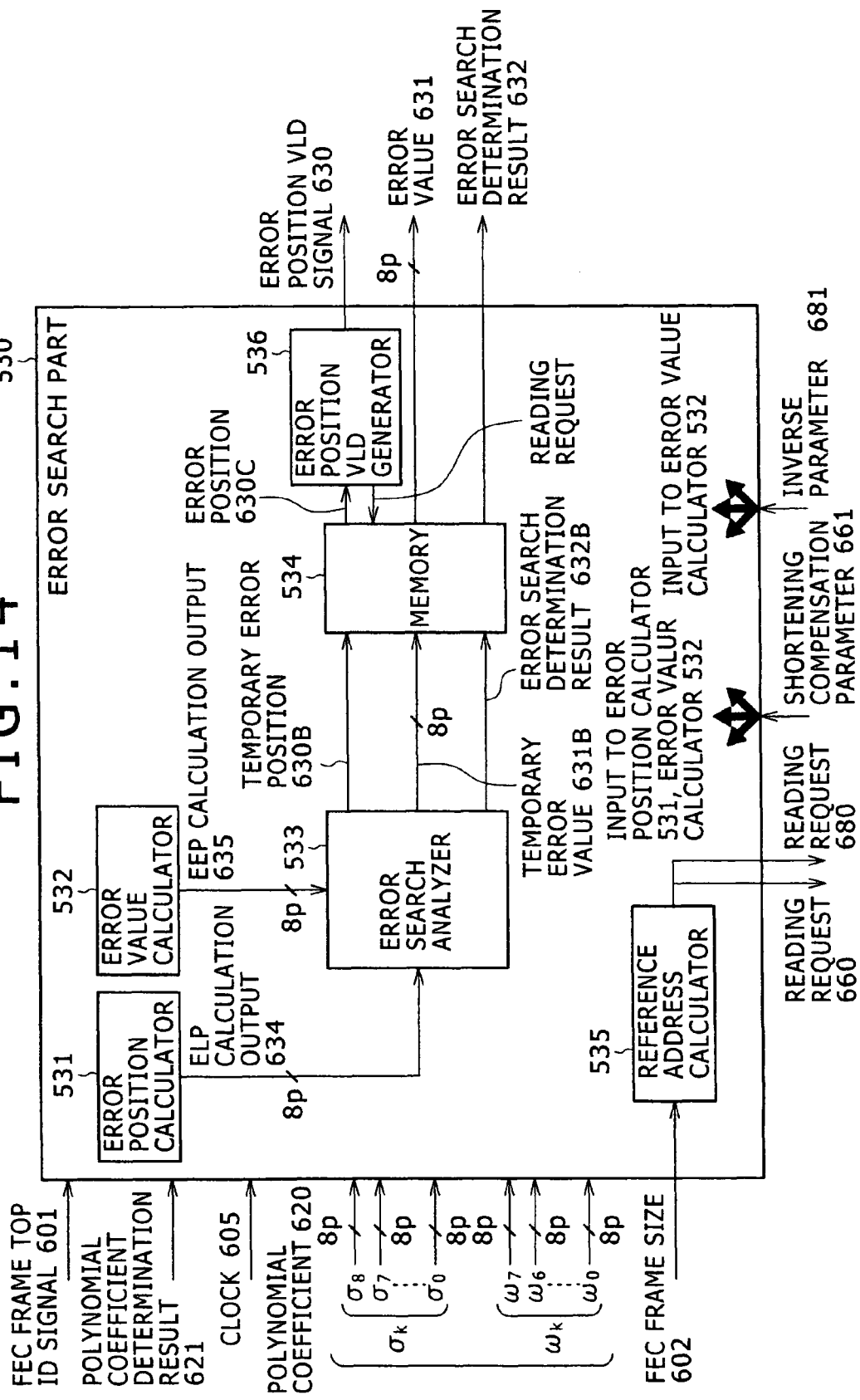
FIG. 14 is a block diagram of an error search part.
Figure 15:
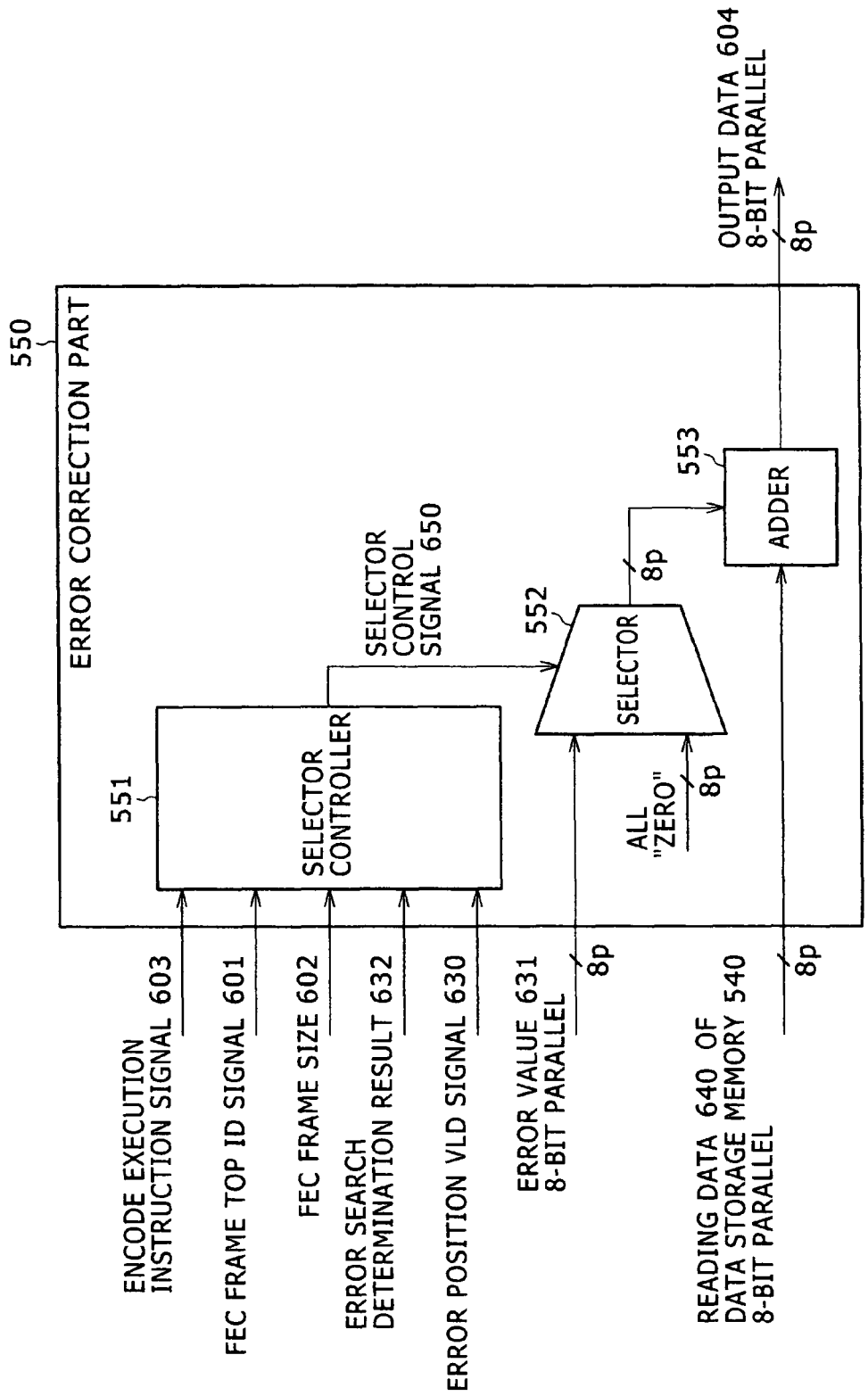
FIG. 15 is a block diagram of an error correction part.
Figure 16:
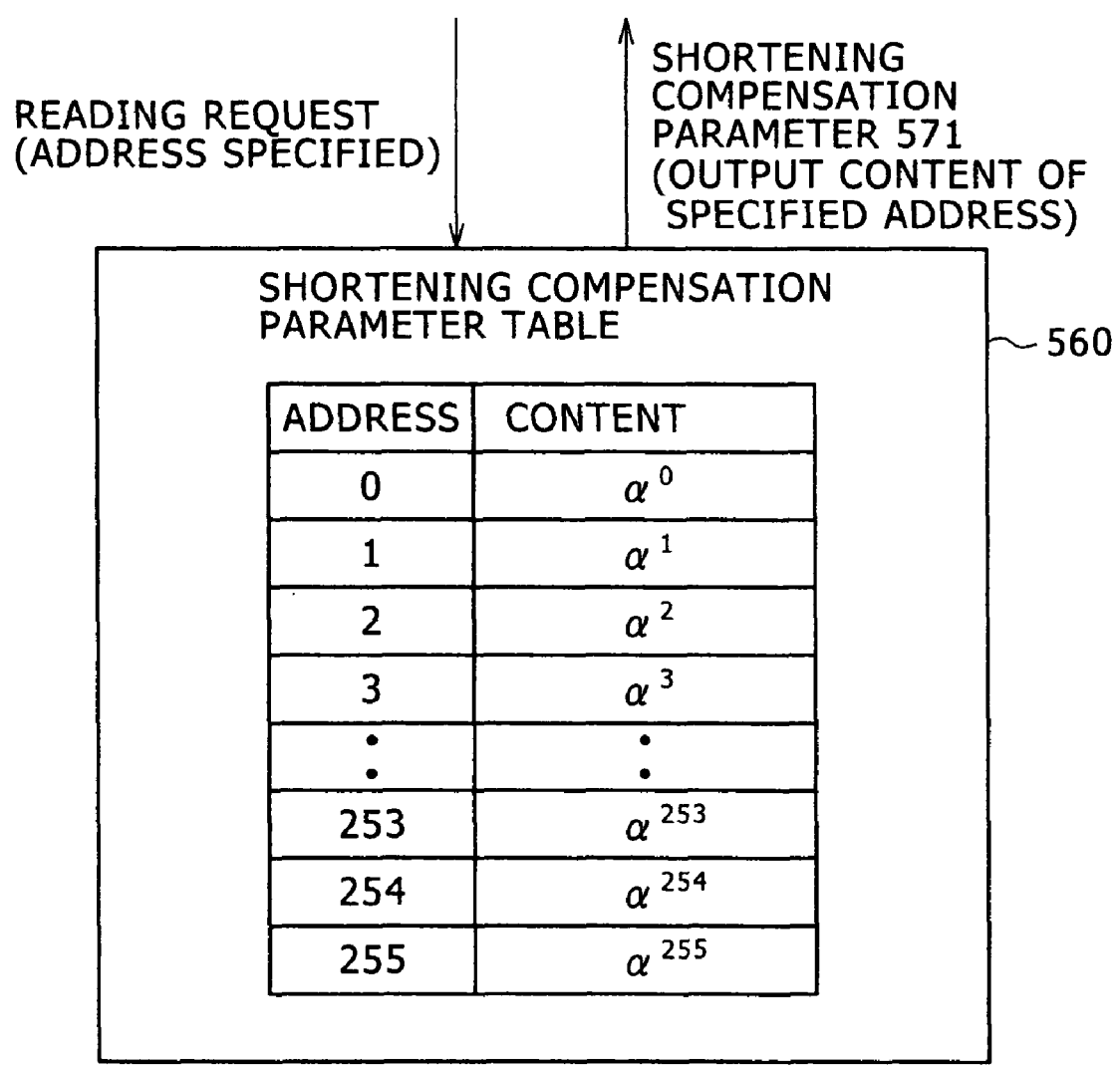
FIG. 16 is a view illustrating a shortening compensation parameter table.
Figure 17:
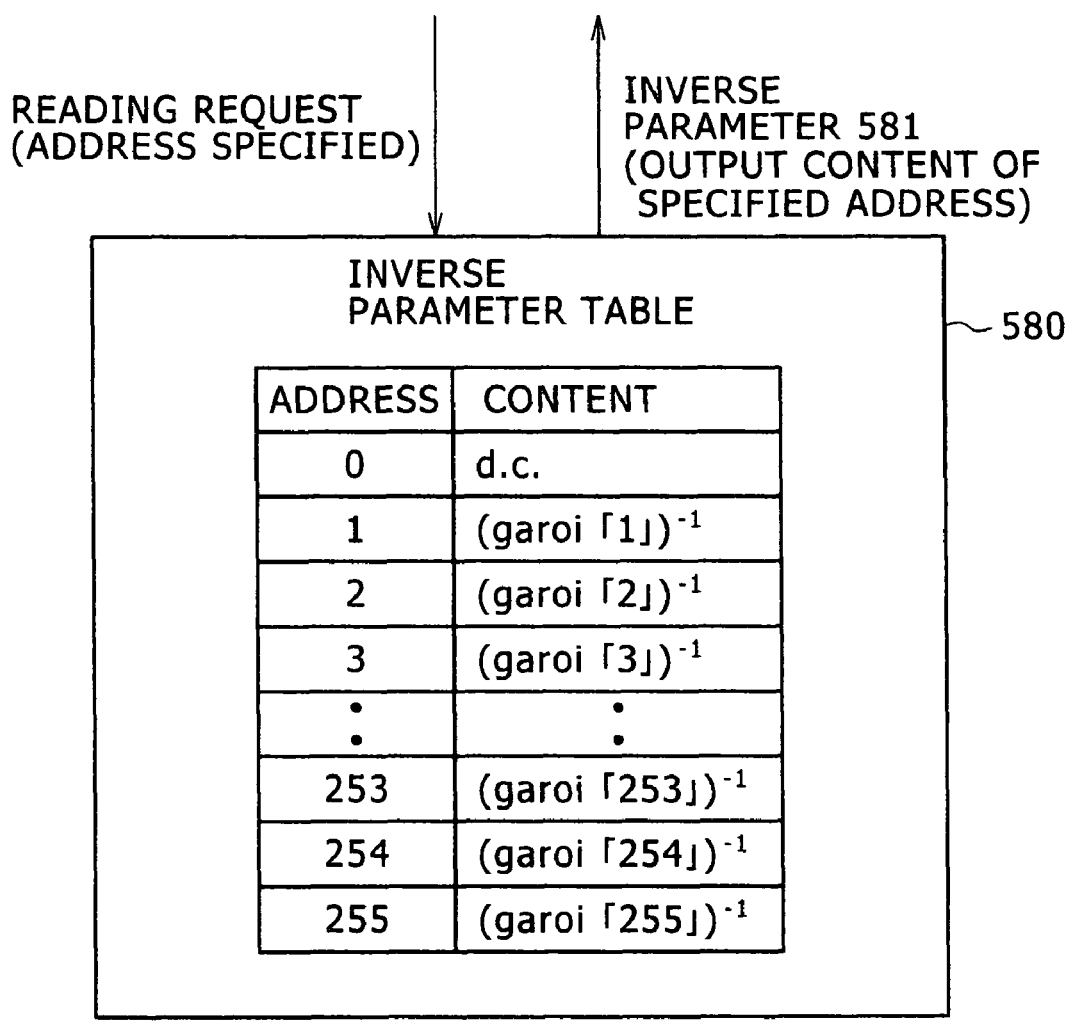
FIG. 17 is a view illustrating an inverse parameter table.
Figure 18:
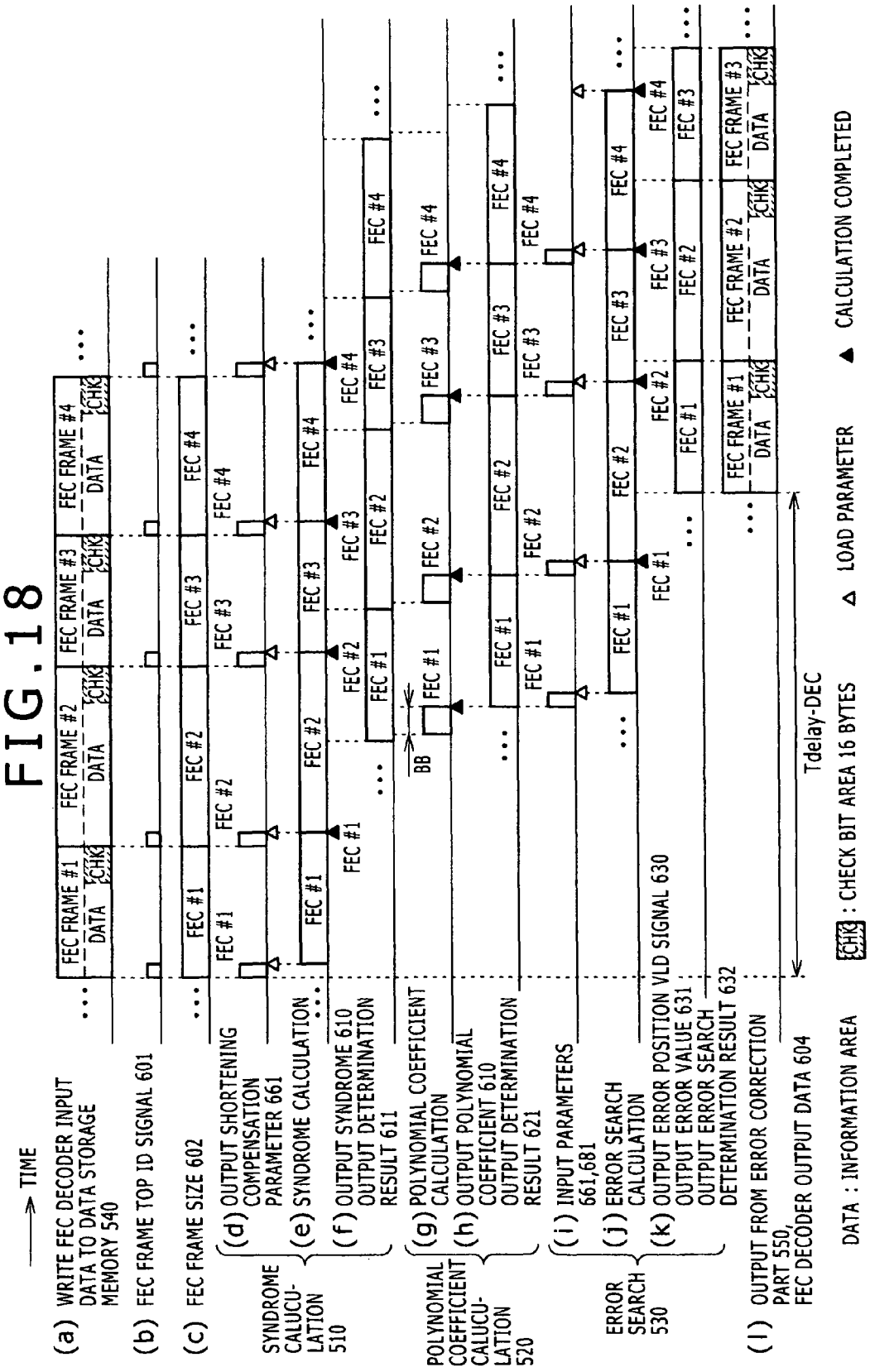
FIG. 18 is a time chart of the operation of the FEC decoder.
Figure 19:
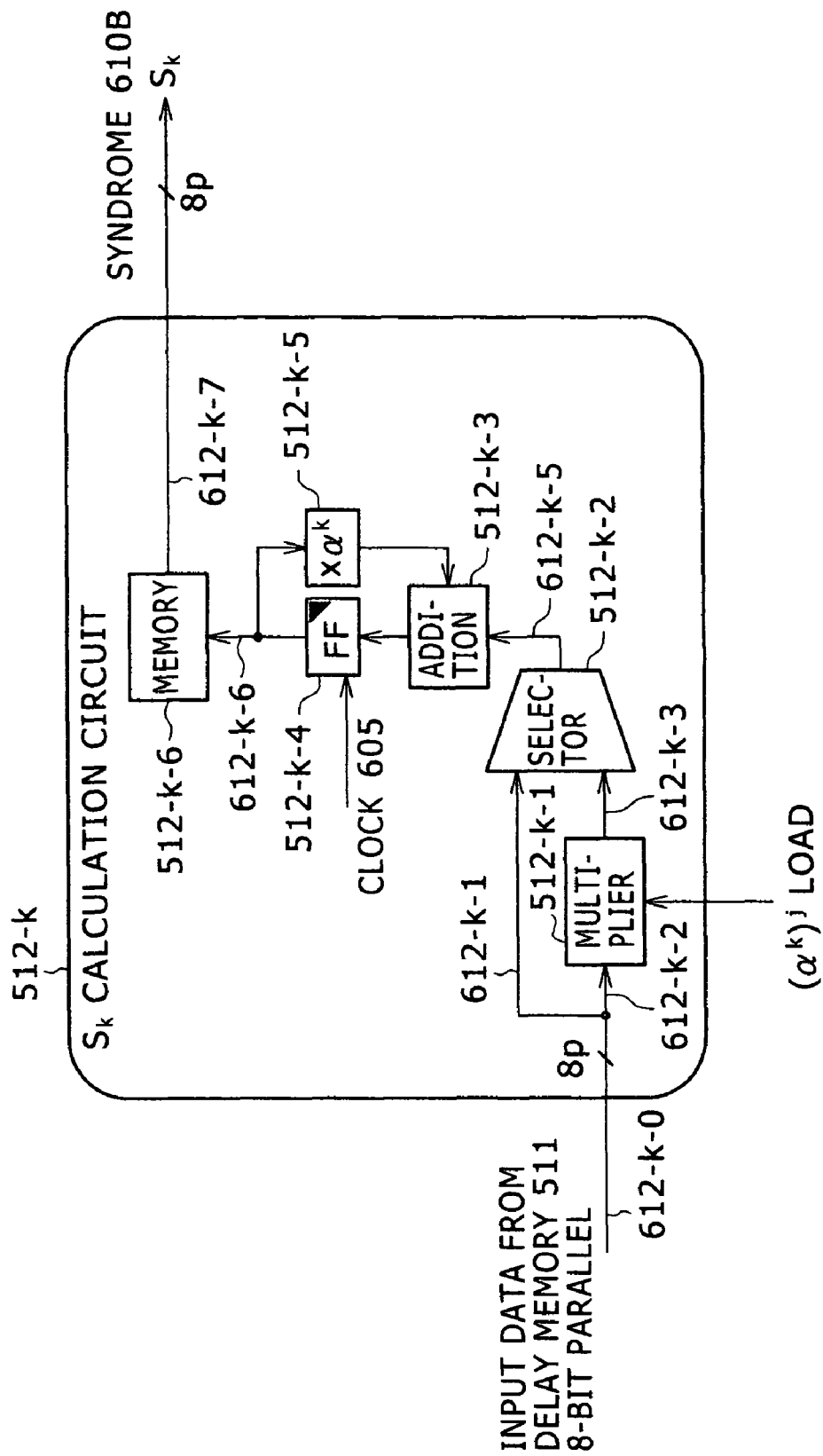
FIG. 19 is a block diagram of an Sk calculation circuit.
Figure 20:
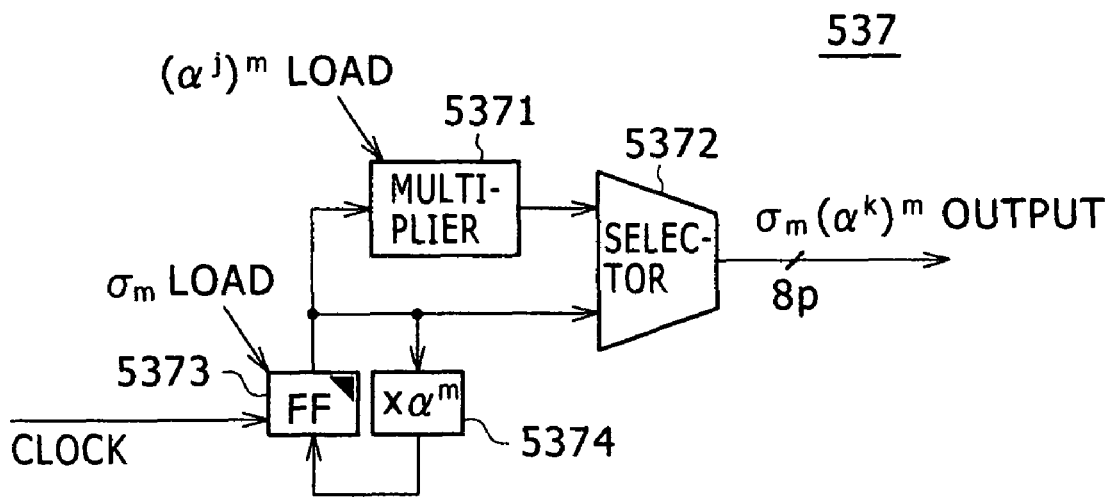
FIG. 20 is a block diagram of a base unit of an error position calculator.
Figure 21:
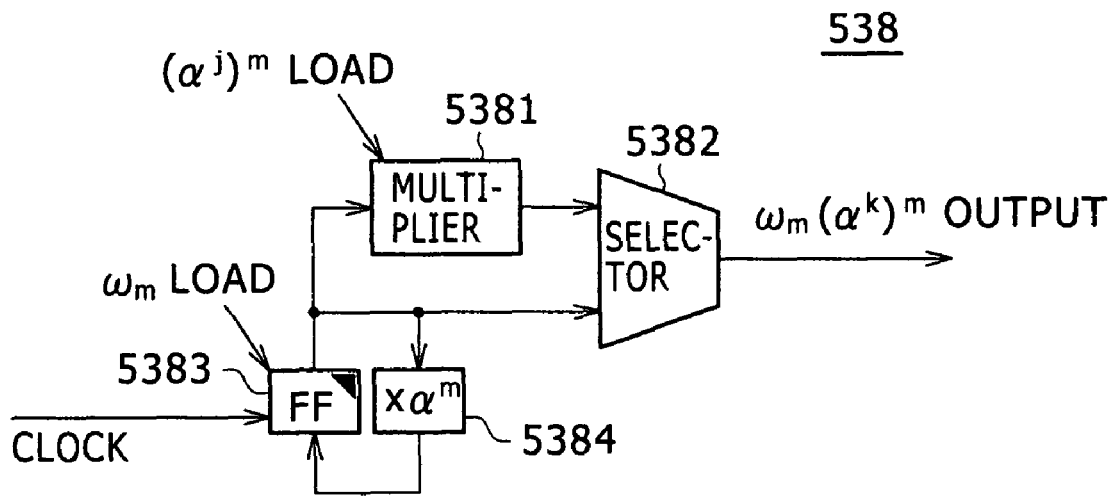
FIG. 21 is a block diagram of a base unit of an error value calculator (part 1)
Figure 22:
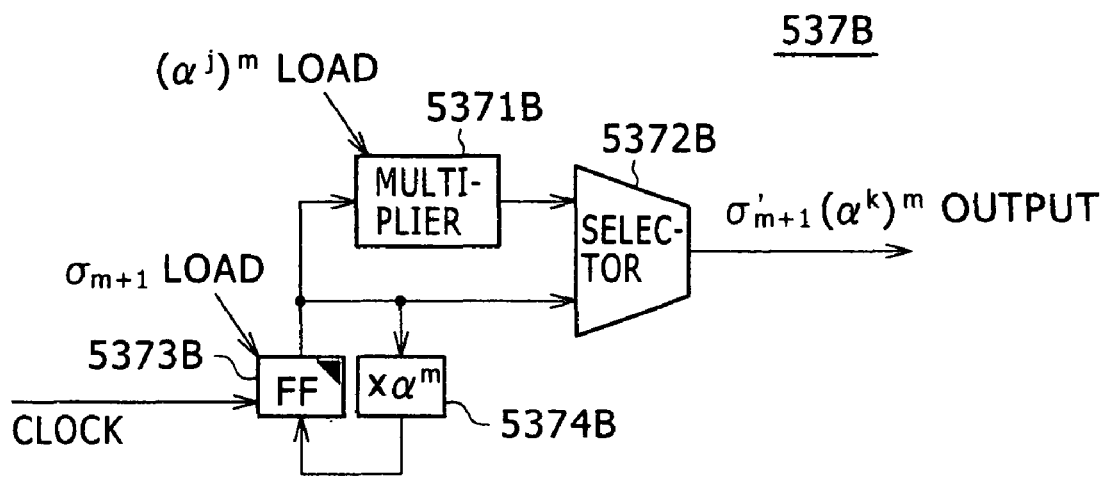
FIG. 22 is a block diagram of a base unit of the error value calculator (part 2)
Figure 23:
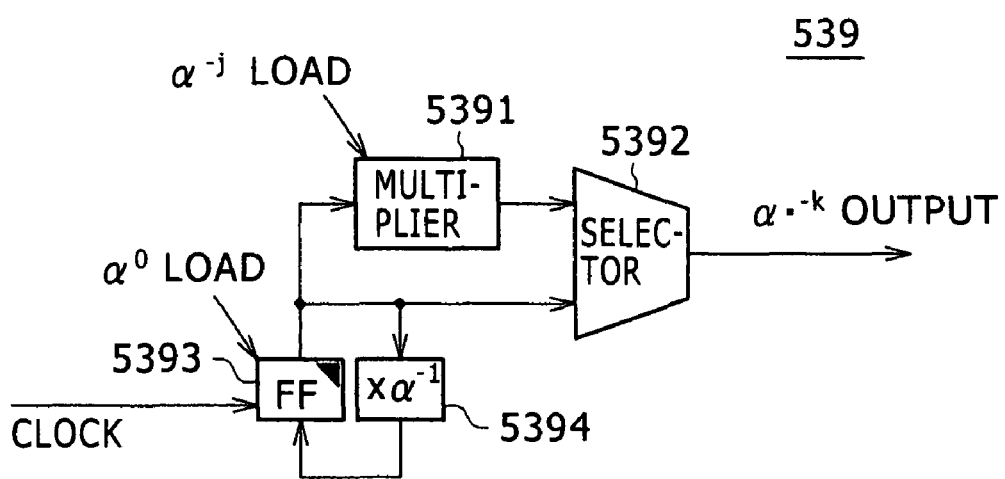
FIG. 23 is a block diagram of a base unit of the error value calculator (part 3)

Referring to FIGS. 11 to 23, an FEC decoder for 8-bit parallel input data will be described in detail below. Here, FIG. 11 is a block diagram of an FEC decoder. FIG. 12 is a block diagram of a syndrome calculator. FIG. 13 is a block diagram of a polynomial coefficient calculator. FIG. 14 is a block diagram of an error search part. FIG. 15 is a block diagram of an error correction part. FIG. 16 is a view illustrating a shortening compensation parameter table. FIG. 17 is a view illustrating an inverse parameter table. FIG. 18 is a time chart of the operation of the FEC decoder. FIG. 19 is a block diagram of an Sk calculation circuit. FIG. 20 is a block diagram illustrating a base unit of an error position calculator. FIG. 21 is a block diagram illustrating a base unit of an error value calculator (part 1). FIG. 22 is a block diagram illustrating a base unit of the error value calculator (part 2). FIG. 23 is a block diagram illustrating a base unit of the error value calculator (part 3).

In FIG. 11, an FEC decoder 500 has inputs of 8-bit parallel data 600, a decode execution instruction signal 603, an FEC frame top identification signal 601, and an FEC frame size 602, and then outputs an error corrected 8-bit parallel signal 604. The FEC decoder 500 includes a syndrome calculator 510, a polynomial coefficient calculator 520, an error search part 530, a data storage memory 540, an error correction part 550, shortening compensation parameter tables 560-1, 560-2, and an inverse parameter table 580.

A clock 605, as well as the FEC frame top identification signal 601 and the FEC frame size 602 are distributed to the respective parts of the FEC decoder. The FEC frame top identification signal 601 indicates the start timing of the FEC frame on the 8-bit parallel data stream. The FEC frame size 602 indicates the shortened FEC frame size when the code is shortened. The FEC frame size 602 may be the number of shortened and omitted bytes. At this time, the value of 255 minus the FEC frame size 602 is replaced with the subsequent FEC frame size 602.

The parameter for the FEC frame to be calculated is determined by the syndrome calculator 510 and the error search part 530. More specifically, the syndrome calculator 510 and the error search 530 calculate the addresses of the shortening compensation parameter table 560 and the inverse parameter table 580 that correspond to the FEC frame size 602, and read the contents of the addresses from the shortening compensation parameter table 560 and the inverse parameter table 580 to determine the parameter for performing a calculation equivalent to code shortening. The polynomial coefficient calculator 520 performs calculation independent of code shortening, because of its nature.

The 8-bit parallel input data 600 is input to the data storage memory 540 and the syndrome calculator 510. The data storage memory 540 stores the data during the syndrome calculation, polynomial coefficient calculation, and error search. The syndrome calculator 510 transmits a reading request 660 to a shortening compensation parameter table 560-1. The shortening compensation parameter table 560-1 transmits a shortening compensation parameter 661 back to the syndrome calculator 510. The syndrome calculator 510 performs a syndrome calculation based on the shortening compensation parameter 611, and transmits a syndrome 610 and a syndrome determination result 611 to the polynomial coefficient calculator 520.

The polynomial coefficient calculator 520 calculates a polynomial coefficient based on the received syndrome 610 and the syndrome determination result 611, and transmits a polynomial coefficient 620 and a polynomial coefficient determination result 621 to the error search part 530. The error search part 530 transmits reading requests 660, 680 to a shortening compensation parameter table 560-2 and the inverse parameter table 580, respectively. The shortening compensation parameter table 560-2 transmits a shortening compensation parameter 661 to the error search part 530. Similarly the inverse parameter table 580 transmits an inverse parameter 681 to the error search part 530. The error search part 530 performs error search based on the polynomial coefficient 620, polynomial coefficient determination result 621, shortening compensation parameter 661, and inverse parameter 681. Then the error search part 530 transmits an error position VLD (Valid) signal 630, an error value 631, and an error search determination result 632 to the error correction part 550.

The error correction part 550 receives the error position VLD signal 630, error value 631, and error search determination result 632, and reads the input data 600 from the data storage memory 540. Upon receiving the decode execution instruction signal 603, the error correction part 550 performs error correction and outputs the output data 604. In each of the tables, the correspondence between the address and the content is just uniquely determined. For example, in FIGS. 16 and 17, the order of the columns may be reversed. The shortening compensation parameter tables 560-1 and 560-2 can be shared. In this case, the two reading requests 660 are executed in a serial fashion.

In FIG. 12, the syndrome calculator 510 includes: a delay memory 511 for receiving the 8-bit parallel data 600; 16 Sk calculation circuits 512-k (where k is from 0 to 15) connected to the delay memory 511; a memory 516 and syndrome determination part 517 both connected to the Sk calculation circuits 512-k; and a reference address calculator 518 for receiving the FEC frame size 602 and calculating the reference address of the shortening parameter table.

The reference address calculator 518 calculates the address of the table 560 to be referred to from the FEC frame size 602, and transmits the reading request 660 to the shortening compensation parameter table 560. The shortening compensation parameter 661 transmitted from the shortening compensation parameter table 560 is input to the Sk calculation circuit 512-k. The parameter is used for multiplication ("x(α^k)^j") in the Sk calculation circuit 512-k.

The Sk calculation circuit 512-k performs multiplication with this parameter when the input data from the delay memory 511 is for the information area, while not operating the multiplication operation when the input data is for the FEC check bit area.

The start timing of the check bit area in the FEC frame is recognized by calculating from the FEC frame size 601 and the FEC frame top identification signal 602. However it is not limited to this method. As another method, the start signal of the check bit area may be obtained from the outside of the FEC decoder.

The syndrome of the FEC frame is fixed at the time when the data is input and calculated to the last of the check bit area. The memory 516 maintains the syndrome 610 when it is fixed, and continues to output until the syndrome of the next FEC frame is fixed.

The syndrome determination part 517 determines whether obtained syndromes 610B (S15 to S0) are all "zero", and outputs as the syndrome determination result 611. When the syndromes S15 to S0 are all "zero", the syndrome determination part 517 determines that no error is present in the relevant FEC frame, and displays "no error present" in the syndrome determination result 611. When one or more syndromes of the syndromes S15 to S0 are not "zero", the syndrome determination part 517 determines that error is present in the relevant FEC frame, and displays "error present" in the syndrome determination result 611.

The syndrome determination result 611 is continuously output synchronously with the output timing of the syndrome 610, until the syndrome of the next FEC frame is fixed. In the latter stage, the polynomial coefficient calculator 520 operates based on the syndrome determination result 611. The syndrome determination part 510 will be described below. First the input data to the FEC decoder is as follows:

$$y254\ y253\ y252\ldots y16+j\ y15\ y14\ldots y0$$

Here y254 is the first one byte of the FEC frame and y0 is the last one byte of the FEC frame. The information area is from y254 to y16+j, and the check bit area is 16 bytes from y15 to y0.

In all the calculations described below, data yk of each one of these bytes is calculated based on a primitive element of a Galois Field (2^8).

A received polynomial Y(Z) is defined as follows:

$$Y(Z)=y254Z^{254}+y253Z^{253}+\ldots+y16Z^{16}+\ldots+y1Z^1+y0$$

where Z is a variable. This is a polynomial whose coefficients are bytes of the code having a mathematically perfect code length of 255 bytes in which a shortened byte area is not omitted.

The syndrome Sk is defined as the coefficients of a syndrome polynomial S(Z).

$$S(Z)=S15Z^{15}+S14Z^{14}+\ldots+S1Z^1+S0$$

$$Sk=Y(\alpha^k)\text{ for }0\leq k\leq 15$$

where Z^15, α^k and other functions are powers.

When the shortening method is middle aligned (namely, the code is mathematically arranged in the order of the information byte area, shortened byte area, and check bit area from the top thereof), the following is given:

$$Y(Z)=y254Z^{254}+y253Z^{253}+\ldots+y(16+j)Z^{(16+j)}+y(16+j-1)Z^{(16+j-1)}+\ldots+y16Z^{16}+y15Z^{15}+\ldots+y1Z^1+y0$$

Here the information byte area is from y254Z^254 to y(16+j)Z^(16+j), the shortened byte area is from y(16+j−1)Z^(16+j−1) to y16Z^16, and the FEC byte area is from y15Z^15 to y0. The coefficients, y(16+j−1) to y16, of the shortened byte area have a logical value "zero". Thus the syndrome Sk is expressed by:

$$Sk=\{y254(\alpha^k)^{(254-j)}+y253(\alpha^k)^{(253-j)}+\ldots+y(16+j)(\alpha^k)^{16}\}\times(\alpha^k)^j+y15(\alpha^k)^{15}+\ldots+y1(\alpha^k)+y0$$

Here the information byte area is from y254(α^k)^(254−j) to y(16+j)(α^k)^16, the FEC byte area is from y15(α^k)^15 to y0.

When the shortening method is top aligned (namely, the code is mathematically arranged in the order of the shortened byte area, information byte area, and check bit area from the top thereof), the following is given:

$$Y(Z)=y254Z^{254}+y253Z^{253}+\ldots+y(255-j)Z^{(16+j)}+y(254-j)Z^{(254-j)}+\ldots+y16Z^{16}+y15^{15}+\ldots+y1Z^1+y0$$

Here the shortened byte area is from y254Z^254 to y(255−j)Z^(16+j), the information byte area is from y(254−j)Z^(254− j) to y16Z^16, and the FEC byte area is from y15^15 to y0. Further the coefficients, y253 to y(255−j), of the shortened byte area have a logical value "zero". Thus the syndrome Sk is expressed by:

$$Sk = \{y(254-j)(\alpha^k)^{(254-j)} + y(253-j)(\alpha^k)^{(253-j)} + \ldots + y16(\alpha^k)^{16}\} \times (\alpha^k)^j + y15(\alpha^k)^{15} + \ldots + y1(\alpha^k) + y0$$

Here the information byte area is from $y(254-j)(\alpha^k)^{(254-j)}$ to $y16(\alpha^k)^{16}$, and the FEC byte area is from $y15(\alpha^k)^{15}$ to $y0$.

The Sk calculation circuit 512-k of the syndrome calculator 510 calculates the syndrome Sk.

The feature of the embodiment is to perform calculation by skipping the shortened byte area. Further a table for shortening compensation, a multiplier, and a selector are provided to support any code shortening.

The Sk calculation circuit 512-k outputs the syndrome Sk which is fixed when the last data of the FEC frame is input. When the FEC frame size is 150 bytes, the Sk is fixed in the 150th clock input cycle from the top of the FEC frame.

In FIG. 13, the polynomial coefficient calculator 520 has inputs of the syndrome 610, syndrome determination result 611, clock 605, and FEC frame top identification signal 601. Then the polynomial coefficient calculator 520 outputs the polynomial coefficient 620 with 9 signals σk (where k is from 0 to 8) each of which is 8-bit parallel and 8 signals ωk (where k is from 0 to 7) each of which is 8-bit parallel, as well as the polynomial determination result 621. The polynomial coefficient calculator 520 includes a Euclidean algorithm calculator 521 and a memory 523. The Euclidean algorithm calculator 521 calculates a polynomial coefficient 620B with the 8-bit parallel signals σk (where k is from 0 to 8) and ωk (where k is from 0 to 7), as well as a polynomial coefficient determination result 621B, and then outputs to the memory 523.

When the syndrome determination result 611 indicating "no error present" is input from the syndrome calculator 510, the polynomial coefficient calculator 520 stops operation of the Euclidean algorithm calculator 521 until the calculation timing of the next FEC frame, while displaying "no error present" as the polynomial coefficient determination result 621 until the calculation timing of next the FEC frame. When the syndrome determination result 611 indicates "error present", the polynomial coefficient calculator operates 520 operates the Euclidean algorithm calculator 521.

The memory 523 maintains the polynomial coefficient 620B and the polynomial coefficient determination result 621B each time the polynomial coefficient calculation is completed, while outputting the polynomial coefficient 620 as the polynomial coefficient determination result 621 until the polynomial coefficient calculation for the next FEC frame is completed. Incidentally the polynomial coefficient determination result 621 is output synchronously with the output timing of the polynomial coefficient 620.

When a conflictive result arises in the Euclidean algorithm calculation under the condition in which the syndrome determination result 611 indicates "error present", the Euclidean algorithm calculator 512 displays "error correction not possible" in the polynomial coefficient determination result 621B. On the other hand, the Euclidean algorithm calculator 512 displays "error correction possible" in the polynomial coefficient determination result 621B when a consistent result is given.

The Euclidean algorithm calculator 521 obtains the polynomial coefficient by the Euclidean algorithm which is well known to those skilled in the art, from the syndrome.

The polynomial coefficient calculator 520 recognizes the calculation start timing of an FEC frame by the FEC frame top identification signal 601. When the syndrome determination result 611 indicates "error present", the polynomial coefficient calculator 520 loads the syndrome 610 to start calculation. Incidentally, when the FEC frame top identification signal 601 of the next FEC frame enters during the calculation of the polynomial coefficient of the FEC frame, the polynomial coefficient calculator 520 starts the polynomial calculation of the next FEC frame upon completion of the polynomial calculation of the current FEC frame.

Further when the processing time needed for the Euclidean algorithm calculation is long compared to the reception time corresponding to the minimum size of the FEC frame that can be received, plural Euclidean algorithm calculators 521 (e.g., two, four) are provided to calculate the polynomial coefficient by switching them sequentially for each received FEC frame.

When an error value eki exists in the ki-th byte from the top of the FEC frame (where $1 \leq i \leq 8$), ELP (Error Locator Polynomial) is given by Equation 4 and EEP (Error Evaluator Polynomial) is given by Equation 5.

$$\sigma(z) = \prod_i (1 + \alpha^{-ki} z) \qquad \text{[Equation 4]}$$

$$= \sum_{i=0}^{8} \sigma_i z^i, \quad \sigma_0 = \alpha^0$$

$$\omega(z) = \sum_i \left\{ e_k \prod_{j(j \neq i)} (1 + \alpha^{-ki} z) \right\} \qquad \text{[Equation 5]}$$

$$= \sum_{i=0}^{7} \omega_i z^i$$

The Euclidean algorithm calculator 521 obtains a coefficient σi of σ(z) and a coefficient ωi of ω(z) from the syndromes S0 to S15.

In FIG. 14, the error search part 530 has inputs of the polynomial coefficient 620, polynomial coefficient determination result 621, frame top identification signal 601, FEC frame size 602, and clock 605. Then the error search part 530 outputs the error position VLD signal 630, error value 631, and error search determination result 632. The error search part 530 includes: an error position calculator 531; an error value calculator 532; an error search analyzer 533 having inputs of an ELP calculation output 634 from the error position calculator 531, and an EEP calculation output 635 from the error value calculator 532; a memory 534 for maintaining the output of the error analyzer 533; an error position VLD (Valid) generator 536; and a reference address calculator 535.

The error search analyzer 533 performs error search analysis based on the ELP calculation output 634 for calculating the error position and on the EEP calculation output 635 for outputting the coefficient of the polynomial to calculate the error value. Then the error search analyzer 533 transmits a temporary error position 630B, a temporary error value 631B, and an error search determination result 632B to the memory 534. The reference address calculator 535 transmits the reading requests 660 to the shortening compensation parameter table 560-2, and the reading request 680 to the inverse parameter table 580. The shortening compensation parameter 661 from the shortening compensation parameter table 560-2 is input to the error position calculator 531 and the error value calculator 532. The inverse parameter 681 from the inverse parameter table 580 is input to the error value calculator 532. These parameters are used for the carry calculation (multiplication "x(a^k)^(j+16)", multiplication "x(α^-j)") and the division by the first derivation of σ(z) in the error position calculator 531 and the error value calculator 532.

When the polynomial coefficient determination result 621 indicates "no error present", the error position calculator 531 and the error value calculator 532 are stopped operating, and the error search analyzer 533 displays "no error present" in the error search determination result 632B. When the polynomial coefficient determination result 621 displays "error correction not possible", the error position calculator 531 and the error value calculator 532 are stopped operating, and the error search analyzer 533 indicates "error correction not possible" in the error search determination result 632B. Further when the polynomial coefficient determination result 621 indicates "error correction possible", the error position calculator 531 and the error value calculator 532 are operated.

The error position calculator 531 loads σk of the polynomial coefficient 620, and the shortening compensation parameter 661 as initial parameters to start calculation. Similarly the error value calculator 532 loads ωk of the polynomial coefficient 620, and the shortening compensation parameter 661 as initial parameters to start calculation. The error position calculator 531 obtains the position at which the error is present and the error value calculator 532 obtains its error value, respectively using a Chien search method or other method from the polynomial coefficient 620.

The reference address calculator 535 calculates the addresses of the tables 560-2 and 580 to be referred to from the FEC frame size 602, and issues the reading requests 660, 680 to the tables 560-2, 580, respectively. Then the reference address calculator 535 inputs the shortening compensation parameters 661, 681 read from the tables 560-2 and 580, to the error position calculator 531 and the error value calculator 532, respectively.

The error search analyzer 533 monitors whether the ELP calculation output 634 is "zero". When the output is "zero", the error search analyzer 533 outputs a temporary error position 630B corresponding to this timing as well as a value of the EEP calculation output 635 at this time as a temporary error value 631B, to the memory 534. The memory 534 stores the temporary error position 630B and the temporary error value 631B.

When the calculation for an FEC frame is completed in the error position calculator 531 and the error value calculator 532 with no conflict arising in the error search analyzer 533, the error search part 530 displays "error correction possible" in the error search determination result 632B. The error search part outputs all the stored temporary error positions 630B and temporary error values 631B as they are as the error position 630 and the error value 631, from the memory 534. Further the error search part outputs the error search determination result 632B as it is as the error search determination result 632. The temporary error position 630B and the temporary error value 631B, which correspond to each other on a one-to-one basis, are written to the same address in order to easily detect the correspondence upon reading the data.

With conflict arising in the error search analyzer 533, the error search part 530 displays "error correction not possible" in the error search determination result 632B, and clears all the stored temporary error positions 630B and temporary error values 631B from the memory 534. Further the error search part 530 outputs the error search determination result 632B as it is as the error search determination result 632.

The memory 534 maintains one or more pairs of the temporary error position 630B and the temporary error value 631B until the error search calculation is completed. Further the memory 534 maintains the error search determination result 632B each time the error search calculation is completed, and continues to output until the error search calculation is completed for the next FEC frame.

The error position VLD generator 536 once maintains all the error positions 630C in the relevant FEC frame, which are stored in the memory 534. Then the error position VLD generator 536 generates and outputs the error position VLD signal 630 in accordance with the timing when the data corresponding to the error position 630C in the FEC frame is error corrected by the error correction part 550 and is output therefrom. Further the error position VLD generator 536 transmits a reading request to the memory 534 in accordance with the timing of generating the error position VLD signal 630. The memory 534 outputs the error value 631 based on the reading request.

In other words, the error position VLD generator 536 controls so that the error position VLD signal 630 and the error value 631 are output at a timing of each byte error corrected by the error correction part 550.

Incidentally, the error value 631 in a certain error position 630C is one byte, or 8-bit parallel.

The error position calculator 531 and the error value calculator 532 recognize the FEC frame calculation request by the FEC frame top identification signal 601. When the polynomial coefficient determination result 621 indicates the presence of error in the FEC frame, the error position calculator 531 and the error value calculator 532 both load polynomial coefficient 620 to start calculation. Further when the processing time needed for the Chien search calculation is long compared to the reception time corresponding to the minimum size of the FEC frame that can be received, plural error position calculators 531 and error value calculators 532 (e.g., two, four) are provided to calculate the error position and the error value by switching them sequentially for each received FEC frame.

When an error value ek exists in the k-th byte from the top of the FEC frame (where $1 \leq i \leq 8$), the following Equation 6 is given:

$$\sigma(\alpha^k)=0$$

$$e_k=(\alpha^{-k}) \times \{\omega(\alpha^k)\} \div \{\sigma'(\alpha^k)\} \quad \text{[Equation 6]}$$

Here σ'(z), the first derivation of σ(z), is given by Equation 7:

$$\sigma'(z) = \sum_{i=0}^{3} \sigma_{2i+1} z^{2i} \quad \text{[Equation 7]}$$

The error position calculator 531 calculates σ(α^k) sequentially from the top of the FEC frame. The error value calculator 532 calculates ek sequentially from the top of the FEC frame.

In FIG. 15, the error correction part 550 has inputs of the FEC frame top signal 601, FEC frame size 602, decode execution instruction signal 603, error search determination result 632, error position VLD signal 639, error value 631, and reading data 640 of the data storage memory 540 of the FEC decoder 500, and then outputs the 8-bit parallel output data 604. The error correction part 550 includes: a selector controller 551 having inputs of the FEC frame top signal 601, FEC frame size 602, decode execution instruction signal 603, error search determination result 632, and error position VLD signal 630 to control a selector 552; the selector 552 having inputs of the error value 631 and the 8-bit parallel all zero signal generated within the error correction part 550 and an adder 553 for adding the output of the selector 552 and the reading data 640 of the data storage memory 540.

The selector controller 551 of the error correction part 550 selects the error value 631 side in the selector 552, at timing when the decode execution instruction signal 603 indicates "decode execution", the error search determination result 632 indicates "error correction possible", and the error position VLD signal 630 indicates that the position is the error position. Otherwise the selector controller 551 selects the all "zero" side.

Incidentally the adder 553 calculates an exclusive logical sum for each bit.

In FIG. 16, the shortening compensation parameter table 560 includes the address and the content, in which the address is expressed by decimal number. Content corresponding to address n is set in advance, based on a primitive element "α^n" of the Galois Field (2^8) in 8-bit binary number. The shortening compensation parameter table 560 is calculated and set in advance within the FEC decoder 500 before the start of the operation as the decoder. Alternatively it may be designed to set the shortening compensation parameter table 560 from the outside of the FEC decoder 500.

In FIG. 17, the inverse parameter table 580 includes the address and the content, in which the address is expressed by decimal number. Content corresponding to address n is set in advance, based on an inverse (garoi "n")^-1 of a primitive element garoi "n" of the Galois Field (2^8), in 8-bit binary number. The inverse parameter table 580 is calculated and set in advance within the FEC decoder 500 before the start of the operation as the decoder. Alternatively it may be designed to set the inverse parameter table 580 from the outside of the FEC decoder 500. Incidentally the content for the address 0, which is "don't care" in the inverse parameter table 580, may also be zero.

In FIG. 18, (a) represents the input data of the FEC decoder 500, namely, the writing timing to the data storage memory 540, (b) represents the timing of the frame top identification signal 601, (c) represents the timing of the FEC frame size signal, (d) represents the input timing of the shortening compensation parameter 661 of the syndrome calculator 510, (e) represents the timing of the syndrome calculation of the syndrome calculator 510, (f) is the output timing of the syndrome 610 and determination result 611 of the syndrome calculator 510, (g) represents the timing of the polynomial coefficient calculation of the polynomial coefficient calculator 520, (h) represents the output timing of the polynomial coefficient 620 and determination result 621 of the polynomial coefficient calculator 520, (i) is the parameter input timing of the error search part 530, (j) is the timing of the error search calculation of the error search part 530, (k) is the output timing of the error position VLD signal 630, error value 631, and error search determination result 632 of the error search part 530, and (l) represents the output of the error correction part 550, namely, the output timing of the output data 604 of the FEC decoder 500.

It is assumed that AA byte represents the maximum size of the FEC frame the FEC decoder 500 can receive, BB clock cycle represents the fixed or maximum delay time generated in the polynomial coefficient calculator 520, and DD represents the delay caused by factors other than the FEC code calculation, such as data transfer within the FEC decoder 500 and data transfer between the FEC decoder 500 and the outside thereof. At this time the decoder is configured with Tdelay-DEC as a fixed value and the clock cycle of CC or more.

Here:

$$CC = AA \times 2 + BB + DD$$

The time for one clock cycle is the time for receiving one byte in the FEC frame. The data storage memory 540 outputs the data being delayed for a period of time of Tdelay-DEC. The data storage memory 540 has a capacity sufficient for buffering all the data that can be received in the period of time of Tdlay-DEC, and sequentially reads out the stored data after Tdelay-DEC has elapsed.

Further the correction is made by the error correction part 550 and the error search part 530 that output various types of information for error correction, in accordance with the timing of the error correction and output with the delay time of Tdelay-DEC. More specifically, when AA=255 and BB+DD=15, Tdelay-DEC is defined as a fixed value at a minimum of 525 clock cycles or more.

Assuming that Tdelay-DEC is the fixed value of 525 clock cycles and the received bit rate of the FEC frame is 1 Mbps, Tdelay-DEC is equivalent to a time for receiving data of 525×8 bits, or equal to 4.2 milliseconds.

With this configuration, it is possible to achieve accurate error correction even when continuously receiving FEC frames with an arbitrary size smaller than AA byte that dynamically increases and decreases. Without such a configuration, the calculations in the syndrome calculator 510 and the error search part 530 are not completed in time as the size of the received FEC frame dynamically increases, thereby making it difficult to perform error correction for the FEC frame of size AA. The reason for this is that the calculations in the syndrome calculator 510 and the error search part 530 need the number of clock cycles for the FEC frame size.

In FIG. 19, the Sk calculation circuit 512-k has inputs of the clock 605, 8-bit parallel input data from the delay memory 511, and (α^k)^j from the shortening compensation parameter table, and then outputs the syndrome 610B. The Sk calculation circuit 512-k includes a parameter variable multiplier 512-k-1, a selector 512-k-2, an adder 512-k-3, a flip flop 512-k-4, a fixed multiplier 512-k-5, and a memory 512-k-6.

The parameter variable multiplier 512-k-1 has inputs of the 8-bit parallel input data from the delay memory 511, and the parameter (α^k)^j from the shortening compensation parameter table, and then outputs the multiplication result to the selector 512-k-2. The selector 512-k-2 has inputs of the multiplication result from the parameter variable multiplier 512-k-1, and the 8-bit parallel input data from the delay memory 511, and then outputs the selected output to the adder 512-k-3. The adder 512-k-3 has inputs from the selector 512-k-2 and the fixed adder 512-k-5, and outputs to the flip flop 512-k-4. The flip flop 512-k-4 maintains the input data for one clock, and outputs to the memory 512-k-6 and the fixed multiplier 512-k-5.

The calculation of σm(α^k)^m in σ(a^k) will be described with reference to FIG. 20.

In FIG. 20, the lines connecting blocks are 8-bit parallel, respectively. A basic unit 537 of the error position calculator 531 of the error search part 530 includes a parameter load multiplier 5371, a selector 5372, a flip flop (FF) 5373, and a fixed multiplier 5374. The error position calculator 531 mainly includes 8 sets of the base unit 537. Here m is the suffix, and j is the shortening degree of the number of omitted bytes.

The parameter load multiplier 5371 loads (a^j)^m of the shortening parameter. The flip flop (FF) 5373 loads a coefficient σm of the polynomial as an initial value. Upon input of a clock, the flip flop (FF) 5373 outputs the previous value to the multiplier 5371, selector 5372, and fixed multiplier 5374. The multiplier 5371 performs multiplication based on the loaded parameter, and outputs to the selector 5372. The fixed multiplier 5374 outputs the multiplication result to the flip flop 5373.

Due to code shortening, it is necessary to omit the error search calculation for the shortened byte area not involved in the actual data transfer. Thus when the shortening method is middle aligned, the selector 5372 outputs the signal of the through side (FF5373) at the input timing of the information byte area. While the selector 5372 outputs the signal of the multiplier 5371 side at the input timing of the check bit area.

When the shortening method is top aligned, the selector 5372 always outputs the signal of the multiplier 5371 side at both the input timing of the information byte area and the check bit error.

The output of the error position calculator 531 is an exclusive logical sum for each bit of σm($α^k$)$^m$ for 8 sets, and σ0.

In FIG. 21, a basic unit 538 of the error value calculator 532 of the error search part 530 includes a parameter load multiplier 5381, a selector 5382, a flip flop (FF) 5383, and a fixed multiplier 5384.

The parameter load multiplier 5381 loads ($α^j$)$^m$ of the shortening parameter. The flip flop (FF) 5383 loads cm as an initial value.

In FIG. 21, the m-order coefficient of ($α^k$), σm($α^k$)$^m$, is output in the k-th clock input cycle. The timing of the selector switching performed in accordance with code shortening, and the like are the same as in FIG. 20.

In FIG. 22, a basic unit 537B of the error value calculator 532 of the error search part 530 includes a parameter load multiplier 5371B, a selector 5372B, a flip flop (FF) 5373B, and a fixed multiplier 5374B.

The parameter load multiplier 5371B loads ($α^j$)$^m$ of the shortening parameter. The flip flop (FF) 5373B loads σm+1 as an initial value.

In FIG. 22, the m-order coefficient of "$α^k$" of σ'($α^k$), σm+1($α^k$)$^m$, is output in the k-th clock input cycle. The timing of the selector switching performed in accordance with code shortening, and the like are the same as in FIG. 20.

In FIG. 23, a basic unit 539 of the error value calculator 532 of the error search part 530 includes a parameter load multiplier 5391, a selector 5392, a flip flop (FF) 5393, and a fixed multiplier 5394.

The parameter load multiplier 5391 loads ($α^j$) of the inverse parameter. The flip flop (FF) 5393 loads $α^0$ as an initial value.

The division by σ'($α^k$) is performed by first obtaining σ'($α^k$), next obtaining the inverse of σ'($α^k$), σ'($α^{-k}$), and then performing the multiplication by the obtained inverse. The inverse is read from the inverse parameter table 580 in FIG. 17.

In FIG. 23, the calculation of ($α^{-k}$) is output in the k-th clock input cycle. The timing of the selector switching performed in accordance with code shortening, and the like are the same as in FIG. 20.

The initial value $α^{-j}$ of the parameter load multiplier 5391 is equal to $α^{(255-j)}$ because of the nature of the Galois Field. Thus $α^{-j}$ is obtained by reading the (255−j) th address from the shortening compensation parameter table. When j is zero, or the code is not shortened, the 255th address is read from the table 560. It is also possible to select the through side by the selector, regardless of the information byte area or the check bit area, instead of reading from the table 560.

Figure 24:
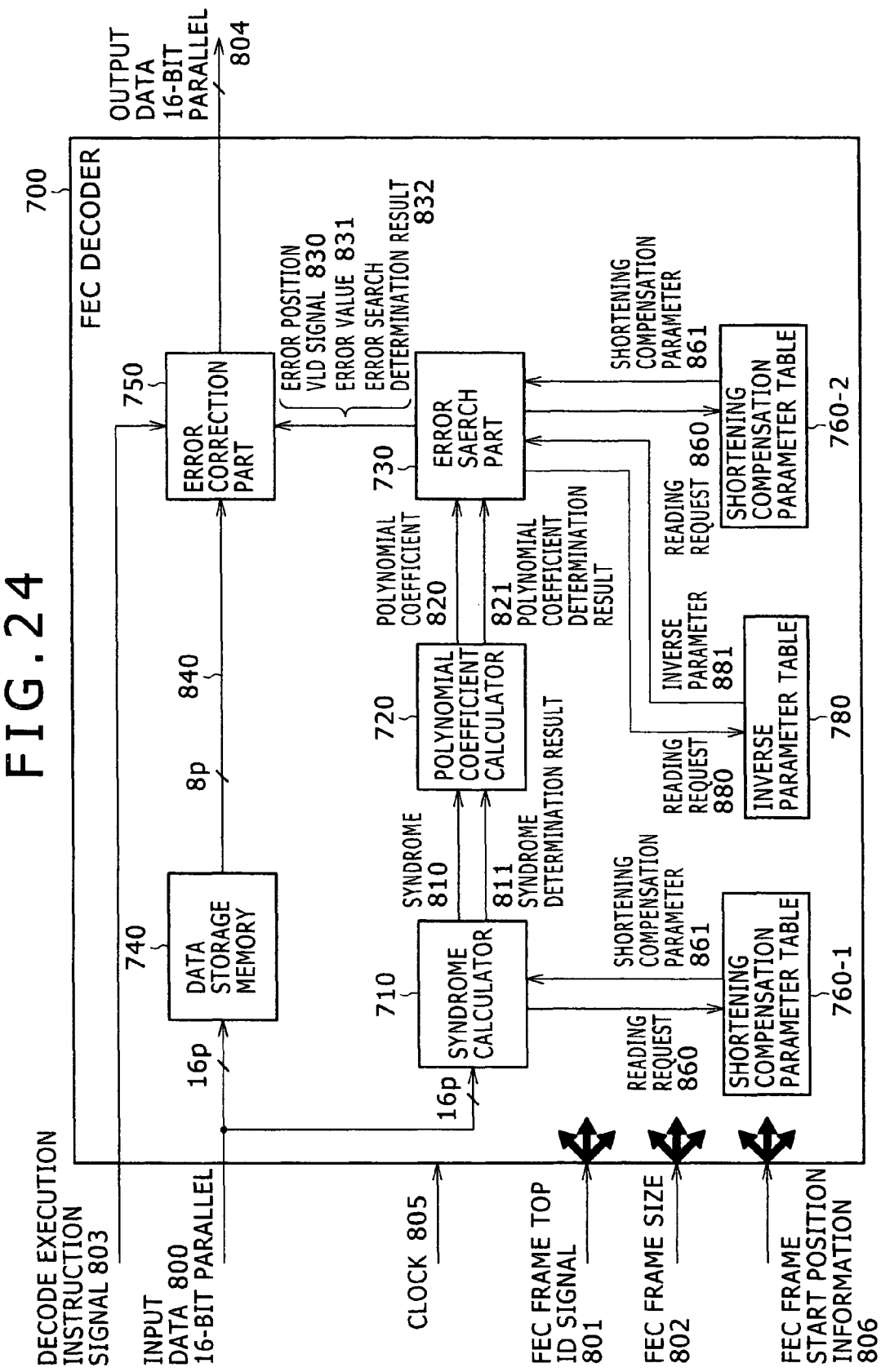
FIG. 24 is a block diagram of another FEC decoder.
Figure 25:
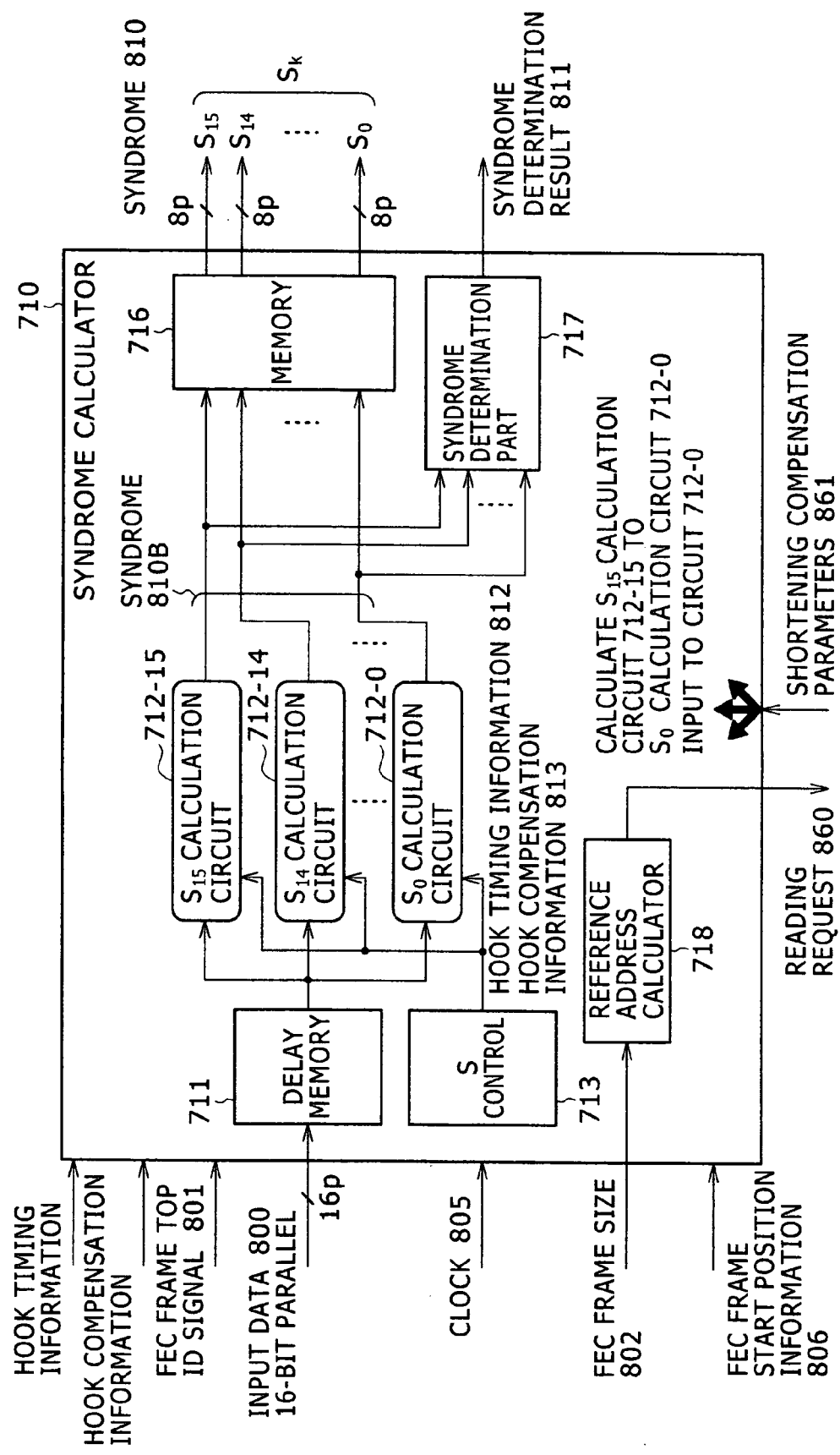
FIG. 25 is block diagram of a syndrome calculator.
Figure 26:
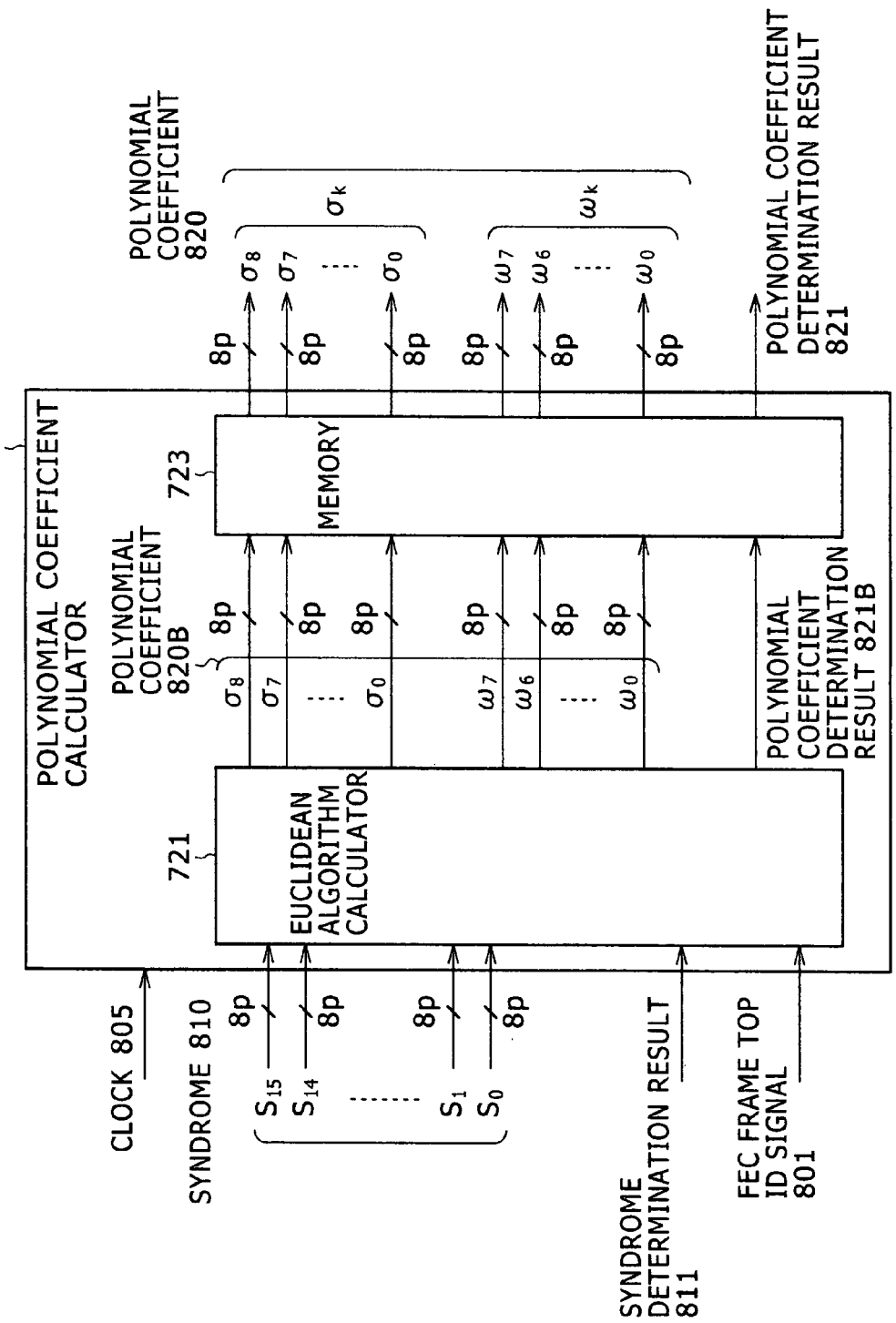
FIG. 26 is a block diagram of a polynomial coefficient calculator.
Figure 27:
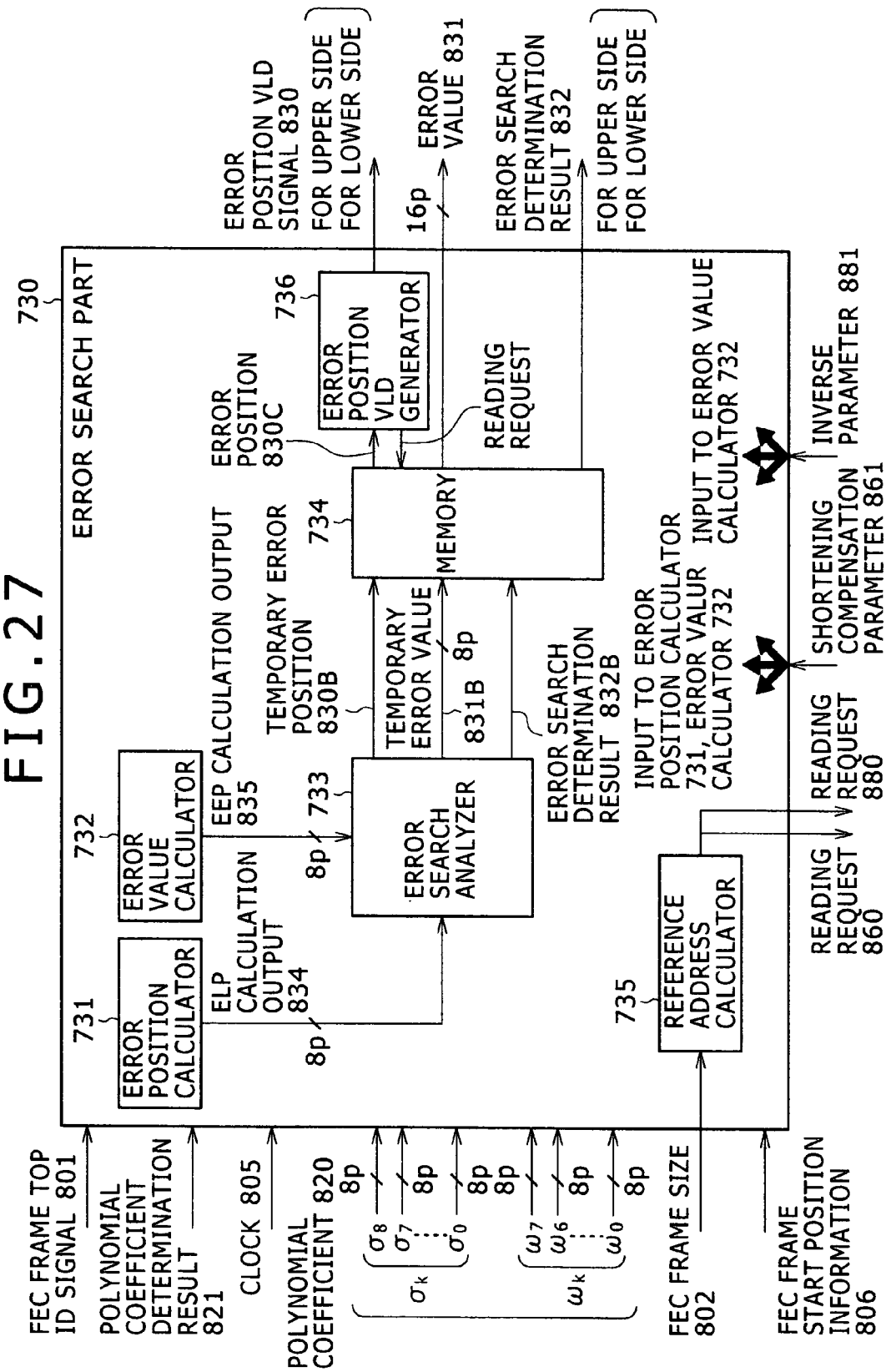
FIG. 27 is a block diagram of an error search part.
Figure 28:
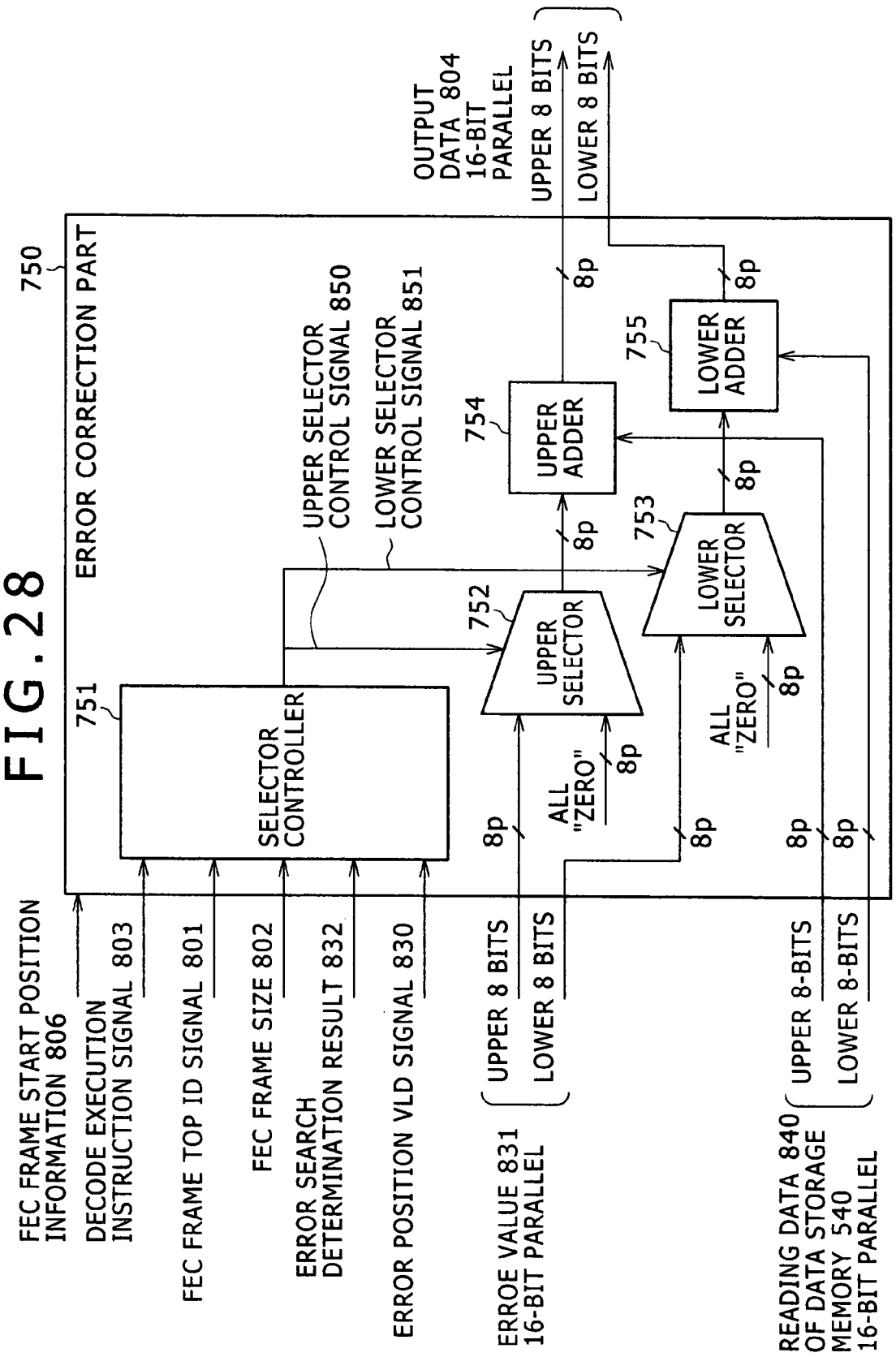
FIG. 28 is a block diagram of an error correction part.
Figure 29:
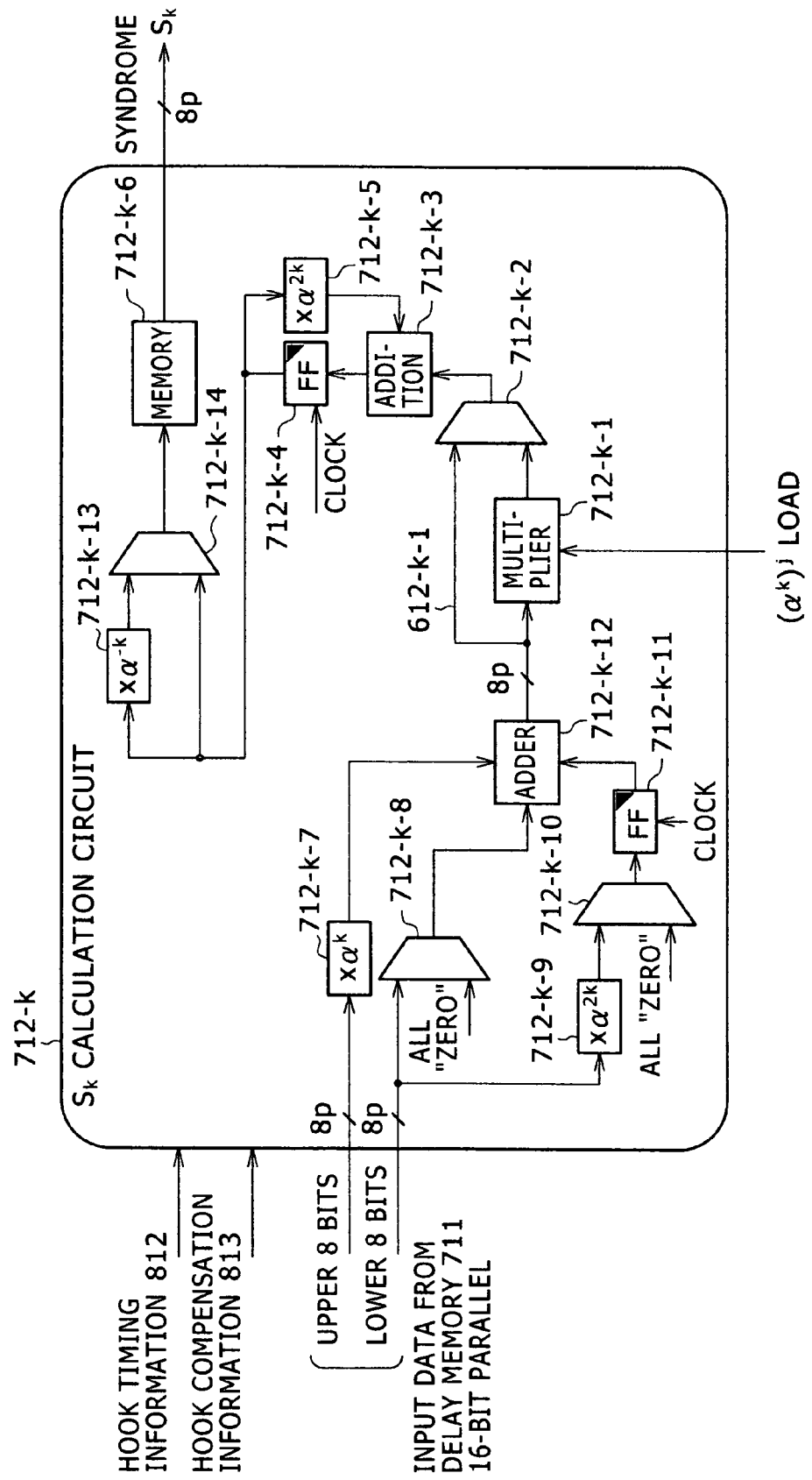
FIG. 29 is a block diagram of an Sk calculation circuit.
Figure 30:
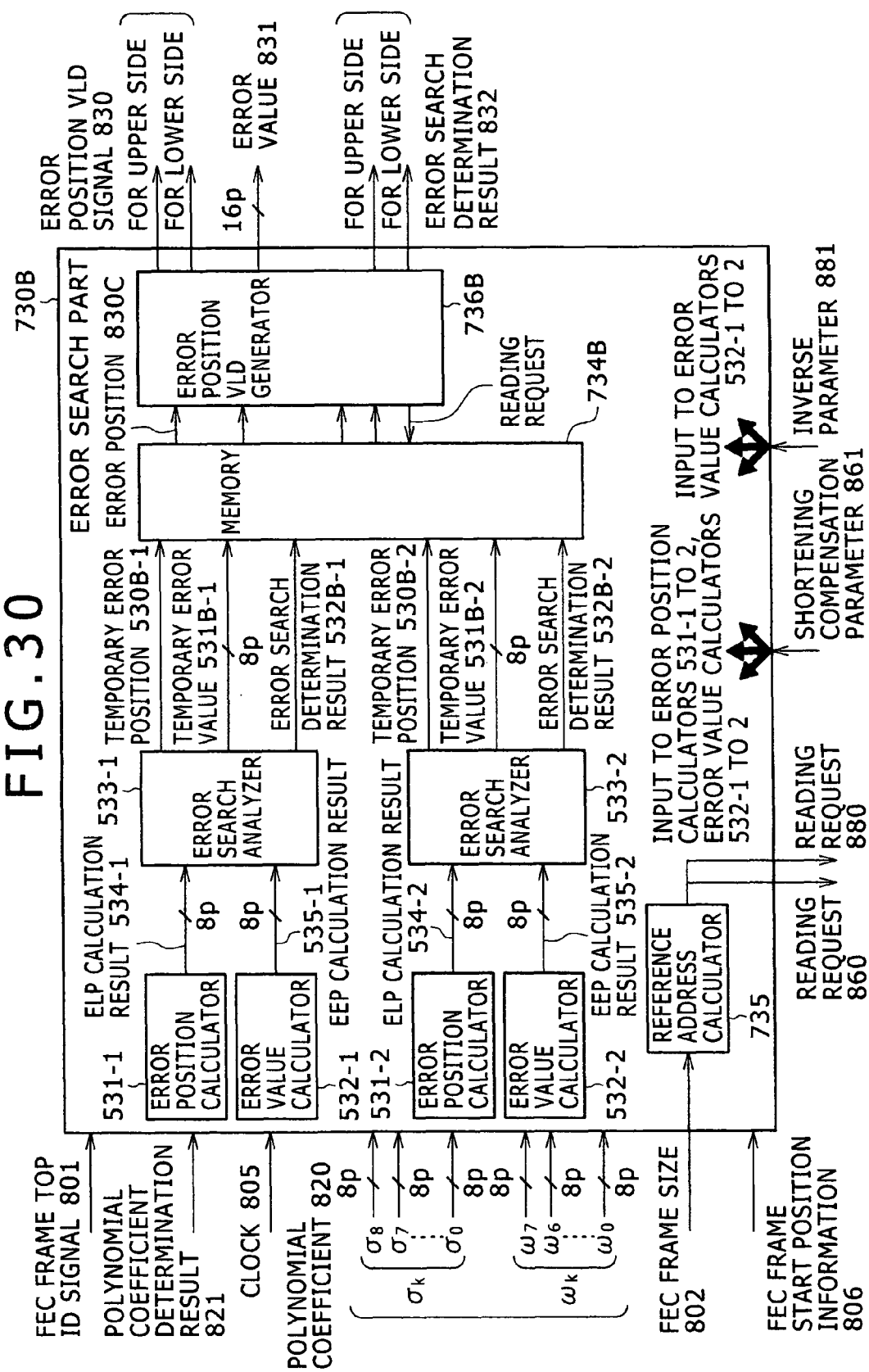
FIG. 30 is a block diagram of an error search part.
Figure 31:
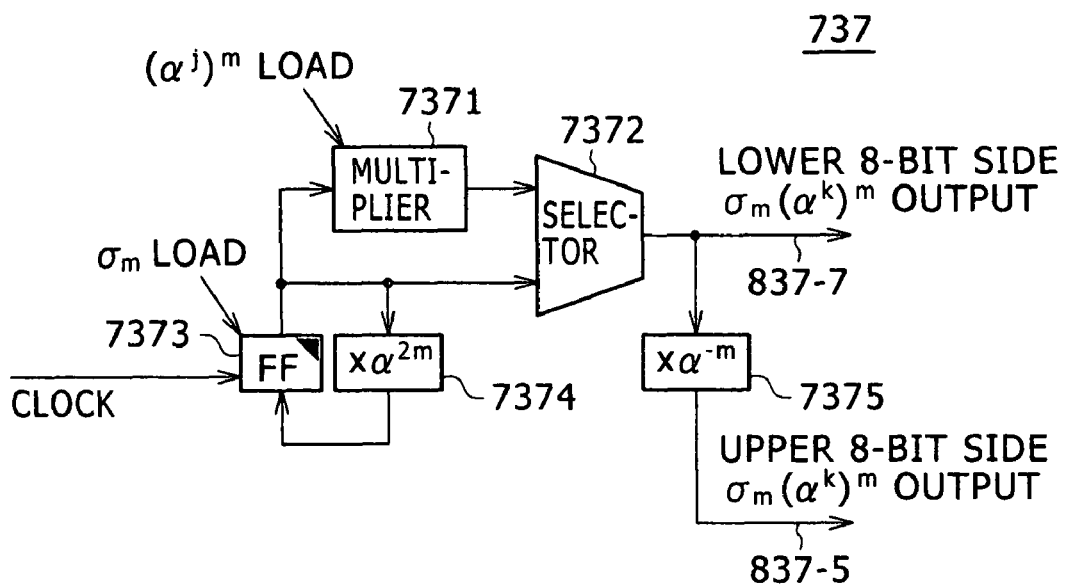
FIG. 31 is a block diagram illustrating an error position calculator (part A1)
Figure 32:
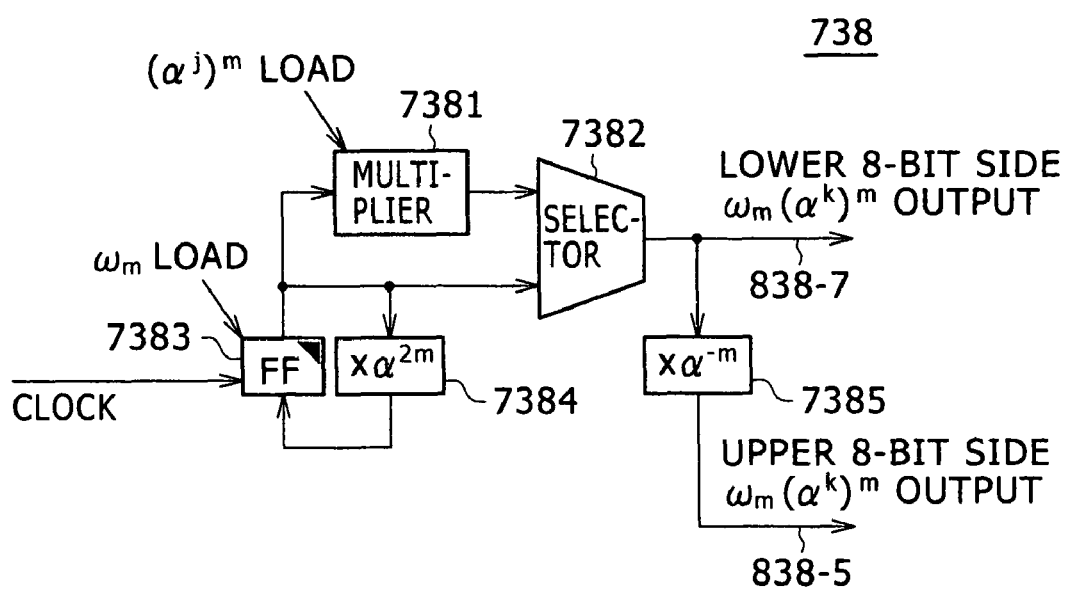
FIG. 32 is a block diagram illustrating an error value calculator (part A1)
Figure 33:
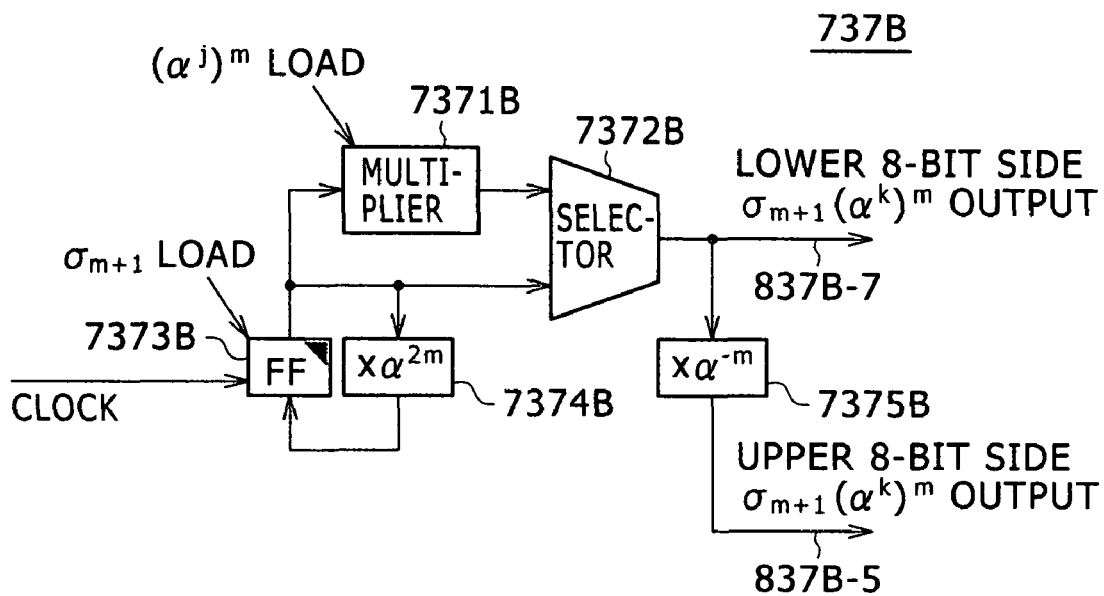
FIG. 33 is a block diagram illustrating the error value calculator (part A2)
Figure 34:
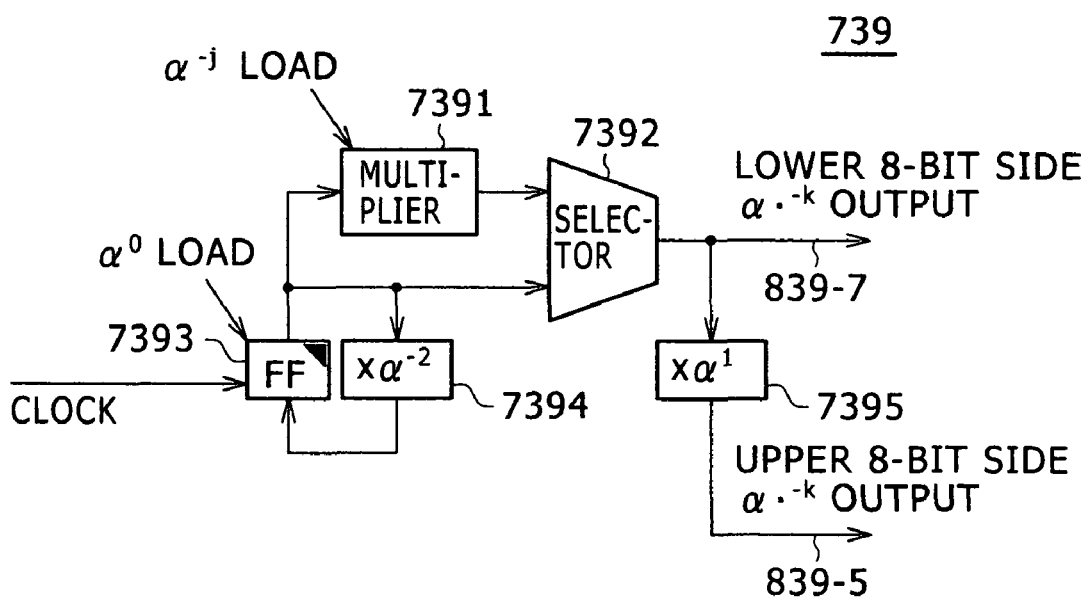
FIG. 34 is a block diagram illustrating the error value calculator (part A3)
Figure 35:
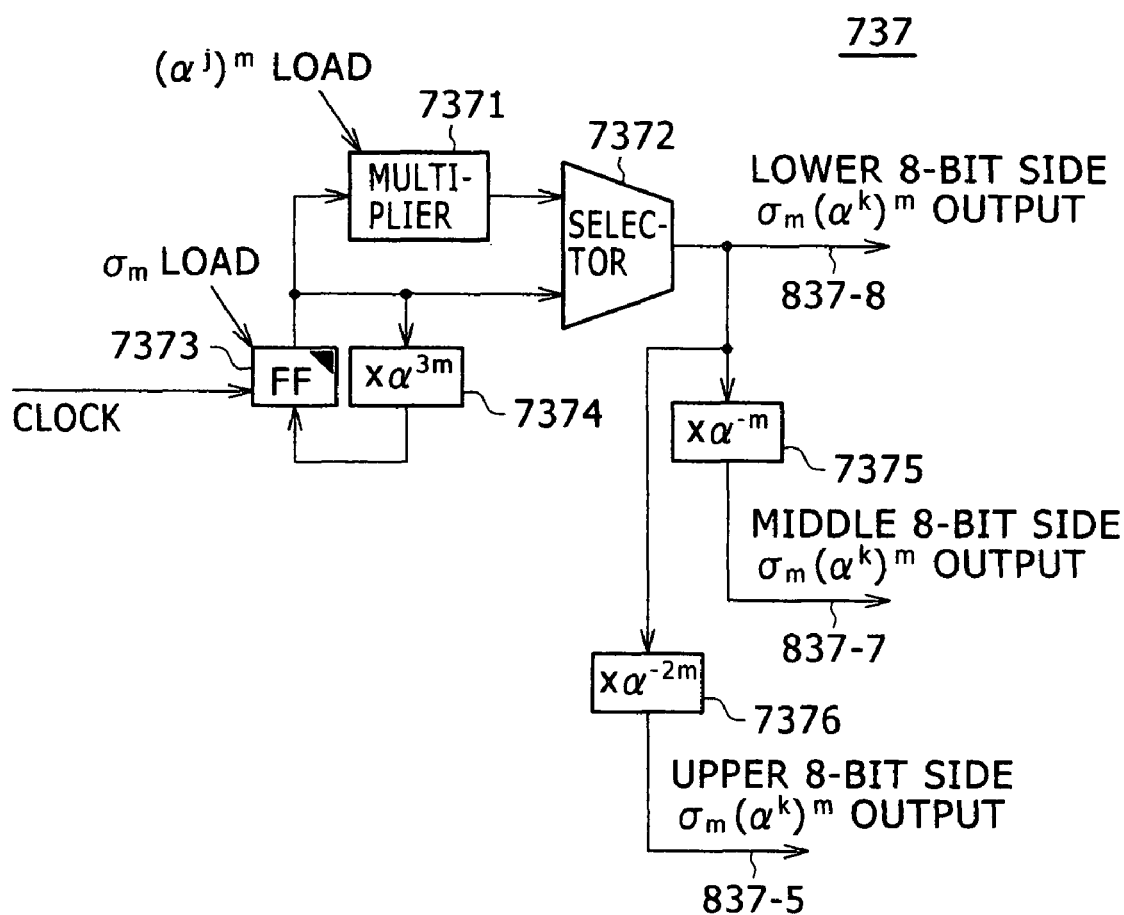
FIG. 35 is a block diagram illustrating the error position calculator (part B1)
Figure 36:
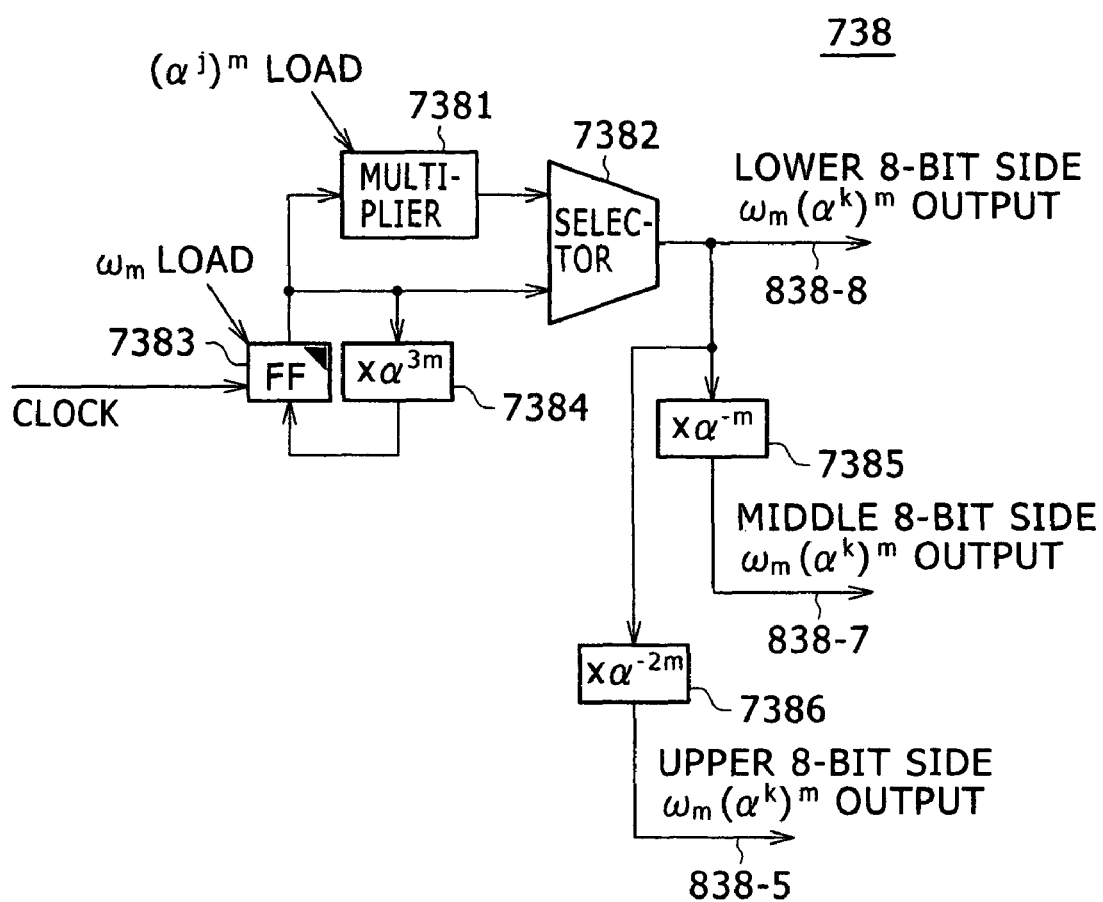
FIG. 36 is a block diagram illustrating the error value calculator (part B1)
Figure 37:
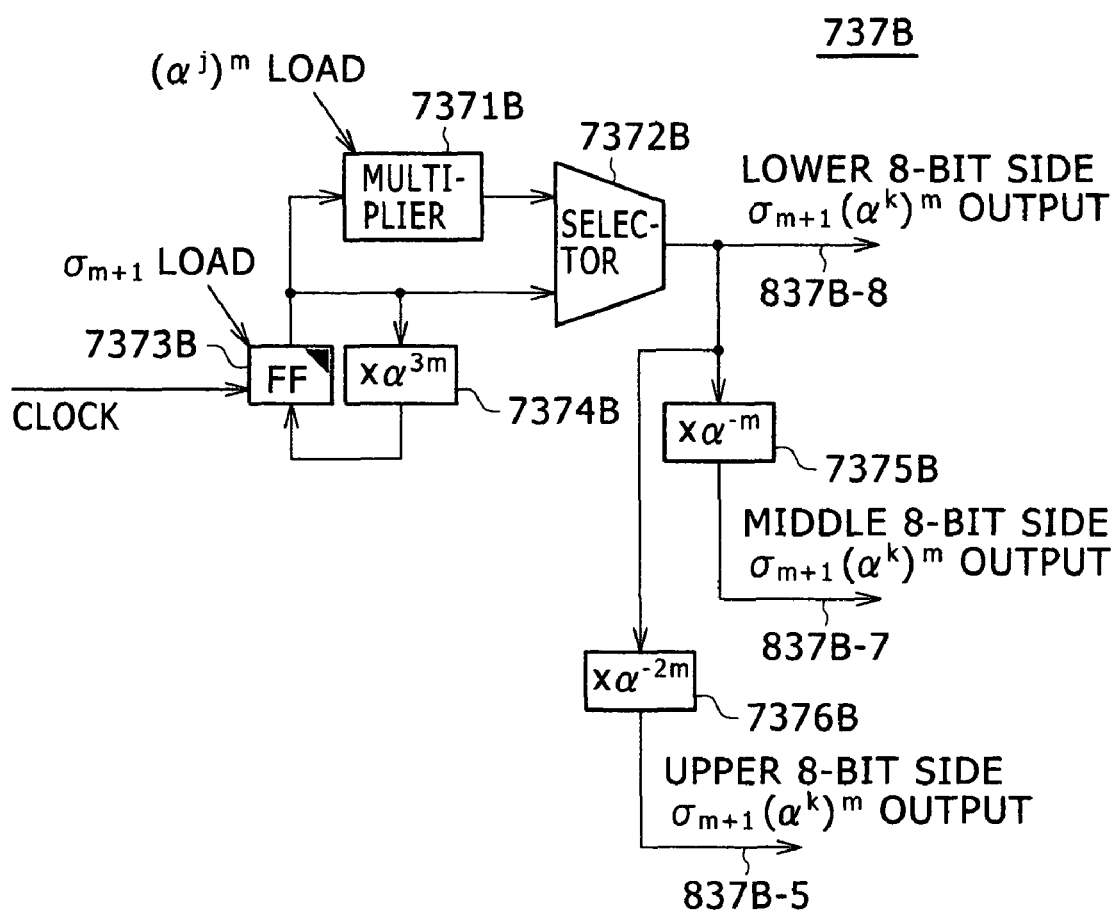
FIG. 37 is a block diagram illustrating the error value calculator (part B2)
Figure 38:
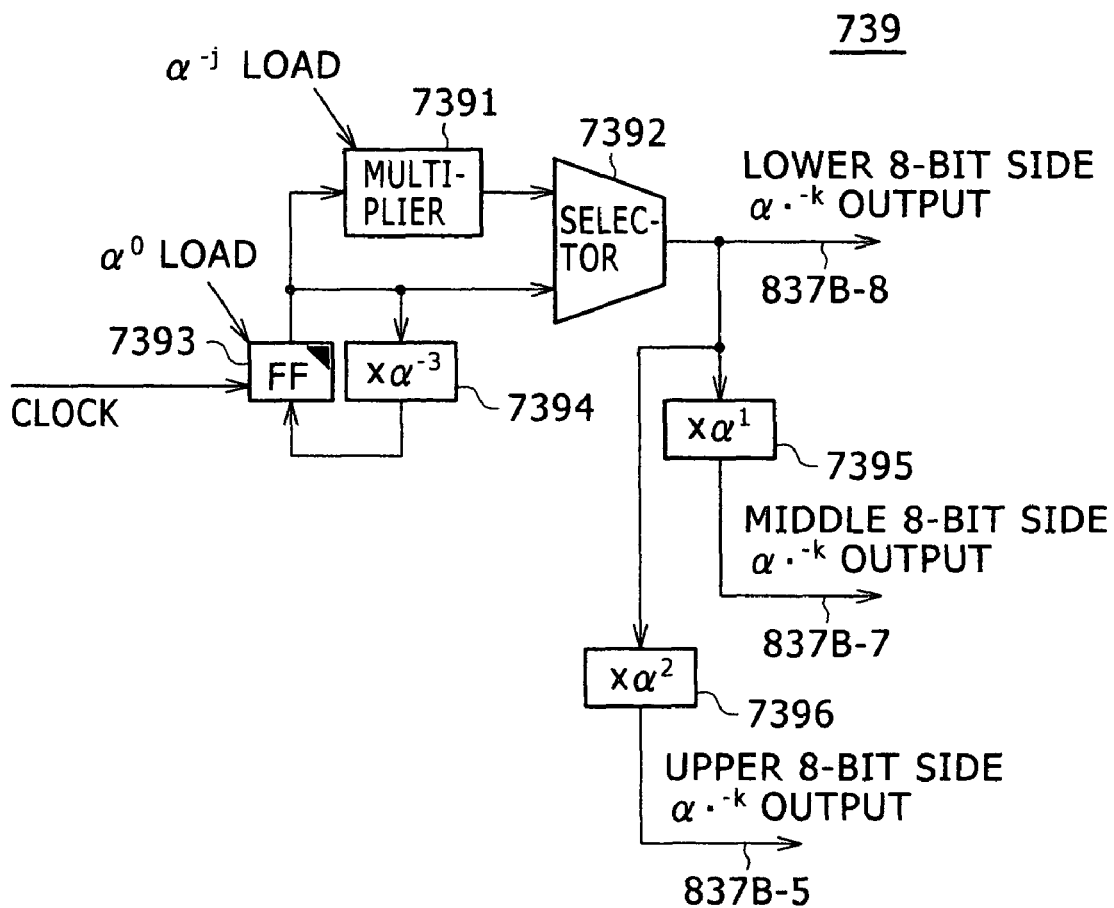
FIG. 38 is a block diagram illustrating the error value calculator (part B3).

An FEC decoder for 16-bit parallel input data will be described with referent to FIGS. 24 to 38. Here, FIG. 24 is a block diagram of an FEC decoder. FIG. 25 is a block diagram of a syndrome calculator. FIG. 26 is a block diagram of a polynomial coefficient calculator. FIG. 27 is a block diagram of an error search part. FIG. 28 is a block diagram of an error correction part. FIG. 29 is a block diagram of an Sk calculation circuit. FIG. 30 is a block diagram of another error search part. FIG. 31 is a block diagram illustrating the error position calculator (part A1). FIG. 32 is a block diagram illustrating the error value calculator (part A1). FIG. 33 is a block diagram illustrating the error value calculator (part A2). FIG. 34 is a block diagram illustrating the error value calculator (part A3). FIG. 35 is a block diagram illustrating the error position calculator (part B1). FIG. 36 is a block diagram illustrating the error value calculator (part B1). FIG. 37 is a block diagram illustrating the error value calculator (part B2). FIG. 38 is a block diagram illustrating the error value calculator (part B3).

In the following, a description overlapped with that of the FEC decoder for 8-bit parallel input will be omitted as appropriate. Further the upper byte, or upper 8 bits, means the data of 8 bits of the 16-bit parallel data, which is received earlier in the FEC frame. The lower byte, or lower 8 bits, means the data of 8 bits of the 16-bit parallel data, which is received later in the FEC frame.

In FIG. 24, an FEC decoder 700 has inputs of 16-bit parallel data 800, a decode execution instruction signal 803, an FEC frame top signal 801, an FEC frame size 802, and an FEC frame start position information 806, and then outputs an error corrected 16-bit parallel signal 804. The FEC decoder 700 includes a syndrome calculator 710, a polynomial coefficient calculator 720, an error search part 730, a data storage memory 740, an error correction part 750, a shortening compensation parameter table 760, and an inverse parameter table 780.

A clock 805, as well as the FEC frame identification signal 801, the FEC frame size 802, and the FEC frame start position information 806 are distributed to the respective parts of the FEC decoder 700. The FEC frame top identification signal 801 indicates the start timing of the FEC frame on the 16-bit parallel data stream. The FEC frame size 802 indicates the size of the shortened FEC frame when the code is shortened. The FEC frame size 802 may be the number of shortened and omitted bytes. The FEC frame start position information 806 indicates from which side of the 16-bit parallel stream, the upper 8-bit side or the lower 8-bit side, the FEC frame starts at the FEC frame start-timing indicated by the FEC frame top identification signal 801. The FEC frame start position information 806 may be information indicating the FEC frame end position.

The syndrome calculator 710 and the error search part 730 determine the parameter for the FEC frame to be calculated, by calculating the addresses of the parameter tables 760, 780 corresponding to the FEC frame size 802, and reading the contents of the addresses from the shortening compensation parameter table 760 and the inverse parameter table 780, thereby to determine the parameter for performing a calculation equivalent to code shortening. The polynomial coefficient calculator 720 performs the calculation independent of code shortening, because of its nature.

In FIG. 25, the syndrome calculator 710 includes: a delay memory 711 for receiving the 16-bit parallel data 800; 16 Sk calculation circuits 712-$k$ (where k is from 0 to 15); a memory 716 and a syndrome determination part 717 both connected to the Sk calculation circuits 712-$k$; a reference address calculator 718 for receiving the FEC frame size 802 and calculating the reference address of the shortening parameter table; and a syndrome controller (S controller) 713 for providing hook timing information 812 and hook compensation information 813 to the Sk calculation circuits 712-$k$.

The reference address calculator 718 calculates the address of the shortening compensation table 760 to be referred to from the FEC frame size 802. The reference address calculator 718 issues a reading request 860 with the reading address to the shortening compensation table 760. The reference address calculator 718 reads a shortening compensation parameter 861 from the shortening compensation parameter table 760 and inputs to the Sk calculation circuits 712-$k$. The shortening compensation parameter is used for the multiplication ("x($\alpha$^k)^j") in the Sk calculation circuits 712-$k$.

When the shortening method is middle aligned, the Sk calculation circuits 712-$k$ perform the multiplication with this parameter when the input data from the delay memory 711 is for the information area, while not performing multiplication when the input data is for the FEC check bit area. The syndrome Sk is fixed and output at the time when the last data of the FEC frame is input to the Sk calculation circuits 712-$k$. For example when the FEC frame size is 150 bytes, the Sk is fixed in the 75th or 76th clock input cycle from the top of the FEC frame. It is fixed in the 75th cycle when the FEC frame top is at the upper byte position, and in the 76th cycle when the FEC frame top is at the lower byte position.

Incidentally when the shortening method is top aligned, there is no need to perform the shortening compensation calculation, and thus the multiplication ("x($\alpha$^k)^j") is not necessary in the Sk calculation circuits 712-$k$.

The start timing of the check bit area in the FEC frame can be recognized by calculating from the FEC frame size 801 and the FEC frame top identification signal 802. As another method, the start signal of the check bit area may be obtained from the outside of the FEC decoder. At the time when the data is input and calculated to the last of the check bit area, the syndrome of the relevant FEC frame is fixed.

The memory 716 maintains the syndrome when it is fixed, and continues to output until the syndrome of the next FEC frame is fixed.

The syndrome determination part 717 determines whether obtained syndromes 810B (S15 to S0) are all "zero", and then outputs as a syndrome determination result 811. When the syndromes S15 to S0 are all "zero", the syndrome determination part 717 determines that no error is present in the relevant FEC frame, and displays "no error present" in the syndrome determination result 811. When at least one of the syndromes S15 to S0 is not "zero", the syndrome determination part 717 determines that error is present in the relevant FEC frame, and displays "error present" in the syndrome determination result 811. The syndrome determination result 811 is continuously output synchronously with the output timing of the syndrome 615, until the syndrome of the next FEC frame is fixed.

In the latter stage, the polynomial coefficient calculator 720 is operated based on the syndrome determination result 811.

The S controller 713 generates hook compensation information 813 indicating whether the last byte of the FEC frame ends in the upper 8 bits or the lower 8 bits. Then the S controller 713 distributes the information to the 16 Sk calculation circuits 712-$k$ before the start of the syndrome calculation for the relevant FEC frame. Further the S controller 713 generates hook timing information 812 indicating that the input data 800 has a hook shape, at a timing of the hook in which the last byte of the previous FEC frame and the first byte of the relevant FEC frame are both present, and distributes the information to the Sk calculation circuits 712-$k$. Incidentally, the hook compensation information 813 can be calculated in advance from the hook compensation information 813 for the previous FEC frame and from the relevant FEC frame size 802. The hook timing information 812 can be calculated from the top identification signal 801 and the FEC frame start position information 806. It is also possible to calculate from the hook compensation information 813 for the previous FEC frame and from the top identification signal 801 of the relevant FEC frame.

In FIG. 26, the polynomial coefficient calculator 720 has inputs of the syndrome 810, syndrome determination result 811, clock 805, and FEC frame top identification signal 801. Then the polynomial coefficient calculator 720 outputs a polynomial coefficient 820 with 9 signals σk (where k is from 0 to 8) each of which is 8-bit parallel and 8 signals ωk (where k is from 0 to 7) each of which is 8-bit parallel, as well as the polynomial determination result 821. The polynomial coefficient calculator 720 includes a Euclidean algorithm calculator 721 and a memory 723. The Euclidean algorithm calculator 721 calculates a polynomial coefficient 820B with 8-bit parallel signals σk (where k is from 0 to 8) and ωk (where k is from 0 to 7), as well as a polynomial coefficient determination result 821B. The Euclidean algorithm calculator 721 outputs them to the memory 723.

The memory 723 maintains the polynomial coefficient 820B and the polynomial coefficient determination result 821B each time the polynomial coefficient calculation is completed, and continues to output as the polynomial coefficient 821 and the polynomial coefficient determination result 821 until the polynomial coefficient calculation for the next FEC frame is completed. The polynomial coefficient determination result 821 is output synchronously with the output timing of the polynomial coefficient 820.

The fixed or maximum delay time generated in the polynomial coefficient calculator 720 is defined as BB clock cycle, and the time for receiving one byte in the FEC frame is defined as one clock cycle. With respect to the FEC frame that the 16-bit parallel decoder can receive, the number of clock cycles corresponding to the minimum size of the FEC frame is one half (denoted by EE) when the clock cycle is not changed. While the polynomial coefficient calculation needs the clock cycle of BB, so that the polynomial coefficient calculation is not completed in time when EE is smaller than the BB.

Thus when EE is smaller than BB, plural polynomial coefficient calculators 520 are provided and switched for each FEC frame, or the clock cycle is accelerated. When BB is 60 and EE is 9, 7 polynomial coefficient calculators 720 are provided, or the clock cycle to be input to the polynomial coefficient calculator is reduced to one seventh or less of the original clock cycle, namely, the clock frequency is increased by a factor of seven or more.

In FIG. 27, the error search part 730 has inputs of the polynomial coefficient 820, polynomial coefficient determination result 821, frame top identification signal 801, FEC frame size 802, clock 805, and FEC frame start position information 806. Then the error search part 730 outputs an error position VLD signal 830, an error value 831, and an error search determination result 832. Here, the error position VLD signal 830 and the error search determination result 832 each include the upper and lower 8-bit parallel data. The error value 831 is 16-bit parallel data.

The error search part 730 includes: an error position calculator 731; an error value calculator 732; an error search analyzer 733 to which an ELP calculation output 834 is input from the error position calculator 731 and an EEP calculation output 835 is input from the error value calculator 732; a memory 734 for maintaining the output of the error search analyzer 733; an error position VLD generator 736; and a reference address calculator 735.

The configuration of a first method of the error search part 730 is basically the same as the error search part 530 for 8 bits. However, the error search part 730 is operated with the clock frequency more than doubled. It is to be noted that the error value 831 is output with 16 bits, the error position VLD signal 830 is output in two independent branches of upper and lower 8 bits, and the error search determination result 832 is also output in two independent branches of upper and lower 8 bits.

When the received polynomial coefficient determination result 821 indicates "no error present", the error position calculator 731 and the error value calculator 732 are stopped operating, and the error search analyzer 733 displays "no error present" in the error search determination result 832B. When the polynomial coefficient determination result 821 indicates "error correction not possible", the error position calculator 731 and the error value calculator 732 are stopped operating, and the error search analyzer 733 displays "error correction not possible" in the error search determination result 832B.

When the polynomial coefficient determination result 821 indicates "error correction possible", the error search part 730 operates the error position calculator 731 and the error value calculator 732. The error position calculator 731 loads σk of the polynomial coefficient 820, and the shortening compensation parameter 861 as initial parameters to start calculation.

The error value calculator 732 loads σk and ωk of the polynomial coefficient 820, and the shortening compensation parameter 861 as initial parameters to start calculation.

The error position calculator 731 obtains the position at which the error is present and the error value calculator 732 obtains its error value, respectively using the Chien search method or other method.

The reference address calculator 735 calculates the addresses of the tables 760-2 and 780 to be referred to from the FEC frame size 802. The reference address calculator 735 transmits the reading requests 860, 880 with the read addresses to the tables 760-2 and 780, respectively. The error search part 730 inputs the read shortening compensation parameter 861 to the error position calculator 731 and the error value calculator 732. The error search part 730 inputs the read inverse parameter 881 to the error position calculator 731. These parameters are used for the carry calculation (multiplication "x(α^j)^m", multiplication "x(α^-j)") and the division by the first derivation of σ(z) in the error position calculation 731 and error value calculator 732.

The error search analyzer 733 monitors whether the ELP calculation output 834 is "zero". When the output is "zero", the error search analyzer 733 outputs a temporary error position 830B corresponding to this timing, and a value of the EEP calculation output 835 at this time as a temporary error value 831B, to the memory 734. The memory 734 stores the temporary error position 830B and the temporary error value 831B.

When the error position calculation and error value calculation for an FEC frame are completed with no conflict arising in the error search analyzer 733, the error search part 730 displays "error correction possible" in the error search determination result 832B. The error search part 730 outputs all the stored temporary error positions 830B and temporary error values 831B as they are as the error position 830 and the error value 831, from the memory 734. Further the error search part 730 outputs the error search determination result 832B' as it is as the error search determination result 832. The temporary error position 830B and the temporary error value 831B, which correspond to each other on a one-to-one basis, are written to the same address in order to easily detect the correspondence upon reading the data.

With conflict arising in the error search analyzer 733, the error search part 730 displays "error correction not possible" in the error search determination result 832B. The error search part 730 clears all the stored temporary error positions 830B and temporary error values 831B from the memory 734. The error search part 730 outputs the error search determination result 832B as it is as the error search determination result 832.

Here, conflict means a case in which the number of errors implicitly indicated by the polynomial coefficient 820 and the total number of the temporary error positions 830B are not identical to each other. The former is equal to the order of the error position polynomial, and the latter is the number of times the search result of the error position polynomial σ(z) is zero. Further when the denominator (σ'(z)) is zero in the process of deriving the temporary error value 831B, which is also a case equivalent to the conflict.

The memory 734 maintains one or more pairs of the temporary error position 830B and the temporary value 831B until the error search calculation is completed. Further the memory 734 maintains the error search determination result 832B each time the error search calculation is completed, and continues to output until the error search calculation for the next FEC frame is completed.

The error position VLD generator 736 once maintains all the error positions 830C in the relevant FEC frame, which are stored in the memory 734. Then the error position VLD generator 736 generates and outputs the error position VLD signal 830 in accordance with the timing when the data corresponding to the error position 830C in the FEC frame is error corrected by the error correction part 750 and is output therefrom. Further the error position VLD generator 736 reads the corresponding error value from the memory 734 and outputs as the error value 831 in accordance with the timing of generating the error position VLD signal 830.

The error position VLD generator 736 outputs the error position VLD signal 830 and the error value 831 at a timing of every 2 bytes, error corrected by the error position VLD correction part 750. The error position VLD signal 830 indicates the VLD signal independently for the upper and lower 8 bits. The error value 831 indicates the error value independently for the upper 8 bits and lower 8 bits. The error search determination result 832 indicates the determination result independently for the upper and lower 8 bits. Incidentally with respect to the error position VLD signal 830 and the error search determination result 832, the signal may be common to the upper and lower sides with the assumption that no hook is generated.

The upper 8 bits of the error position VLD signal 830, error value 831, and error search determination result 832 respectively correspond to each other. Also the lower 8 bits thereof respectively correspond to each other.

The error position calculator 731 and the error value calculator 732 recognize the calculation request of the FEC frame by the FEC frame top identification signal 801. When the processing time needed for the Chien search calculation is long compared to the reception time corresponding to the minimum size of the FEC frame that can be received, plural the error position calculators 731 and the error value calculators 732 (e.g., two, four) are provided to calculate the error position and the error value, by switching them sequentially for each received FEC frame.

In FIG. 28, the error correction part 750 has inputs of the FEC frame start position information 806, FEC frame top signal 801, FEC frame size 802, decode execution instruction signal 803, error search determination result 832, error position VLD signal 830, error value 831, and reading data 840 of the data storage memory 740 of the FEC decoder 700. Then the error correction part 750 outputs the 16-bit parallel output data 804. The error correction part 750 includes: a selector controller 751 having inputs of the FEC frame top signal 801, FEC frame size 802, decode execution instruction signal 803, error search determination result 832, and error position VLD signal 830 to control an upper selector 752 and a lower selector 753; the upper selector 752 having inputs of the upper 8 bits of the error value 831, and the 8-bit parallel all zero signal generated within the error correction part 700; an upper adder 754 for adding the output of the upper selector 752, and the upper 8 bits of the reading data 840 of the data storage memory 740; the lower selector 753 having inputs of the lower 8 bits of the error value 831, and the 8-bit parallel all zero signal generated within the error correction part 700; and a lower adder 755 for adding the output of the lower selector 753, and the lower 8 bits of the reading data 840 of the data storage memory 740.

The upper selector 752 and the lower selector 753 select the error value 831 side, at a timing when the decode execution instruction signal 803 indicates "decode execution", the error search determination result 832 indicates "error correction possible", and the error position VLD signal 830 indicates that the position is the error position. Otherwise the upper selector 752 and the lower selector 753 typically select the all "zero" side. The upper selector 752 and the lower selector 753 provide control independently of each other.

The adders 754, 755 output an exclusive logical sum for each bit. The error search determination result 832 displays the determination result independently for each of the upper and lower 8 bits. The error position VLD signal 830 also indicates VLD independently for each of the upper 8 bits and lower 8 bits.

In the above described embodiment of the 16-bit decoder, the shortening compensation parameter table 760 is the same as the shortening compensation parameter table 560 of the 8-bit decoder, and its illustration and description are omitted. Similarly the inverse parameter table 780 is the same as the inverse parameter table 580 of the 8-bit decoder, and its illustration and description are omitted.

Further the operation timing of the 16-bit decoder is the same as in FIG. 18 except for the reference numerals, and its illustration and description are omitted.

However the throughput of the FEC decoder 700 is two times larger than that of the FEC decoder 500. Thus the delay time Tdelay-DEC is about one half of that of the FEC decoder 500.

In FIG. 29, the Sk calculation circuit 712-$k$ has inputs of the clock 805, 16-bit parallel input data from the delay memory 711, $(\alpha^k)^j$ from the shortening compensation parameter table, hook timing information 812, and hook compensation information 813. Then the Sk calculation circuit 712-$k$ outputs the 8-bit parallel syndrome 810B. The Sk calculation circuit 712-$k$ includes: a parameter variable multiplier 712-$k$-1; selectors 712-$k$-2, 8, 10, 14; adders 712-$k$-3, 12; flip flops 712-$k$-4, 11; fixed multipliers 712-$k$-5, 7, 9, 10, 13; and a memory 712-$k$-6.

The upper 8 bits of the input data from the delay memory 711 are input to the adder 712-$k$-12 through the multiplication $(x\alpha^k)$ by the fixed multiplier 712-$k$-7.

The lower 8 bits of the input data from the delay memory 711 are input to the selector 712-$k$-10 through the multiplication $(x\alpha^{(2k)})$ by the fixed multiplier 712-$k$-9. The selector 712-$k$-10 has the all zero input as the other input, and then inputs one of the two inputs to the flip flop 712-$k$-11. The flip flop 712-$k$-11 has a clock input, and inputs the input data to the adder 712-$k$-12 at the next clock.

The lower 8 bits of the input data from the delay memory 711 is also input to the selector 712-$k$-8. The selector 712-$k$-8 has the all zero input as the other input, and then inputs one of the two inputs to the adder 712-$k$-12.

The adder 712-$k$-12 inputs the exclusive logical sum of the three inputs to the parameter variable multiplier 712-$k$-1 and the selector 712-$k$-2.

The parameter variable multiplier 712-$k$-1 loads the parameter $(\alpha^k)^j$ from the shortening compensation parameter table and sets the operation parameter in advance. Then the parameter variable multiplier 712-$k$-1 inputs the 8-bit parallel input data from the adder 712-$k$-12, and outputs the multiplication result to the selector 712-$k$-2. The selector 712-$k$-2 has inputs of the multiplication result from the parameter variable multiplier 712-$k$-1, and the 8-bit parallel input data from the adder 712-$k$-12, and then outputs a selected one of the inputs to the adder 712-$k$-3. The adder 712-$k$-3 has inputs of the output of the selector 712-$k$-2, and the output of the fixed multiplier 712-$k$-5, and then outputs to the flip flop 712-$k$-4. The flip flop 712-$k$-4 has a clock input, maintains the input data for one clock, and then outputs to the selector 712-$k$-14 and to the fixed multipliers 712-$k$-5, 13.

The selector 712-$k$-14 has inputs of the output of the flip flop 712-$k$-4, and the output of the fixed multiplier 12-$k$-13, and then outputs a selected one of the inputs to the memory 712-$k$-6.

In FIG. 29, although the input data is 16-bit parallel, the signal lines within the circuit are all 8-bit parallel, namely, each signal line has 8 sequences.

The selector 712-$k$-8 selects and outputs the all zero input side and outputs at the hook timing (when the hook timing information 812 indicates the hook timing). The selector 712-$k$-8 selects the data input side and outputs at the timing other than the hook timing. Switching of the selector 712-$k$-8 is performed for each piece of 16-bit input data from the delay memory 711.

The selector 712-$k$-10 selects the multiplier 712-$k$-9 side and outputs at the hook timing. The selector 712-$k$-10 selects the all zero input side and outputs at the timing other than the hook timing. Switching of the selector 712-$k$-10 is performed for each piece of 16-bit input data from the delay memory 711.

The selector 712-$k$-14 selects the multiplier 712-$k$-13 side and outputs when the hook compensation information 813 indicates that the FEC frame to be calculated ends in the upper 8 bits. The selector 712-$k$-14 selects the through side and outputs to calculate the FEC frame ending in the lower 8 bits. Switching of the selector 712-$k$-14 is performed for each FEC frame, immediately before the start of the calculation. In the case of the hook, the switching of the selector 712-$k$-14 is performed immediately before the next timing (the timing of the second and third bytes of the FEC code). The switching control of the selector 712-$k$-14 is the same as the selector 512-$k$-2 in FIG. 19.

The fixed multiplier "$x\alpha^{(2k)}$" 712-$k$-5 multiplies a primitive element of the Galois Field, $\alpha^{(2k)}$, and the output of the flip flop 712-$k$-4. The fixed multiplier "$x\alpha^k$" 712-$k$-7 multiplies a primitive element of the Galois Field, $\alpha^k$, and the upper 8 bit input data. The multiplier "$x\alpha^{(2k)}$" 712-$k$-9 multiplies the primitive element of the Galois Field, $\alpha^{(2k)}$, and the lower 8 bit input data. The multiplier "$x\alpha^{(-k)}$" 712-$k$-13 multiplies a primitive element of the Galois Field, $\alpha^{(-k)}$, and the output of the flip flop 712-$k$-4.

The flip flop 712-$k$-11 maintains the input data at a timing of the clock cycle (the rising edge or trailing edge of the clock), and outputs to the adder 712-$k$-12.

The adder **712-*k*-12** adds the three inputs and then outputs the addition result. The adder calculates an exclusive logical sum for each bit.

The all zero input to the selectors **712-*k*-10, 14, is a signal of logical value zero. Selecting this all zero by the selectors is equivalent to that there is no input to the adder 712-*k*-12**.

Referring to FIG. 30, a description will be made on another configuration of the error search part described with reference to FIG. 27. Here FIG. 30 illustrates a second method of error search.

In FIG. 30, an error search part 730B has inputs of the polynomial coefficient 820, polynomial coefficient determination result 821, frame top identification signal 801, FEC frame size 802, clock 805, and FEC frame start position information 806. Then the error search part 730B outputs the error position VLD signal 830, error value 831, and error search determination result 832. Here the error position VLD signal 830 and the error search determination result 832 each include 8-bit parallel upper and lower data. The error value 831 is 16-bit parallel data.

The error search part 730B includes: error position calculators 531-1, 2; error value calculators 532-1, 2; error search analyzers 533-1, 2 to which ELP calculation outputs 534 are input from the error position calculators 531 and EEP calculation outputs 535 are input from the error value calculators 532; a memory 734B for maintaining the outputs of the error search analyzers 533; an error position VLD (Valid) generator 736B; and a reference address calculator 753.

In FIG. 30, the error search part 730B includes two sets of the error position calculator 531 for 8 bits, error value calculator 532, and error search analyzer 533, which have been described in FIG. 14. Incidentally the clock synchronization can be the same as that in the error position calculator 531 for 8 bits. The error search part 730B performs calculation by determining which one of the sets is used for each FEC frame. At this time, the set completing the calculation is used, or the two sets are alternately used. The error search part 730B inputs FEC frame parameters 861, 881 to the selected error position calculator 531 and error value calculator 532.

The memory 734B maintains one or more pairs of a temporary error position 530B-1 and a temporary error value 531B-1 and one or more pairs of a temporary error position 530B-2 and a temporary error value 531B-2, until the error search calculation is completed. Further the memory 734B maintains the error search determination results 532B-1, 2 each time the error search calculation is completed.

The error position VLD generator 736B once maintains all the error positions 830C in the relevant FEC frame, which are stored in the memory 734B. Then the error position VLD generator 736B generates and outputs the error position VLD signal 830 independently for the upper 8 bits and lower 8 bits, in accordance with the timing when the data-corresponding to the error position 830C in the FEC frame is error corrected by the error correction part 750 and is output therefrom.

The error position VLD generator 736B reads a corresponding error value 831C from the memory 734 in accordance with the timing of generating the error position VLD signal 830, and outputs as the error value 831. In other words, the error position VLD generator 736B outputs the error position VLD signal 830 and the error value 831 at a timing of every 2 bytes error corrected by the error correction part 750.

Further during correction of an FEC frame in the error correction part 750, the error position VLD generator 736B reads the error search determination result for the relevant FEC frame from the memory 734B, and continues to output as the error search determination result 832. Thus in the error search determination result 832, the values of the upper and lower sides are identical at the timing other than the generation timing of the hook at the FEC frame boundary. The values can be different only at the generation timing of the hook. When it is assumed that no hook is generated, the error search determination result 832 may be common to the upper and lower sides, which is not needed to be output separately for the upper and lower sides.

Referring to FIGS. 31 to 34, a description will be made of a method of processing the data position for 2 bytes at one clock cycle (third method).

In FIG. 31, a basic unit 737 of the error position calculator 731 includes: a parameter load multiplier 7371 for loading $(\alpha\hat{~}j)\hat{~}m$ as an initial value; a flip flop 7373 for loading am as an initial value; fixed multipliers 7374, 7375; and a selector 7372 with two inputs one output. The multiplication value of the fixed multiplier 7374 is $x\alpha\hat{~}2m$, the multiplication value of the fixed multiplier 7375 is $x\alpha\hat{~}-m$. The flip flop 7373 loads the input value at the next clock, and outputs to one of the inputs of the parameter load multiplier 7371, one of the inputs of the selector 7372, and to the fixed multiplier 7374. The fixed multiplier 7374 outputs the fixed multiplication result to the flip flop 7373.

The parameter load multiplier 7371 performs multiplication based on the loaded parameter, and outputs to another input of the selector 7372. The selector 7372 selects one of the two inputs, and outputs as the lower 8 bits of the basic unit 737. The output of the selector 7372 is also input to the fixed multiplier 7375. Then the fixed multiplier 7375 outputs the multiplication result as the upper 8 bits of the basic unit 737.

The error position calculator 731 includes 8 sets ($1 \leq m \leq 8$) of the basic unit 737. The calculation of $\sigma(\alpha\hat{~}k)$ is performed by calculating the sum of the output for the 8 sets and $\sigma 0$. More specifically, the calculation of the upper byte $\sigma(\alpha\hat{~}k)$ is performed by calculating the sum of the upper 8 bits for the 8 sets (m1 to m8) and $\sigma 0$. Similarly the calculation of the lower byte $\sigma(\alpha\hat{~}k)$ is performed by calculating the sum of the lower 8 bits for the 8 sets (m1 to m8) and $\sigma 0$.

Incidentally $\omega(\alpha\hat{~}k)$, $\sigma'(\alpha\hat{~}k)$ in the calculation of ek are calculated in the same way as described above.

In FIG. 32, a basic unit 738 of the error value calculator 732 includes: a parameter load multiplier 7381 for loading $(a\hat{~}j)\hat{~}m$ as an initial value; a flip flop 7383 for loading $\omega m$ as an initial value; fixed multipliers 7384, 7385; and a selector 7382 with two inputs one output. The multiplication value of the fixed multiplier 7384 is $xa\hat{~}2m$, and the multiplication value of the fixed multiplier 7385 is $xa\hat{~}-m$. Incidentally the operation of the basic unit 738 is the same as in FIG. 31, and its description is omitted.

The calculation of $\omega(\alpha\hat{~}k)$ is performed by providing 7 sets ($1 \leq m \leq 7$) of the circuit shown in FIG. 32, and by calculating the sum of the output for the 7 sets and $\omega 0$. Similarly to the case of $\sigma(\alpha\hat{~}k)$, the upper byte and the lower byte are calculated independently.

In FIG. 33, a basic unit 737B of the error value calculator 732 includes: a parameter load multiplier 7371B for loading $(\alpha\hat{~}j)\hat{~}m$ as an initial value; a flip flop 7373B for loading $\sigma m+1$ as an initial value; fixed multipliers 7374B, 7375B; and a selector 7372B with two inputs one output. The multiplication value of the fixed multiplier 7374B is $x\alpha\hat{~}2m$, and the multiplication value of the fixed multiplier 7375B is $x\alpha\hat{~}-m$. Incidentally the operation of the basic unit 738B is the same as in FIG. 31, and its description is omitted.

The calculation of $\sigma'(\alpha\hat{~}k)$ is performed by providing 3 sets ($1 \leq m \leq 3$) of the circuit shown in FIG. 33, and by calculating the sum of the output for the 3 sets and $\sigma 1$. Similarly to the case of $\sigma'(\alpha\hat{~}k)$, the upper byte and the lower byte are calculated independently.

In the basic units 737, 738, 737B shown in FIGS. 31 to 33, immediately after the first clock input, the upper byte side outputs the calculation result corresponding to the first byte of the FEC frame and the lower byte side outputs the calculation result corresponding to the second byte of the FEC frame. Immediately after the second clock input, the upper byte side outputs the calculation result corresponding to the third byte of the FEC frame and the lower byte side outputs the calculation result corresponding to the fourth byte of the FEC frame. Subsequent outputs are provided in the same manner as described above.

In FIG. 34, a basic unit 739 of the error value calculation part 732 includes: a parameter load multiplier 7391 for loading $\alpha^{-j}$ as an initial value; a flip flop 7393 for loading $a^0$ as an initial value; fixed multipliers 7394, 7395; and a selector 7392 with two inputs one output. The multiplication value of the fixed multiplier 7394 is $x a^{-2}$, and the multiplication value of the fixed multiplier 7395 is $xa$. Incidentally the operation of the basic unit 739 is the same as in FIG. 31, and its description is omitted.

In FIG. 34, $\alpha^{-k}$ is calculated independently for the upper byte and the lower byte. When the code is not shortened, the upper byte side outputs $\alpha$-1 and the lower byte side outputs $\alpha$-2 immediately after the first clock input. The upper byte side outputs $\alpha$-3 and the lower byte side outputs $\alpha$-4 immediately after the second clock input. Subsequent outputs are provided in the same manner as described above.

The lines of the basic units shown in FIGS. 31 to 34 are 8-bit parallel, respectively. The switching control of the selectors 7372 and so on is the same as the selector 5372 in FIG. 20.

However when the shortening method is middle aligned, it is necessary to switch the selectors 7372 and so on between the information area and the check bit area. Since the error search part 730 supports the 16-bit processing, the throughput thereof is at most the same as the throughput of the data the FEC decoder 700 receives. Thus there may occur a hook determination timing (the timing necessary for the upper byte to determine the last byte of an FEC frame and for the lower byte to determine the first byte of the next FEC frame) at the FEC frame boundary whose shape is equivalent to the hook. In order to solve this problem, a clock with a little bit faster clock cycle is used. For example, it may be operated by a clock with a cycle less than eight tenths of the original clock frequency (a clock with a frequency of more than ten eighths of the original frequency).

Also the division by $\sigma'(\alpha^k)$ is performed independently for the upper and lower byte sides, so that two inverse parameter tables 580 of FIG. 17 are provided for the upper and lower byte sides, respectively.

Referring to FIGS. 35 to 38, a description will be made of an embodiment as a fourth method of processing the data position for 3 bytes at one clock cycle. In this way, it is possible to compensate the hook event that may occur in the method of processing the data for 2 bytes at one clock cycle, thereby preventing the clock from having a higher frequency. In other words, the error search part 730 is provided with a throughput higher than the throughput of the data the FEC decoder 700 receives, and thereby the handling of the hook event is facilitated. However, note that only for the error search part 730, the upper byte, middle byte, and lower byte are defined as 3 bytes to be processed at one clock cycle. The positions corresponding to the FEC frame are arranged in the order of the upper byte, middle byte, and lower byte from the top of the FEC frame.

In FIG. 35, a basic unit 737 of the error position calculator 731 includes: a parameter load multiplier 7371 for loading $(\alpha^j)^m$ as an initial value; a flip flop 7373 for loading $\sigma m$ as an initial value; fixed multipliers 7374, 7375, 7376; and a selector 7372 with two inputs one output. The multiplication value of the fixed multiplier 7374 is $x\alpha^{3m}$, the multiplication value of the fixed multiplier 7375 is $x\alpha^{-m}$, and the multiplication value of the fixed multiplier 7376 is $x\alpha^{-2m}$. The flip flop 7373 loads the input value at the next clock, and outputs to one of the inputs of the parameter load multiplier 7371, one of the inputs of the selector 7372, and to the fixed multiplier 7374. The fixed multiplier 7374 outputs the fixed multiplication result to the flip flop 7373.

The parameter load multiplier 7371 performs multiplication based on the loaded parameter, and outputs to another input of the selector 7372. The selector 7372 selects one of the two inputs and outputs as the lower 8 bits of the basic unit 737. The output of the selector 7372 is also input to the fixed multiplier 7375. Then the fixed multiplier 7375 outputs the multiplication result as the middle 8 bits of the basic unit 737. The output of the selector 7372 is further input to the fixed multiplier 7376. Then the fixed multiplier 7376 outputs the multiplication result as the upper 8 bits of the basic unit 737.

The calculation of $\sigma(\alpha^k)$ is performed by providing 8 sets ($1 \leq m \leq 8$) of the basic unit 737 shown in FIG. 35, and by calculating the sum of the output for the 8 sets and $\sigma 0$. In other words, the calculation of the upper byte $\sigma(\alpha^k)$ is performed by calculating the sum of the upper 8 bits for the 8 sets (m1 to m8) and $\sigma 0$. Similarly the calculation of the middle byte $\sigma(\alpha^k)$ is performed by calculating the sum of the middle 8 bits for the 8 sets (m1 to m8) and $\sigma 0$. The calculation of the lower byte $\sigma(a^k)$ is performed by calculating the sum of the lower 8 bits for the 8 sets ($1 \leq m \leq 8$) and $\sigma 0$.

Further $\omega(\alpha^k)$, $\sigma'(\alpha^k)$ in the calculation of ek are calculated in the same way as described above.

In FIG. 36, a basic unit 738 of the error value calculator 732 includes: a parameter load multiplier 7381 for loading $(\alpha^j)^m$ as an initial value; a flip flop 7383 for loading $\omega m$ as an initial value; fixed multipliers 7384, 7385 7386; and a selector 7382 with two inputs one output. The multiplication value of the fixed multiplier 7384 is $xa^{3m}$, the multiplication value of the fixed multiplier 7385 is $xa^{-m}$, and the multiplication value of the fixed multiplier 7386 is $xa^{-2m}$. Incidentally the operation of the basic unit 738 is the same as in FIG. 35, and its description is omitted.

The calculation of $\omega(\alpha^k)$ is performed by providing 7 sets ($1 \leq m \leq 7$) of the basic unit 738 shown in FIG. 36, and by calculating the sum of the output for the 7 sets and $\omega 0$. Similarly to the case of $\sigma(\alpha^k)$, the upper byte, middle byte, and lower byte are calculated independently.

In FIG. 37, a basic unit 737B of the error position calculator 732 includes: a parameter load multiplier 7371B for loading $(a^j)^m$ as an initial value; a flip flop 7373B for loading $\sigma m+1$ as an initial value; fixed multipliers 7374B, 7375B, 7376B; and a selector 7372B with two inputs one output. The multiplication value of the fixed multiplier 7374B is $x\alpha^{3m}$, the multiplication value of the fixed multiplier 7375B is $x\alpha^{-m}$, and the multiplication value of the fixed multiplier 7376B is $x\alpha^{-2m}$. Incidentally the operation of the basic unit 738B is the same as in FIG. 35, and its description is omitted.

The calculation of $\sigma(\alpha^k)$ is performed by providing 3 sets ($1 \leq m \leq 3$) of the basic unit 737B shown in FIG. 37, and by calculating the sum of the output for the 3 sets and $\sigma 1$. Similarly to the case of $\sigma(\alpha^k)$, the upper byte, middle byte, and lower byte are calculated independently.

In the basic units shown in FIGS. 35 to 37, immediately after the first clock input, the upper byte side outputs the calculation result corresponding to the first byte of the FEC frame, the middle byte side outputs corresponding to the second byte, and the lower byte side outputs corresponding to the third byte, respectively. Then immediately after the second clock input, the upper byte side outputs the calculation result corresponding to the fourth byte of the FEC frame, the middle byte side outputs corresponding to the fifth byte, and the lower byte side outputs corresponding to the sixth byte, respectively. Subsequent outputs are provided in the same manner as described above.

In FIG. 38, a basic unit 739 of the error value calculator 732 includes: a parameter load multiplier 7391 for loading $\alpha^{-j}$ as an initial value; a flip flop 7393 for loading $\alpha^{0}$ as an initial value; fixed multipliers 7394, 7395, 7396; and a selector 7392 with two inputs one output. The multiplication value of the fixed multiplier 7394 is $x\alpha^{-3}$, the multiplication value of the fixed multiplier 7395 is $x\alpha^{-1}$, and the multiplication value of the fixed multiplier 7396 is $x\alpha^{-2}$. Incidentally the operation of the basic unit 739 is the same as in FIG. 35, and its description is omitted.

The calculation of $\alpha^{-k}$ is as shown in FIG. 38. The upper byte, middle byte, and lower byte are calculated independently.

When the code is not shortened, immediately after the first clock input, the upper byte side outputs $\alpha^{-1}$, the middle byte side outputs $\alpha^{-2}$, and the lower byte side outputs $\alpha^{-3}$, respectively. Then immediately after the second clock input, the upper byte side outputs $\alpha^{-4}$, the middle bytes side outputs $\alpha^{-5}$, and the lower byte side outputs $\alpha^{-6}$, respectively. Subsequent outputs are provided in the same manner as described above.

The division by $\sigma'(\alpha^{k})$ is also performed independently for the upper byte, middle byte, and lower byte. Thus 3 sets of the inverse parameter 580 shown in FIG. 17 are provided for the upper byte side, middle byte side, and lower byte side, respectively. Incidentally the lines of the basic units shown in FIGS. 35 to 38 are 8-bit parallel, respectively. Further the control of the selectors 7372 and so on is the same as in FIG. 20 and other figures. When the code shortening method is top aligned, the selectors 737-2 and so on are caused to select the multiplier side, immediately before the error search calculation of the FEC frame.

When the code shortening method is middle aligned, it is necessary to switch the selectors 7372 and so on between the information area and the check bet area. For example, there may be a case that the determination of the last byte position of the information area in an FEC frame and the determination of the first byte position of the check bit area in the FEC frame are both present at a certain determination timing of 3 bytes. This is a kind of hook in the FEC frame.

In this case, the selectors (7372 and so on) select the through sides (not through multipliers sides) until this timing, thereby to enable only the byte position at which the information area is output. At the next timing, the clock input to the flip flops FF (7373 and so on) is stopped to maintain the previous output of the flip flops FF (7373 and so on) as it is. In this state, the selectors (7372 and so on) are caused to select the multiplier sides (7371 and so on) to enable only the byte position corresponding to the check bit area. Further at the following timings, the clock input is enabled to perform calculation. In this way, even if the search determination positions of the information area and the check bit area have a hook shape, it is possible to determine only the information area at the hook timing, and only the check bit area corresponding to the remaining part of the hook at the next timing, and then the check bit area at the following timings. In other words, the hook timing calculation is performed at two separate timings.

Because the throughput of the error search 730 is higher than the throughput of the FEC frame, it is very unlikely that the calculation is not completed in time even if the period of time for one calculation timing is extended for two calculation timings as described above.

Tdelay-DEC will be described in more detail below. Here as examples of the method of converting from the 8-bit parallel to the 16-bit parallel in the error search part of the 16-bit parallel FEC decoder, the following methods have been described: the clock is doubled (first method), the number of processes is doubled (second method), the data positions for 2 bytes are processed at one clock cycle (third method), and the data positions for 3 bytes are processed at one clock cycle (fourth method).

Assuming that AA byte is the maximum size of the FEC frame the FEC decoder 700 can receive, and that BB clock cycle is the fixed or maximum delay time generated in the polynomial coefficient calculator 720. One clock cycle represents the time for receiving 2 bytes in the FEC frame. DD represents the delay caused by factors other than the FEC decode calculation, such as data transfer within the FEC decoder 700 and data transfer between the FEC decoder 700 and the outside thereof, which is several clock cycles (e.g., 5 cycles). Further FF represents the count increment in the hook event, which is 1. However FF is 0 when the first method or fourth method is used. The decoder is configured with Tdelay-DEC as a fixed value and the clock cycle of CC or more.

Here:

$$CC=AA\times1.5+BB+DD+FF$$

Further, when the third or fourth method is used in the error search part 730, the following is given:

$$CC=AA+BB+DD+FF$$

The data storage memory 740 outputs the data being delayed for a period of time of Tdelay-DEC. The data storage memory 740 has a capacity sufficient for buffering all the data that can be received within the period of time of Tdlay-DEC, and sequentially reads out the stored data after Tdelay-DEC has elapsed.

Further the correction is made by the error correction part 750 and the error search part 730 that output various types of information for error correction, in accordance with the timing of the error correction and output with the delay time of Tdelay-DEC.

When the fourth method is used with AA=255 and BB=15, Tdelay-DEC is defined as a fixed value at a minimum of 275 clock cycles or more. Assuming that Tdelay-DEC is a fixed value of 275 clock cycles and the received bit rate of the FEC frame is 1 Gbps, Tdelay-DEC is equivalent to a time for receiving 275×8 bits, or equal to 2.2 microseconds.

With this configuration, it is possible to achieve accurate error correction even when continuously receiving FEC frames with an arbitrary size smaller than AA byte that dynamically increases and decreases. Without such a configuration, the calculations in the syndrome calculator 710 and the error search part 730 are not completed in time as the size of the received FEC frame dynamically increases, thereby making it difficult to perform error correction for the FEC frame of size AA. The reason for this is that the calculations in the syndrome calculator 710 and the error search part 730 essentially need the number of clock cycles for the FEC frame size.

According to the above described embodiment, it is possible to provide an optical line terminal and an optical network terminal, which can process with the same error correction code even if the FEC frame size is different.

According to the present invention, it is possible to provide an optical line terminal and an optical network terminal, which can process with the same error correction code even if the FEC frame size is different.

What is claimed is:

1. An optical line terminal comprising:
a photoelectric converter;
a PON transceiver; and
a physical layer,
wherein said PON transceiver includes an error correction code decoder including:
a shortening compensation parameter table;
a syndrome calculator for calculating a syndrome by referring to said shortening compensation parameter table, and
an error search part for calculating an error position or an error value by referring to the shortening compensation parameter table, wherein:
said syndrome calculator includes a first parameter variable multiplier, and said first parameter variable multiplier varies multiplex coefficients by changing internal matrix parameters depending on the shortening compensation parameter table and said error search part includes a second parameter variable multiplier, and said second parameter variable multiplier varies multiplex coefficients by changing internal matrix parameters depending on the shortening compensation parameter table.

2. The optical line terminal according to claim 1, further comprising an inverse parameter table,
wherein said error search part calculates the error value by referring to said inverse parameter table.

3. The optical line terminal according to claim 1, further comprising a polynomial coefficient calculator for calculating an error position polynomial or an error evaluation polynomial.

4. The optical line terminal according to claim 2, further comprising a polynomial coefficient calculator for calculating an error position polynomial or an error evaluation polynomial.

5. An optical network terminal comprising:
a photoelectric converter;
a PON transceiver; and
a physical layer,
wherein said PON transceiver includes an error correction code decoder including:
a shortening compensation parameter table;
a syndrome calculator for calculating a syndrome by referring to said shortening compensation parameter table; and
an error search part for calculating an error position or an error value by referring to the shortening compensation parameter table, wherein:
said syndrome calculator includes a first parameter variable multiplier, and said first parameter variable multiplier varies multiplex coefficients by changing internal matrix parameters depending on the shortening compensation parameter table, and
said error search part includes a second parameter variable multiplier, and said second parameter variable multiplier varies multiplex coefficients by changing internal matrix parameters depending on the shortening compensation parameter table.

6. The optical network terminal according to claim 5, further comprising an inverse parameter table,
wherein said error search part calculates the error value by referring to said inverse parameter table.

7. The optical network terminal according to claim 5, further comprising a polynomial coefficient calculator for calculating an error position polynomial or an error evaluation polynomial.

8. The optical network terminal according to claim 6, further comprising a polynomial coefficient calculator for calculating an error position polynomial or an error evaluation polynomial.

9. The optical line terminal according to claim 1, wherein said syndrome calculator further includes a syndrome controller for generating hook compensation information, and performs 16-bit parallel syndrome calculation depending on the hook compensation information.

10. The optical network terminal according to claim 5, wherein said syndrome calculator further includes a syndrome controller for generating hook compensation information, and performs 16-bit parallel syndrome calculation depending on the hook compensation information.

* * * * *